(12) United States Patent
Kho et al.

(10) Patent No.: US 9,601,703 B2
(45) Date of Patent: Mar. 21, 2017

(54) ORGANIC LIGHT-EMITTING DEVICE

(71) Applicant: SAMSUNG DISPLAY CO., LTD., Yongin, Gyeonggi-Do (KR)

(72) Inventors: Sam-Il Kho, Yongin (KR); Hyoung-Kun Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 223 days.

(21) Appl. No.: 14/475,600

(22) Filed: Sep. 3, 2014

(65) Prior Publication Data

US 2015/0236266 A1  Aug. 20, 2015

(30) Foreign Application Priority Data

Feb. 14, 2014  (KR) .................. 10-2014-0017528

(51) Int. Cl.
| | | |
|---|---|---|
| *H01L 51/00* | (2006.01) | |
| *H01L 51/50* | (2006.01) | |
| *H01L 27/32* | (2006.01) | |

(52) U.S. Cl.
CPC ........ *H01L 51/0058* (2013.01); *H01L 51/006* (2013.01); *H01L 51/0052* (2013.01);
(Continued)

(58) Field of Classification Search
None
See application file for complete search history.

(56) References Cited

U.S. PATENT DOCUMENTS

2006/0141286 A1\*  6/2006  Tada ................ H01L 51/0067
                                                  428/690
2006/0175963 A1   8/2006  Kim et al.
(Continued)

FOREIGN PATENT DOCUMENTS

| KR | 10-2006-0090452 A | 8/2006 |
|---|---|---|
| KR | 10-2011-0088898 A | 8/2011 |

(Continued)

*Primary Examiner* — Gregory Clark
(74) *Attorney, Agent, or Firm* — Lee & Morse, P.C.

(57) ABSTRACT

An organic light-emitting device (OLED) includes a first electrode; a second electrode facing the first electrode; an emission layer (EML) between the first electrode and the second electrode; a hole transport region between the first electrode and the EML; an electron transport region between the EML and the second electrode; and an interlayer between the EML and the hole transport region, wherein the interlayer includes an amine-based compound represented by Formula 1 or 2:

(Continued)

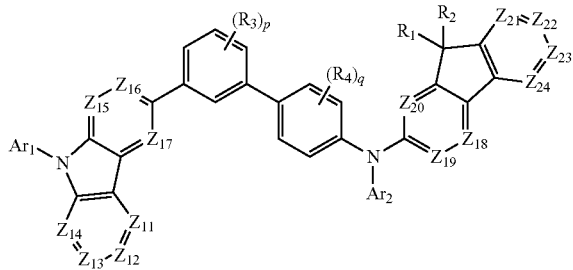

Formula 1

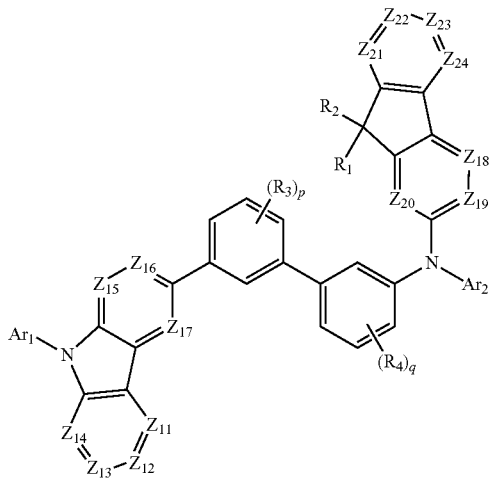

Formula 2 where $Ar_1$, $Ar_2$, $R_1$-$R_4$, $Z_{11}$-$Z_{21}$, p, and q are as defined in the specification.

18 Claims, 4 Drawing Sheets

(52) U.S. Cl.
CPC ...... *H01L 51/0072* (2013.01); *H01L 27/3211* (2013.01); *H01L 51/5096* (2013.01)

(56) References Cited

U.S. PATENT DOCUMENTS

| | | | |
|---|---|---|---|
| 2006/0186793 A1* | 8/2006 | Iou | H01L 51/5036 313/503 |
| 2007/0278938 A1 | 12/2007 | Yabunouchi et al. | |
| 2012/0043531 A1* | 2/2012 | Jung | H01L 51/006 257/40 |
| 2013/0153865 A1 | 6/2013 | Kho et al. | |

FOREIGN PATENT DOCUMENTS

| KR | 10-2013-0070201 A | 6/2013 |
|---|---|---|
| WO | WO 2007/125714 A1 | 11/2007 |

\* cited by examiner

ORGANIC LIGHT-EMITTING DEVICE

CROSS-REFERENCE TO RELATED APPLICATION

Korean Patent Application No. 10-2014-0017528, filed on Feb. 14, 2014, in the Korean Intellectual Property Office, and entitled: "Organic Light-Emitting Device," is incorporated by reference herein in its entirety.

BACKGROUND

1. Field

One or more embodiments relate to an organic light-emitting device.

2. Description of the Related Art

Organic light-emitting devices are self-emitting devices that have advantages such as a wide viewing angle, excellent contrast, quick response, high luminance, and excellent driving voltage, and that may provide multicolored images.

The organic light-emitting device may have a structure including a first electrode disposed on a substrate, and a hole transport region, an emission layer, an electron transport region, and a second electrode that are sequentially disposed on the first electrode. Holes injected from the first electrode pass through the hole transport region and moves to the emission layer, and electrons injected from the second electrode pass through the electron transport region and moves to the emission layer. Carriers, such as the holes or electrons, recombine in the emission layer to generate excitons. When the excitons drop from an excited state to a ground state, light is emitted.

SUMMARY

Embodiments are directed to an organic light-emitting device (OLED) that includes a first electrode; a second electrode facing the first electrode; an emission layer (EML) between the first electrode and the second electrode; a hole transport region between the first electrode and the EML; an electron transport region between the EML and the second electrode; and an interlayer between the EML and the hole transport region, wherein the interlayer includes an amine-based compound represented by Formula 1 or 2:

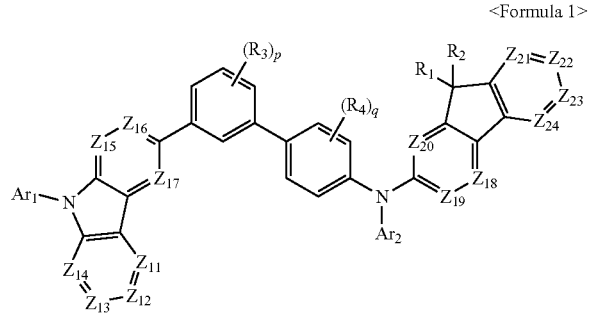

<Formula 1>

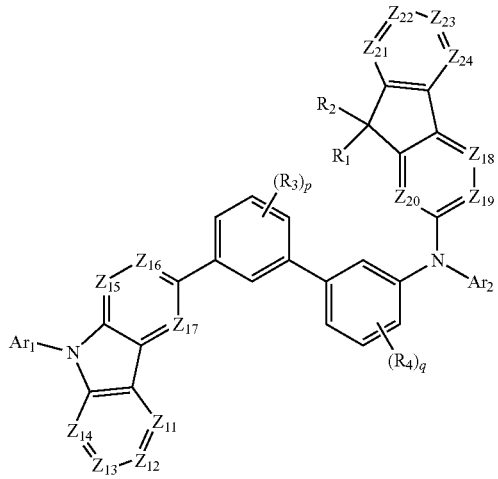

<Formula 2> wherein, in Formulae 1 and 2, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ and $Ar_2$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_1$ and $R_2$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_3$, $R_4$, and $R_{11}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic heterocondensed polycyclic group, —N($Q_1$)($Q_1$), —Si($Q_3$)($Q_4$)($Q_5$), and —B($Q_6$)($Q_7$);

p and q are each independently an integer of 1 to 4;

at least one substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and substituted monovalent non-aromatic heterocondensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

$Q_1$ to $Q_7$, $Q_{11}$ to $Q_{17}$, $Q_{21}$ to $Q_{27}$, and $Q_{31}$ to $Q_{37}$ are each independently selected from, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group.

Embodiments are also directed to an OLED that includes a substrate including a first sub-pixel, a second sub-pixel, and a third sub-pixel; a plurality of first electrodes arranged according to the first sub-pixel, the second sub-pixel, and the third sub-pixel of the substrate; a second electrode facing the first electrodes; an EML including a first EML that is disposed between the first electrode of the first sub-pixel and the second electrode and emits blue light, a second EML that is disposed between the first electrode of the second sub-pixel and the second electrode and emits green light, and a third EML that is disposed between the first electrode of the third sub-pixel and the second electrode and emits red light; a hole transport region disposed between the first electrode and the EML; and an electron transport region disposed between the EML and the second electrode, wherein the OLED includes at least one of i) a first interlayer that is disposed on the first sub-pixel between the first EML and the hole transport region and includes an amine-based compound represented by Formula 1 or 2 and ii) a third interlayer that is disposed on the third sub-pixel between the third EML and the hole transport region and includes the amine-based compound represented by Formula 1 or 2.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
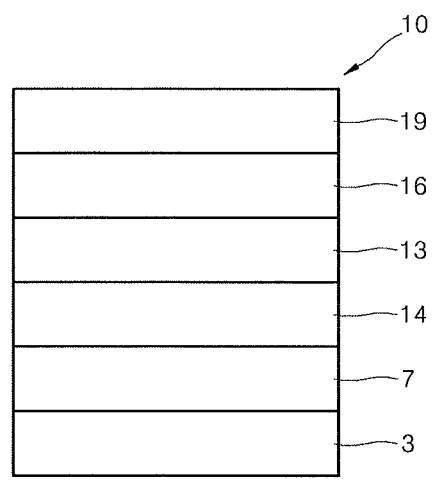
FIG. 1 illustrates a schematic view of an organic light-emitting device (OLED) according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. Expressions such as "at least one of," when preceding a list of elements, modify the entire list of elements and do not modify the individual elements of the list.

FIG. 1 illustrates a schematic view of an organic light-emitting device (OLED) 10 according to an embodiment.

A substrate may be additionally disposed on a lower part of a first electrode 3 or an upper part of a second electrode 19 of the OLED 10 shown in FIG. 1. The substrate may be a glass substrate or a transparent plastic substrate having excellent mechanical strength, thermal stability, transparency, surface smoothness, ease of handling, and waterproofness.

The first electrode 3 may be formed by applying a first electrode material on the substrate by deposition or sputtering. When the first electrode 3 is an anode, the first electrode material may be selected from materials having a high work function so that holes may be easily injected. The first electrode 3 may be a reflective electrode, a semi-transparent electrode, or a transparent electrode. Examples of the first electrode material may include indium-tin oxide (ITO), indium-zinc-oxide (IZO), tin oxide ($SnO_2$), and zinc oxide (ZnO). Also, at least one of magnesium (Mg), aluminum (Al), aluminum-lithium (Al—Li), calcium (Ca), magnesium-indium (Mg—In), and magnesium-silver (Mg—Ag) may be selected as the first electrode material to form the first electrode 3 as a semi-transparent electrode or a reflective electrode.

The first electrode 3 may have a single-layered structure or a multi-layered structure including at least two layers. For example, the first electrode 3 may have a three-layered structure, e.g., ITO/Ag/ITO.

A hole transport region 7, an interlayer 14, an emission layer (EML) 13, and an electron transport region 16 may be sequentially stacked on the first electrode 3.

The hole transport region 7 may include at least one of a hole injection layer (HIL), a hole transport layer (HTL), a buffer layer, and an electron blocking layer (EBL), and the electron transport region 16 may include at least one of a hole blocking layer (HBL), an electron transport layer (ETL), and an electron injection layer (EIL) as examples.

The hole transport region 7 may have a structure of a single layer formed of one material, a single layer formed of multiple different materials, or multiple layers formed of multiple different materials.

For example, the hole transport region 7 may have a structure of a single layer formed of multiple different materials or a structure of HIL/HTL, HIL/HTL/buffer layer, HIL/buffer layer, HTL/buffer layer, or HIL/HTL/EBL sequentially stacked on the first electrode 3.

When the hole transport region 7 includes the HIL, the HIL may be formed on the first electrode 3 by using various methods such as vacuum deposition, spin coating, casting, Langmuir-Blodgett (LB) deposition, inkjet printing, laser printing, or laser induced thermal imaging (LITI).

When the HIL is formed by vacuum deposition, the deposition conditions may be selected from ranges of, for example, a deposition temperature of about 100 to about 500° C., a degree of vacuum of about $10^{-8}$ to about $10^{-3}$ torr, and a deposition speed of about 0.01 to about 100 Å/sec in consideration of a desired compound for the HIL and a desired structure of the HIL.

When the HIL is formed by spin coating, the deposition conditions may be selected from ranges of, for example, a coating speed of about 2,000 rpm to about 5,000 rpm and a heat treatment temperature of about 80° C. to about 200° C. in consideration of a desired compound for the HIL and a desired structure of the HIL.

When the hole transport region 7 includes the HTL, the HTL may be formed on the first electrode 3 or on the HIL by using various methods such as vacuum deposition, spin coating, casting, LB deposition, inkjet printing, laser printing, or LITI. When the HTL is formed by vacuum deposition and spin coating, the deposition conditions and the coating conditions of the HTL may be referred to the de deposition conditions and the coating conditions of the HIL.

The hole transport region 7 may include at least one of m-MTDATA, TDATA, 2-TNATA, NPB, 13-NPB, TPD, Spiro-TPD, Spiro-NPB, α-NPB, TAPC, HMTPD, 4,4',4"-tris(N-carbazolyl)triphenylamine) (TCTA), polyaniline/Dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), polyaniline)/poly(4-styrenesulfonate) (PANI/PSS), a compound represented by Formula 201, and a compound represented by Formula 202:

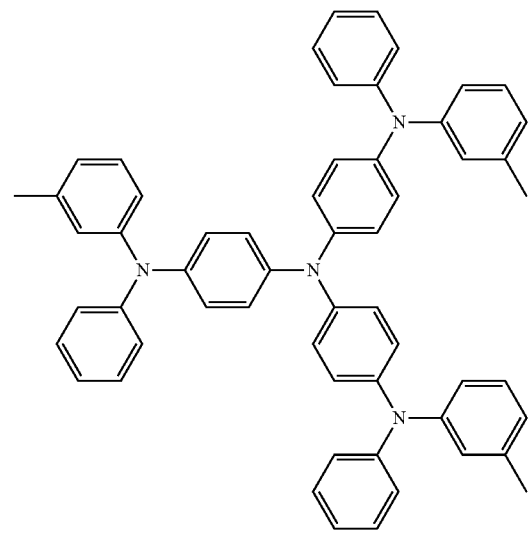

m-MTDATA

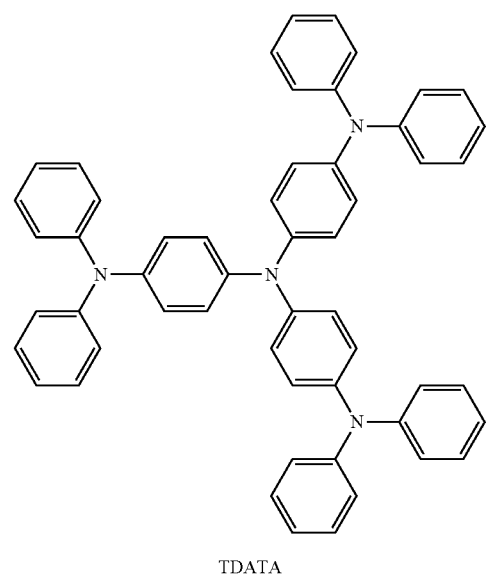

TDATA

-continued
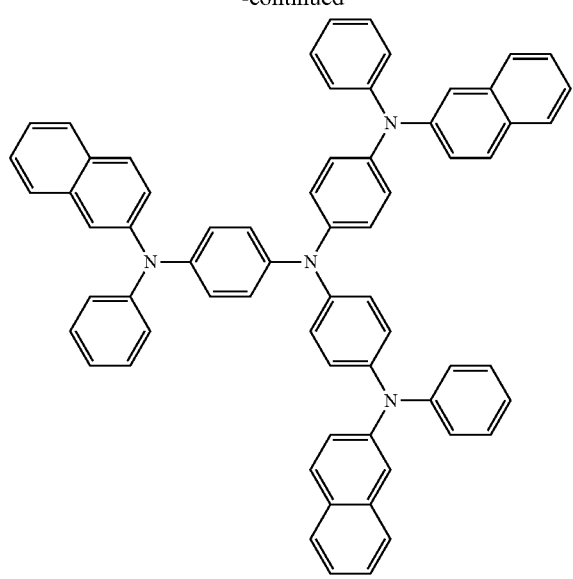
2-TNATA
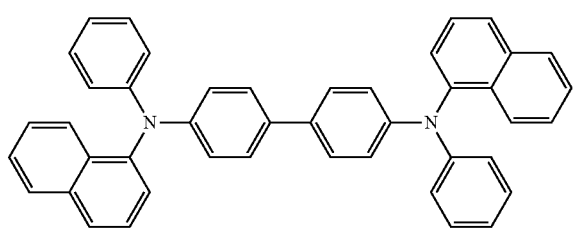
NPB
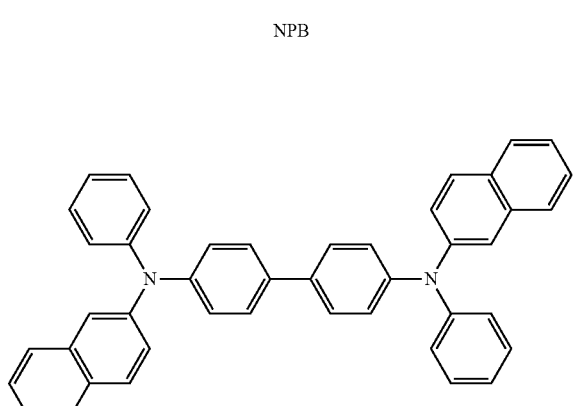
β-NPB
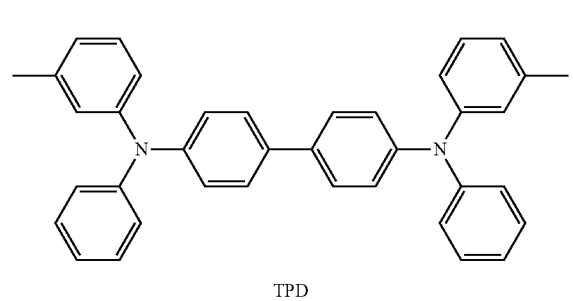
TPD
-continued
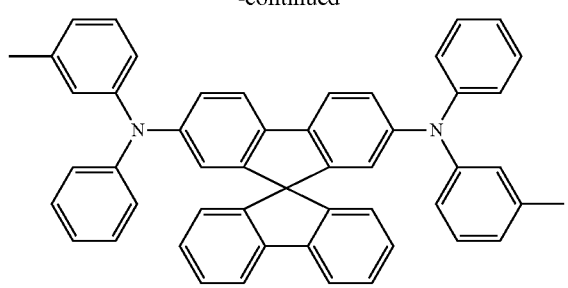
Spiro-TPD
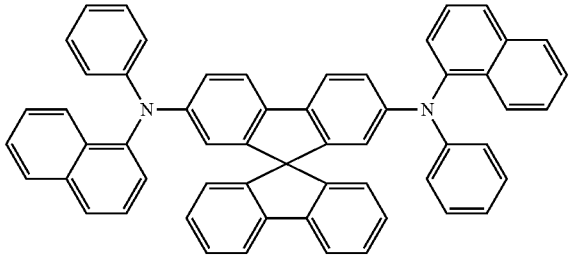
Spiro-NPB
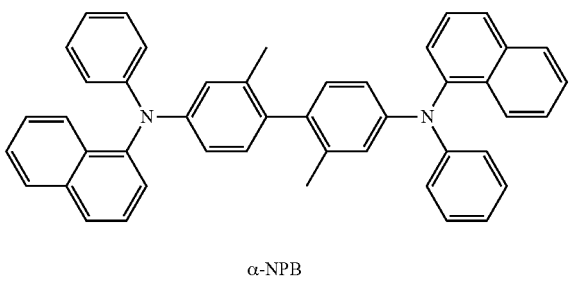
α-NPB
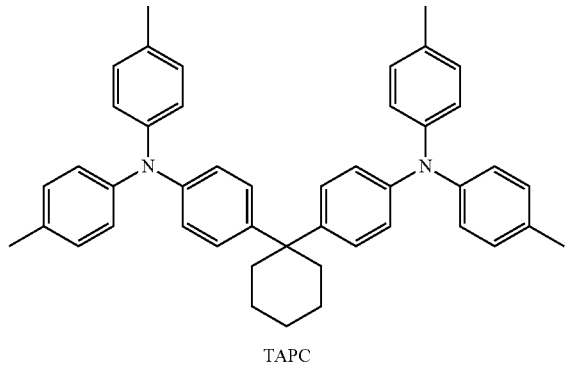
TAPC
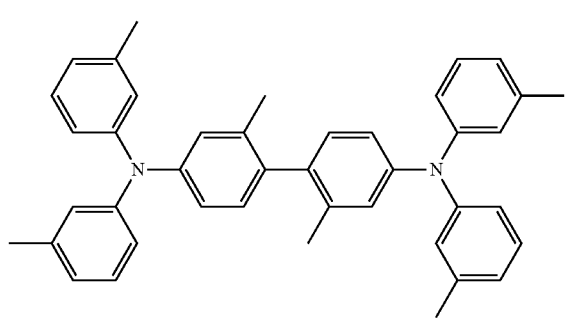
HMTPD -continued <Formula 201>

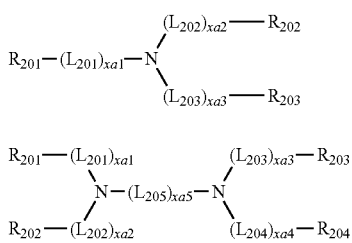

<Formula 202>

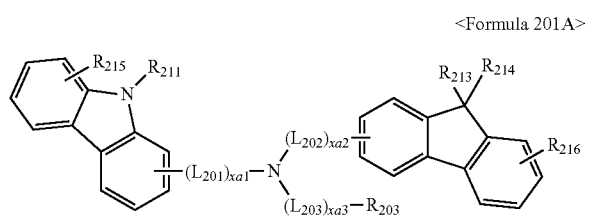

In Formulae 201 and 202, $L_{201}$ to $L_{205}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, and a substituted or unsubstituted divalent non-aromatic heterocondensed polycyclic group;

xa1 to xa4 each denotes an integer of 0, 1, 2, or 3;

xa5 denotes an integer of 1, 2, 3, 4, or 5; and $R_{201}$ to $R_{205}$ may be defined in the same manner as $R_3$.

The compound represented by Formula 201 may be represented by Formula 201A below:

<Formula 201A>

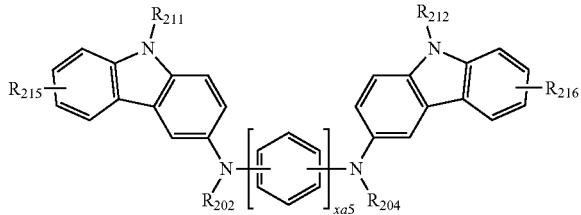

For example, the compound represented by Formula 201 may be represented by Formula 201A-1:

<Formula 201A-1>

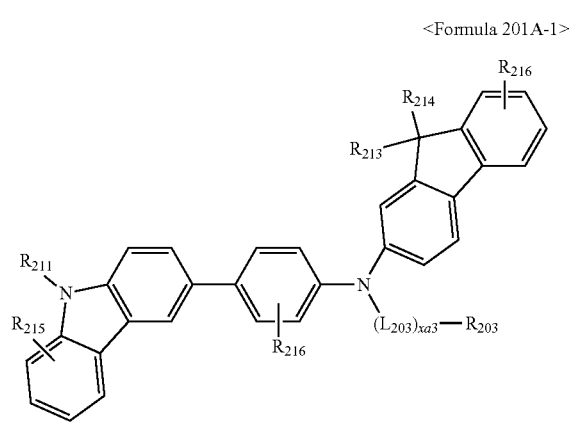

For example, the compound represented by Formula 202 may be represented by Formula 202A:

<Formula 202A>

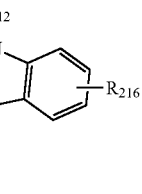

In Formulae 201A, 201A-1, and 202A, $L_{201}$ to $L_{203}$, xa1 to xa3, xa5, and $R_{202}$ to $R_{204}$ may be as defined above, $R_{211}$ may be defined in the same manner as $R_{203}$, $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group.

For example, in Formula 201A, 201A-1, and 202A, $L_{201}$ to $L_{203}$ are each independently selected from, a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 is each independently 0 or 1;

$R_{203}$, $R_{204}$, $R_{205}$, $R_{211}$, and $R_{212}$ are each independently selected from, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ are each independently selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa5 is 1 or 2.

In Formulae 201A and 201A-1, $R_{213}$ and $R_{214}$ may link to each other and form a saturated or unsaturated ring.

The compound represented by Formula 201 and the compound represented by Formula 202 may include Compounds HT1 to HT20 below, as examples:

HT1
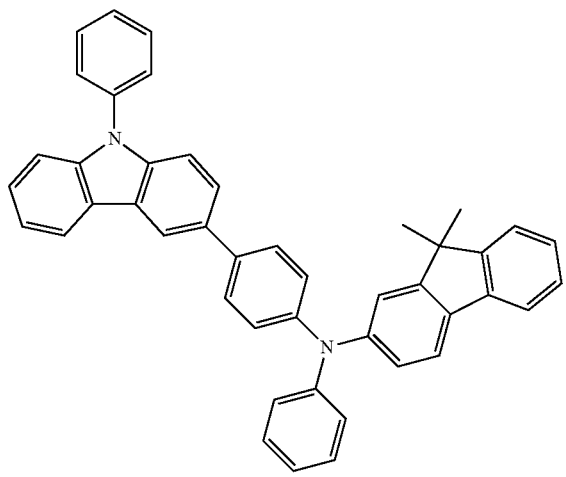
HT2
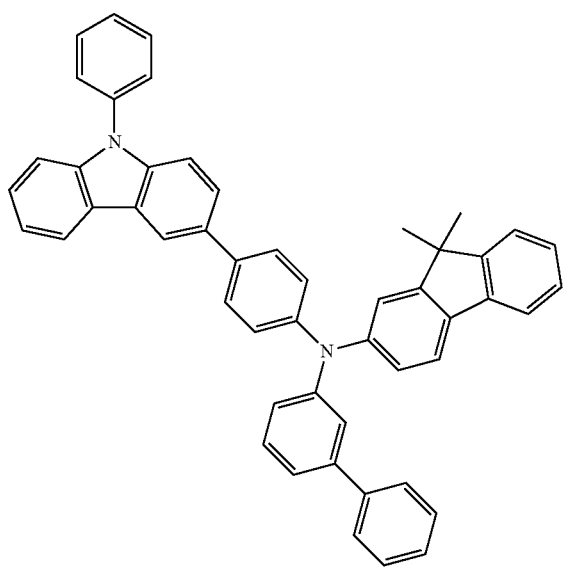
HT3
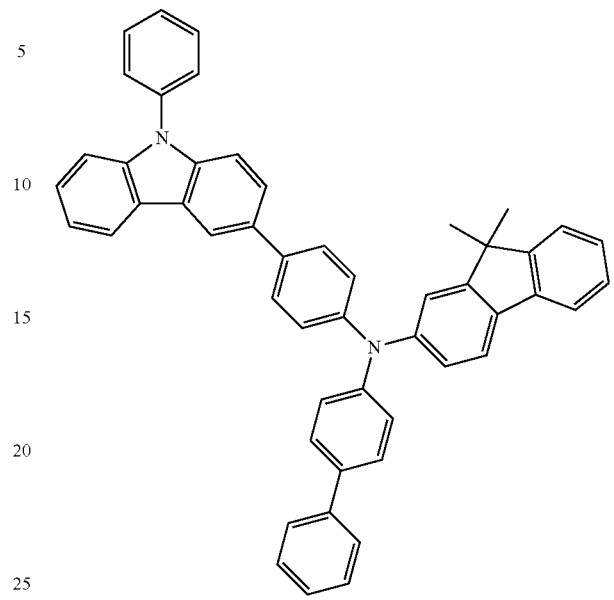
HT4
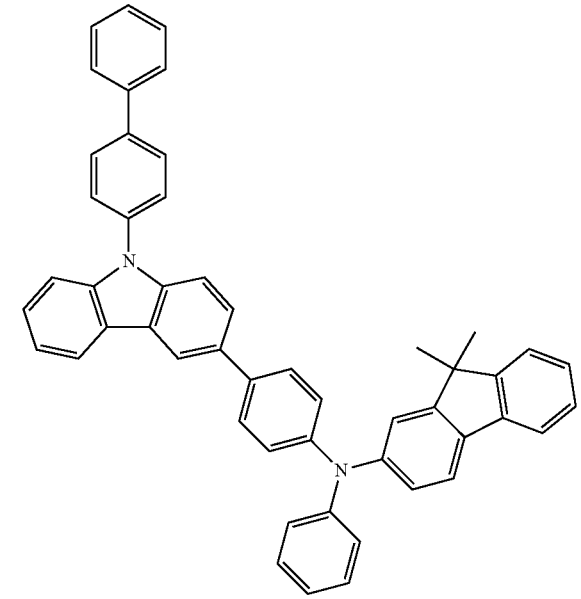

HT5
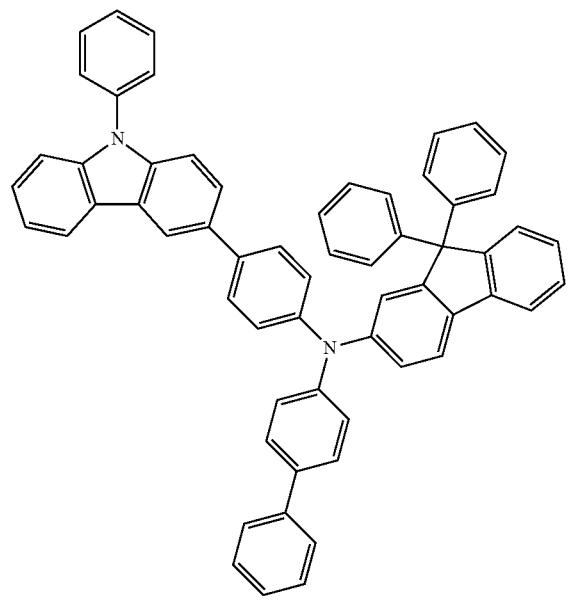
HT7
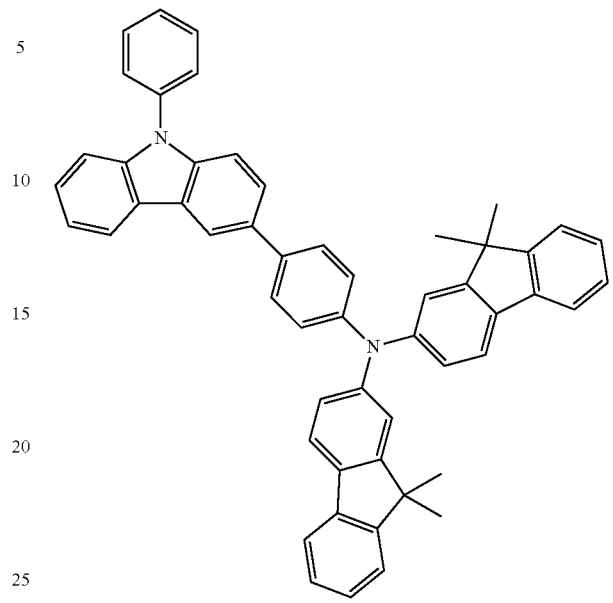
HT6
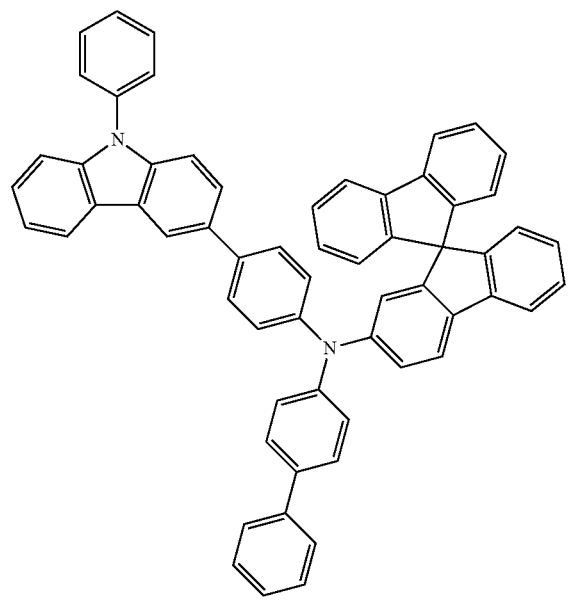
HT8
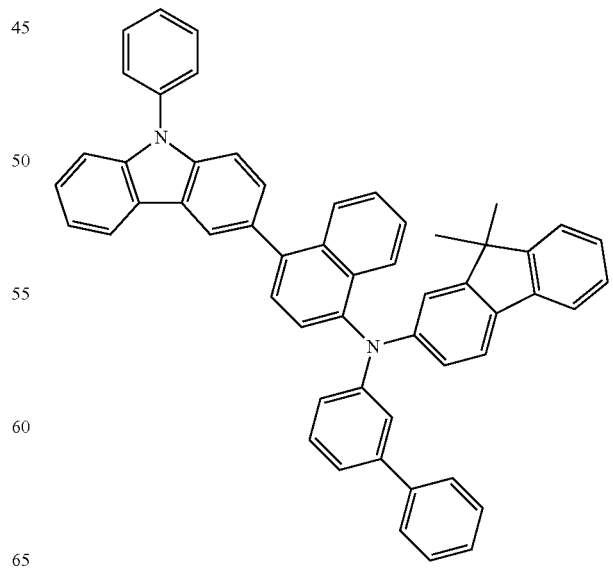

HT9
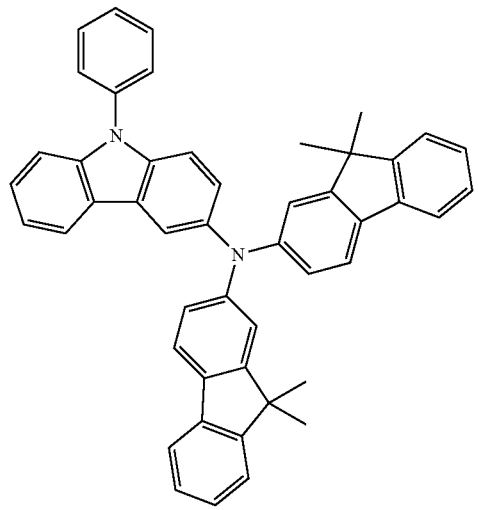
HT10
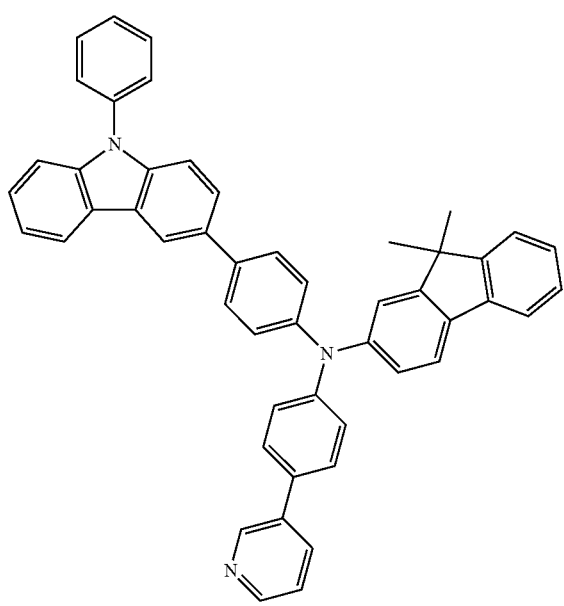
HT11
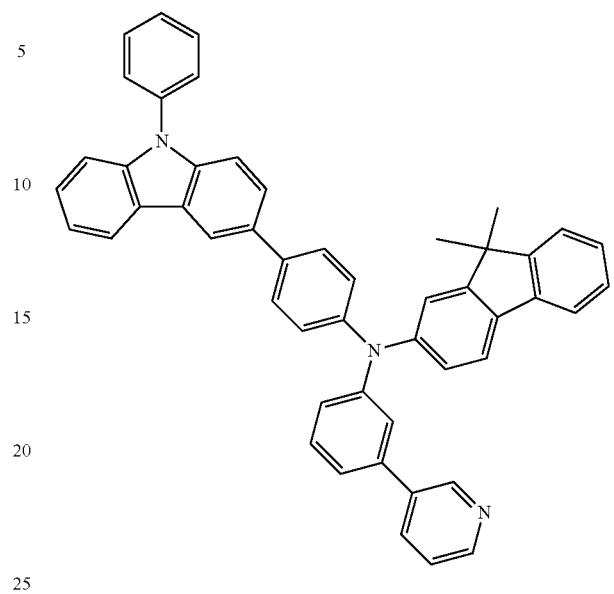
HT12
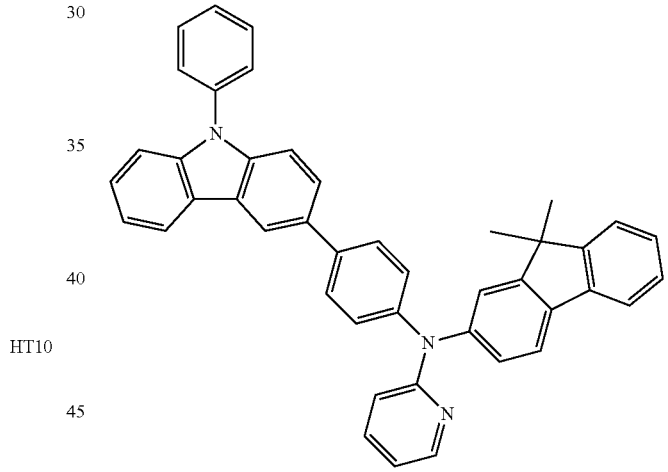
HT13
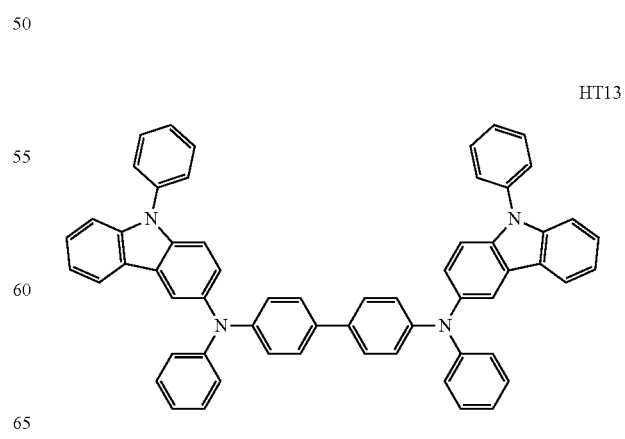

-continued

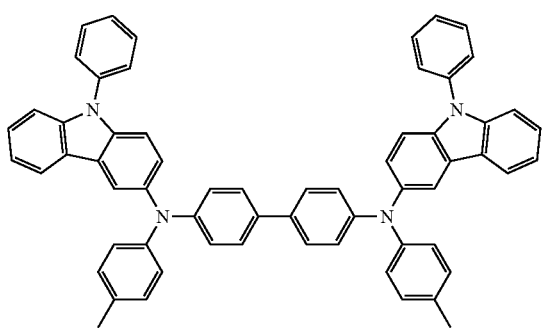
HT14

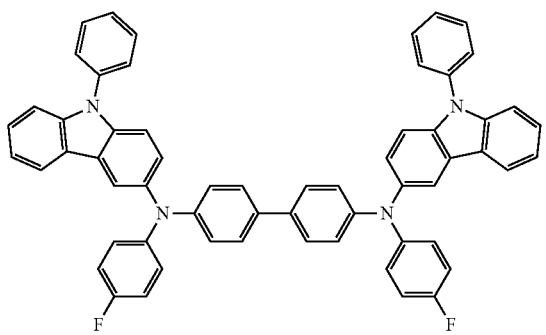
HT15

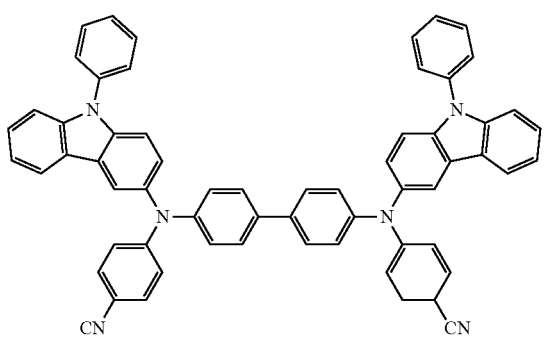
HT16

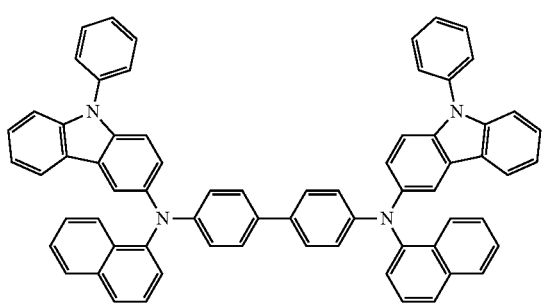
HT17

-continued

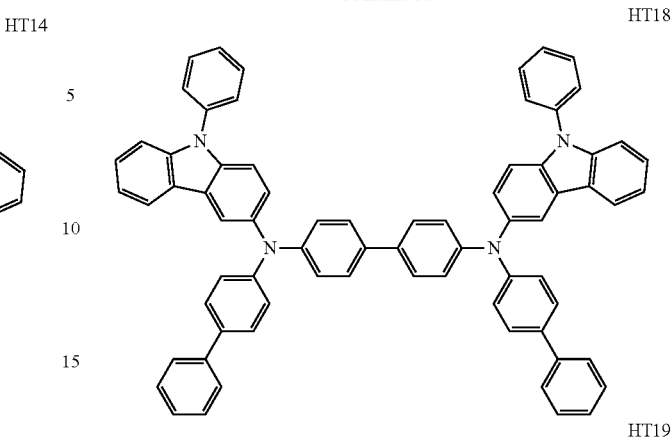
HT18

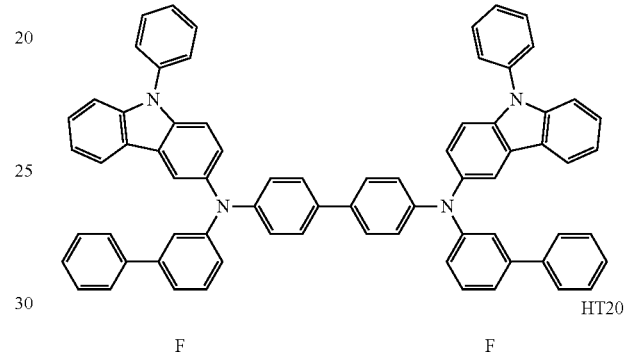
HT19

HT20

A thickness of the hole transport region 7 may be in a range of about 100 Å to about 10,000 Å, for example, about 100 Å to about 1,000 Å. When the hole transport region 7 includes both the HIL and the HTL, a thickness of the HIL may be in a range of about 100 Å to about 10,000 Å, for example, about 100 Å to about 1,000 Å, and a thickness of the HTL may be in a range of about 50 Å to about 2,000 Å, for example, about 100 Å to about 1,500 Å. When thicknesses of the hole transport region 7, the HIL, and the HTL are within these ranges, hole transporting properties may be satisfactory without substantial increase in driving voltage.

The hole transport region 7 may further include a charge-generating material in addition to the materials above to improve conductivity. The charge-generating material may be homogenously or unhomogenously dispersed in the hole transport region 7.

The charge-generating material may be, for example, a p-dopant. The p-dopant may be one of a quinone derivative, a metal oxide, and a cyano group-containing compound, as examples. Examples of the p-dopant may include a quinone derivative, such as a tetracyanoquinonedimethane (TCNQ) and 2,3,5,6-tetrafluoro-tetracyano-1,4-benzoquinondimethane (F4-TCNQ); a metal oxide, such as a tungsten oxide or a molybden oxide; and Compound HT-D1 below:

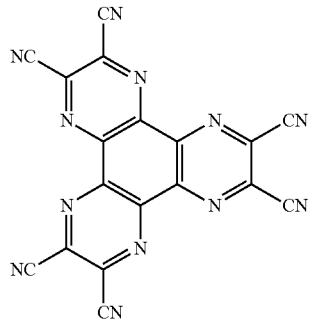
<Compound HT-D1>

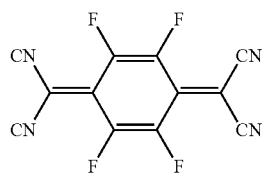
<F4-TCNQ>

The hole transport region 7 may further include at least one of a buffer layer or an EBL in addition to the HIL and the HTL. The buffer layer may increase light-emitting efficiency by compensating an optical resonance distance according the wavelength of light emitted from the EML 13. The buffer layer may include a material that may be included in the hole transport region 7. The EBL may block injection of electrons from the electron transport region 7.

An amine-based compound represented by Formula 1 or 2, which will be described below, is not included in the hole transport region 7. That is, examples of the compound represented by Formula 201 do not include the amine-based compound represented by Formula 1 or 2.

The interlayer 14 is formed on the hole transport region 7.

The interlayer 14 may include an amine-based compound represented by Formula 1 or 2:

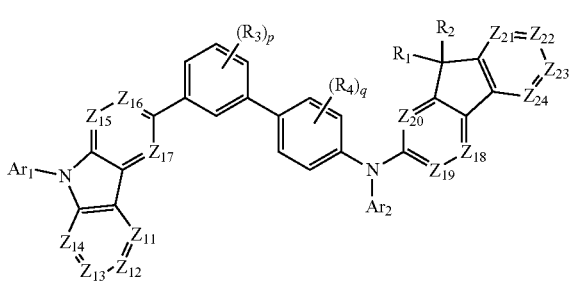
<Formula 1>

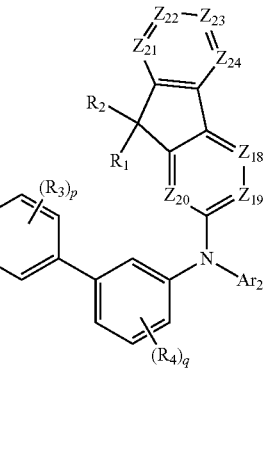
<Formula 2>

In Formulae 1 and 2, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$.

For example, in Formulae 1 and 2, $Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be $C(R_{17})$, $Z_{18}$ may be $C(R_{18})$, $Z_{19}$ may be $C(R_{19})$, $Z_{20}$ may be $C(R_{20})$, $Z_{21}$ may be $C(R_{21})$, $Z_{22}$ may be $C(R_{22})$, $Z_{23}$ may be $C(R_{23})$, and $Z_{24}$ may be $C(R_{24})$.

In Formulae 1 and 2, $Ar_1$ and $Ar_2$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group.

In Formulae 1 and 2, $Ar_1$ and $Ar_2$ may be each independently selected from,
a phenyl group, a pentalenyl group, an indenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, a $C_2$-$C_{20}$ heteroaryl group, a monovalent non-aromatic condensed polycyclic group, and a monovalent non-aromatic heterocondensed polycyclic group.

In some embodiments, in Formulae 1 and 2, $Ar_1$ and $Ar_2$ may be each independently selected from, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

In some embodiments, in Formulae 1 and 2, $Ar_1$ and $Ar_2$ may be each independently one of groups represented by Formulae 3-1 to 3-20, as examples:

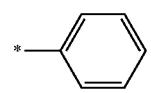

Formula 3-1

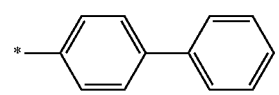

Formula 3-2

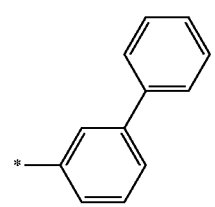

Formula 3-3

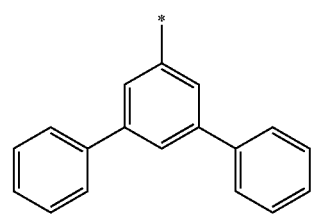

Formula 3-4

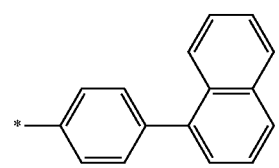

Formula 3-5

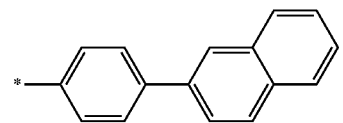

Formula 3-6

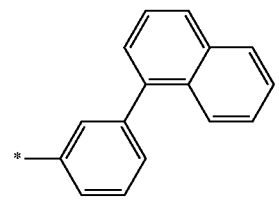

Formula 3-7

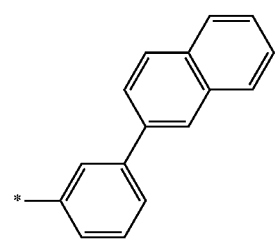

Formula 3-8

-continued

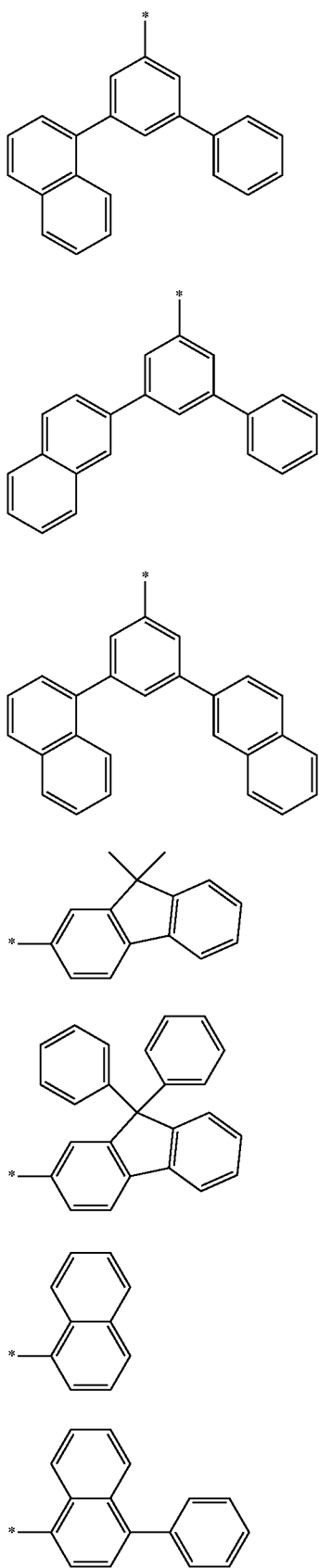

Formula 3-9

Formula 3-10

Formula 3-11

Formula 3-12

Formula 3-13

Formula 3-14

Formula 3-15

-continued

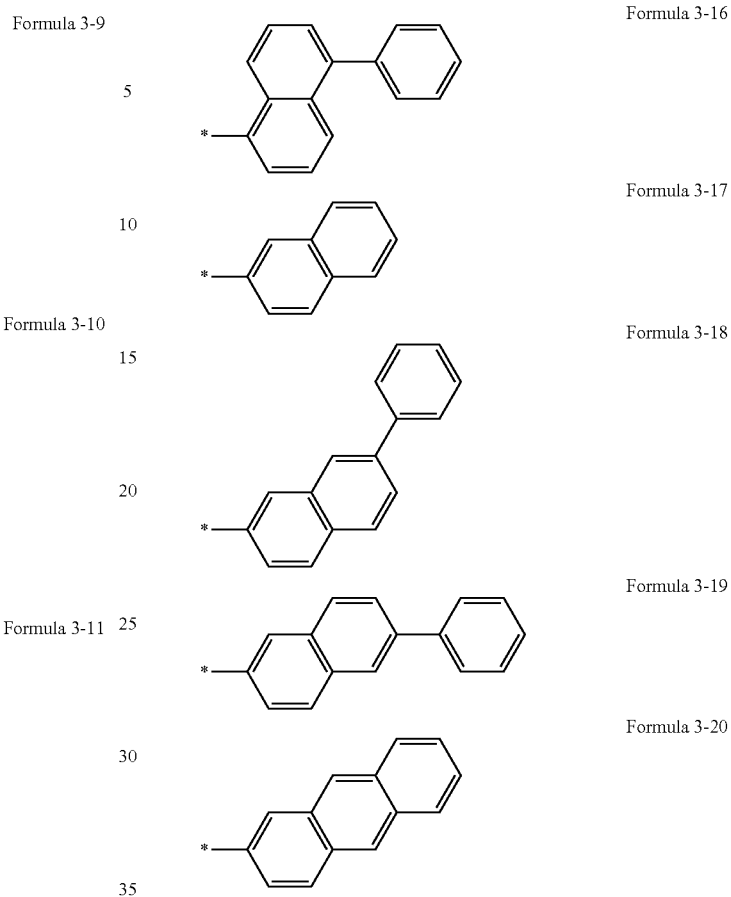

Formula 3-16

Formula 3-17

Formula 3-18

Formula 3-19

Formula 3-20

In Formulae 3-1 to 3-20, * denotes a binding site with N in Formula 1.

In Formulae 1 and 2, $R_1$ and $R_2$ may be each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group.

In Formulae 1 and 2, $R_1$ and $R_2$ may be each independently selected from, a $C_1$-$C_{20}$ alkyl group;

a $C_1$-$C_{20}$ alkyl group substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

For example, in Formulae 1 and 2, $R_1$ and $R_2$ may be each independently selected from a methyl group, an ethyl group, a propyl group, a butyl group, a pentyl group, a hexyl group, a heptyl group, and groups represented by Formulae 3-1 to 3-20.

In Formulae 1 and 2, $R_3$, $R_4$, and $R_{11}$ to $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic heterocondensed polycyclic group, —N($Q_1$)($Q_1$), —Si($Q_3$)($Q_4$)($Q_5$), and —B($Q_6$)($Q_7$).

For example, in Formulae 1 and 2, $R_3$, $R_4$, and $R_{11}$ to $R_{24}$ may be each independently selected from, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, and a $C_1$-$C_{20}$ alkyl group;

a $C_1$-$C_{20}$ alkyl group substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a Spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

In some embodiments, in Formulae 1 and 2, $R_3$, $R_4$, and $R_{11}$ to $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, and a $C_1$-$C_{20}$ alkyl group.

In some embodiments, in Formulae 1 and 2, $R_3$, $R_4$, and $R_{11}$ to $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, and the groups represented by Formulae 3-1 to 3-20.

In Formulae 1 and 2, p and q may be each independently an integer of 1 to 4. For example, in Formulae 1 and 2, p and q may be each independently an integer of 1 or 2.

The amine-based compound represented by Formula 1 or 2 may be represented by Formula 1A or 2A:

<Formula 1A>

<Formula 2A>

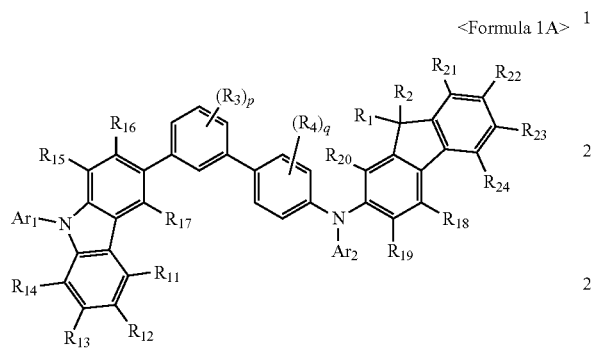

In Formulae 1A and 2A, descriptions of the substituents are referred to the descriptions in the present specification.

For example, the amine-based compound represented by Formula 1 or 2 may be represented by Formula 1A or 2A, and in Formulae 1A and 2A, $Ar_1$ and $Ar_2$ are each independently a group represented by Formulae 3-1 to 3-20;

$R_1$ and $R_2$ are each independently a $C_1$-$C_{20}$ alkyl group or one of the groups represented by Formulae 3-1 to 3-20;

$R_3$, $R_4$, and $R_{11}$ to $R_{24}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or one of the groups represented by Formulae 3-1 to 3-20;

p and q may be each independently an integer of 1 to 4.

In Formulae 1 and 2, $R_3$, $R_4$, and $R_{11}$ to $R_{24}$ may be a hydrogen.

The amine-based compound represented by Formula 1 or 2 may be one of Compounds 1 to 96, as examples:

1

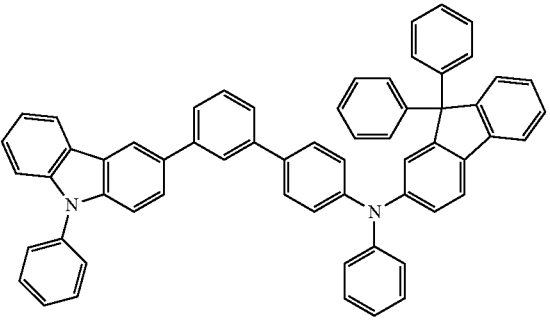

2

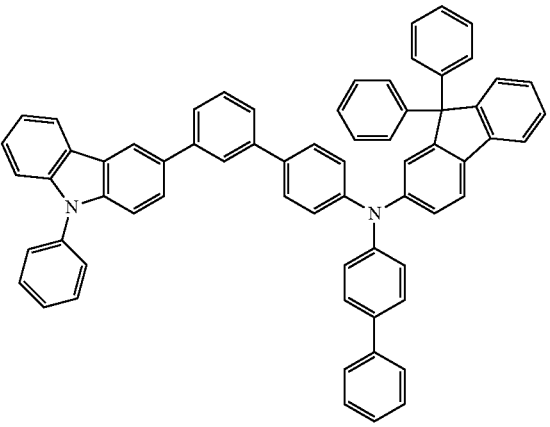

3

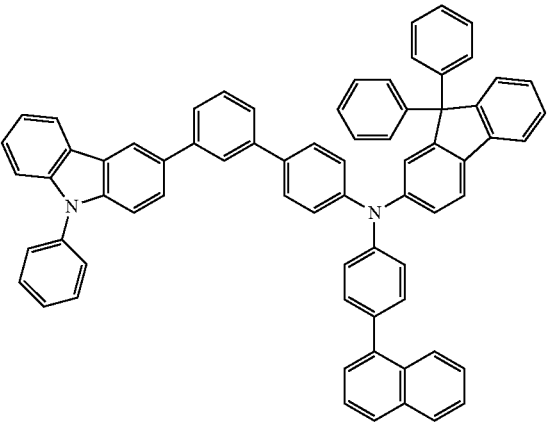

4
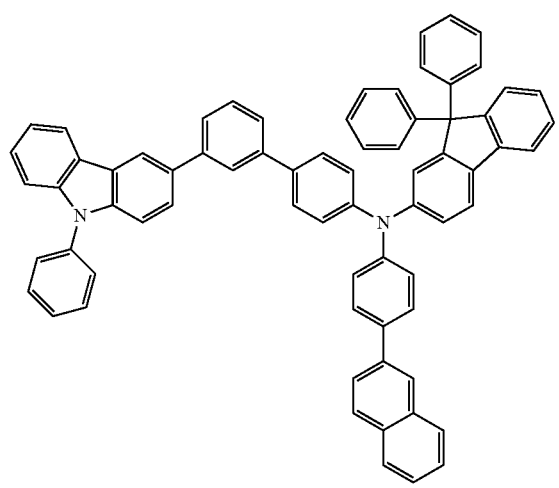
5
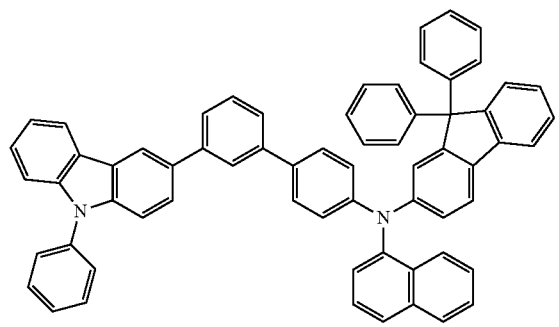
6
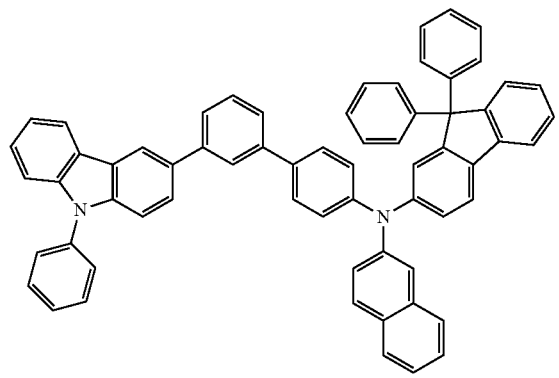
7
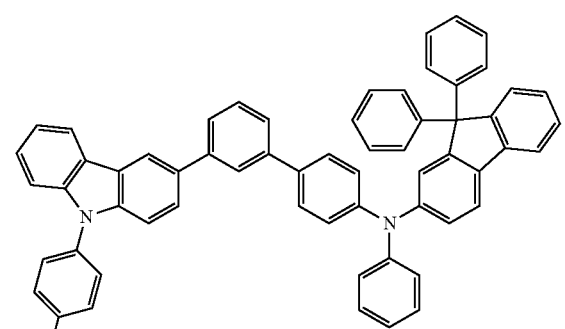
8
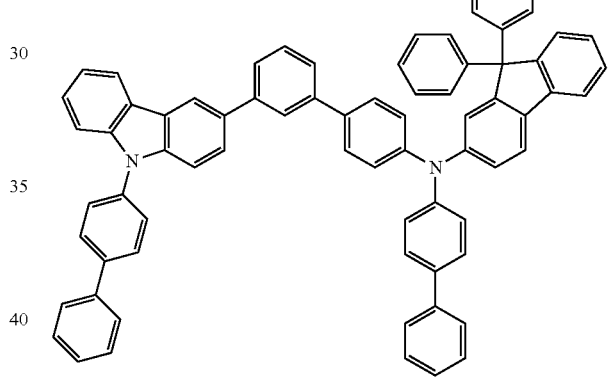
9
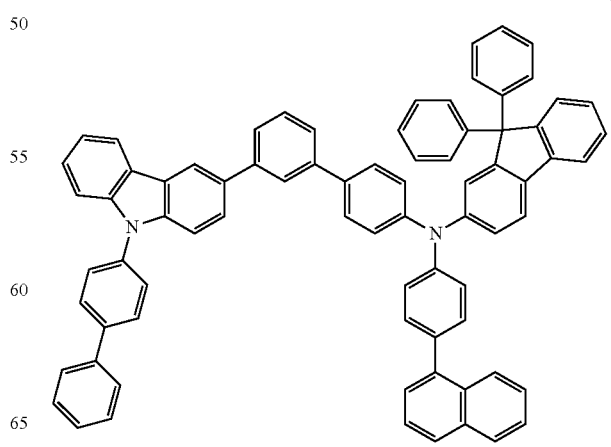

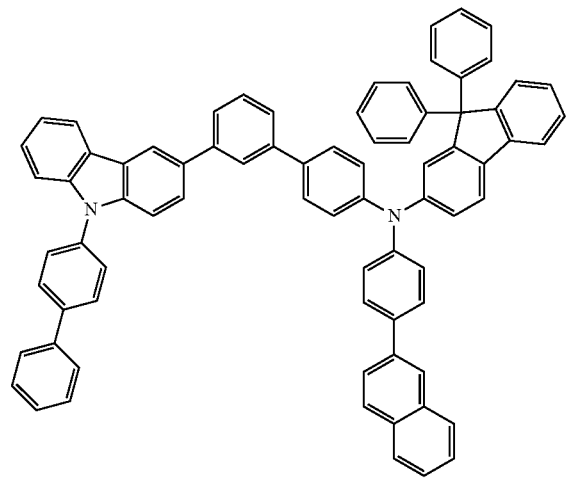
10
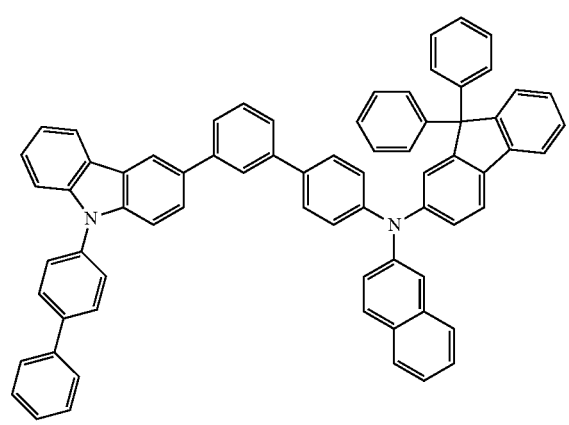
11
12
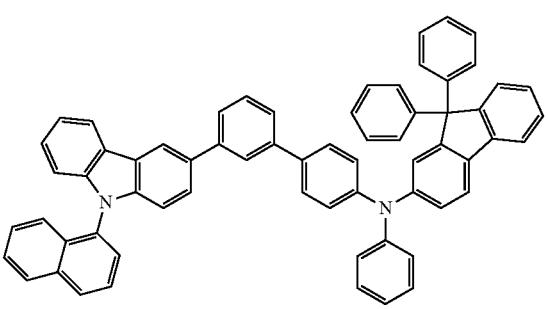
13
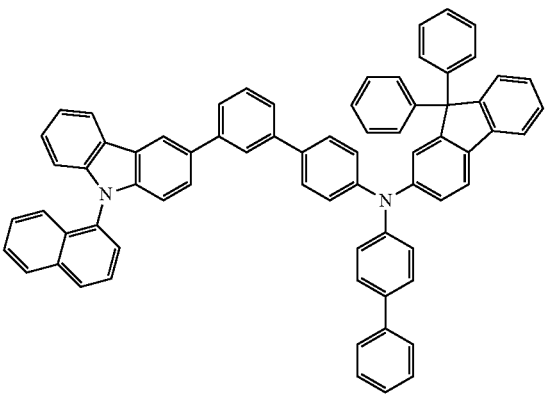
14
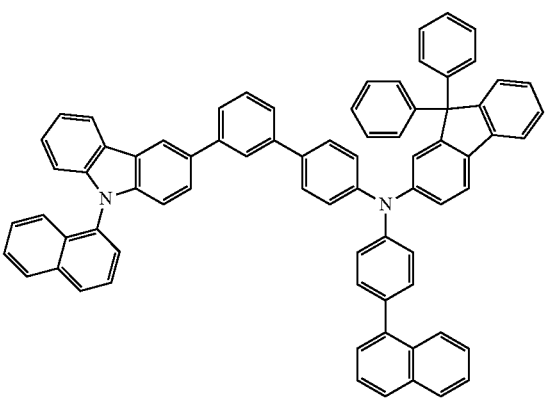
15
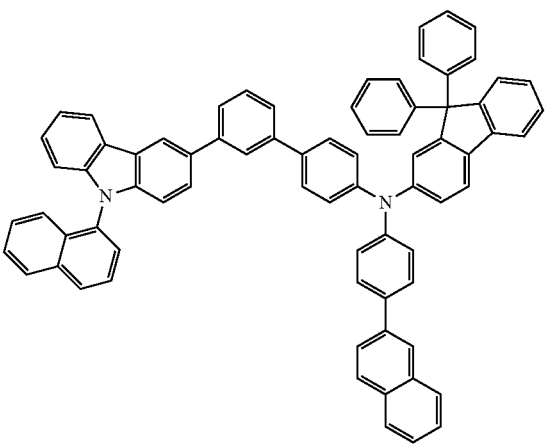
16

17
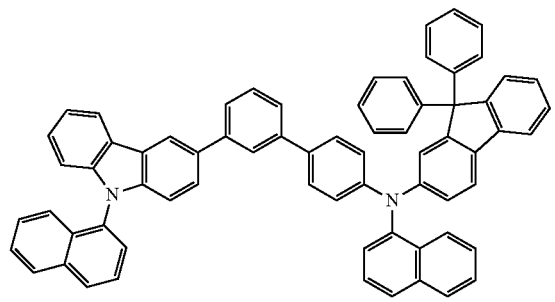
18
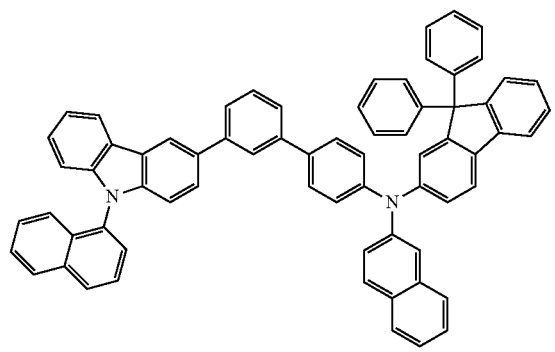
19
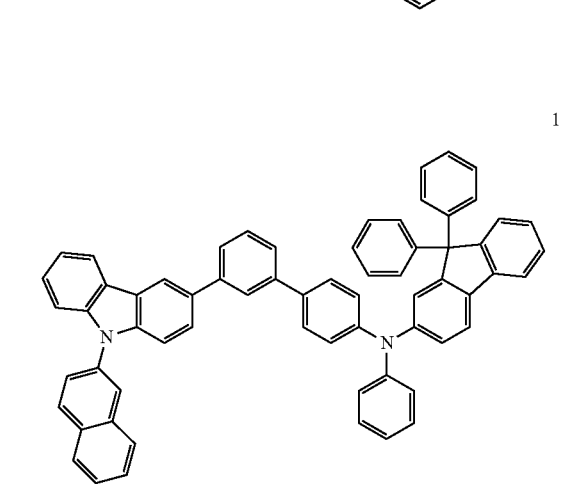
20
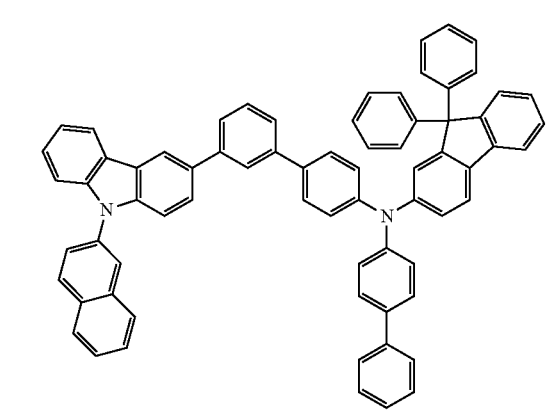
21
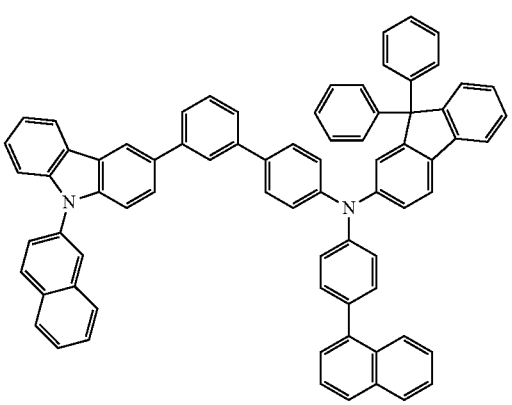
22
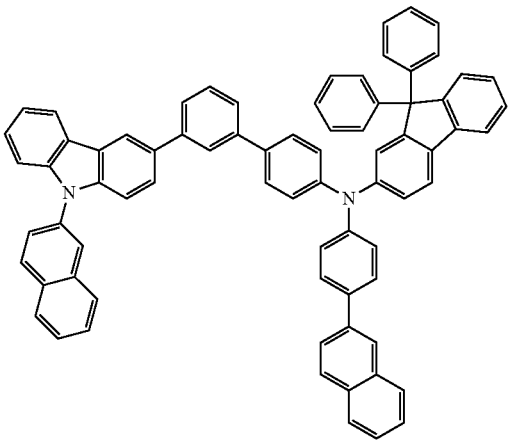
23
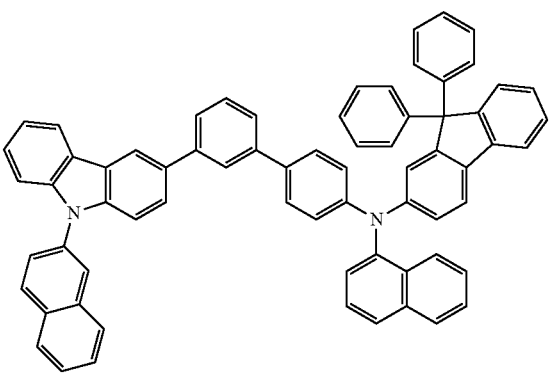

24
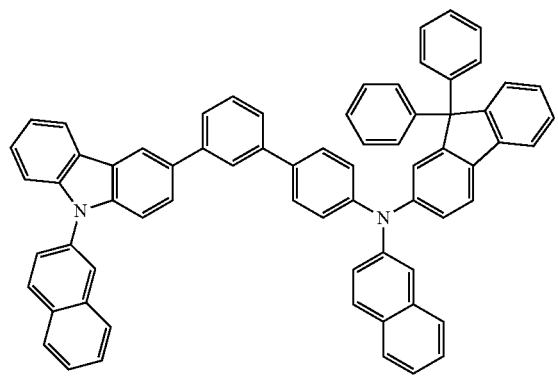
25
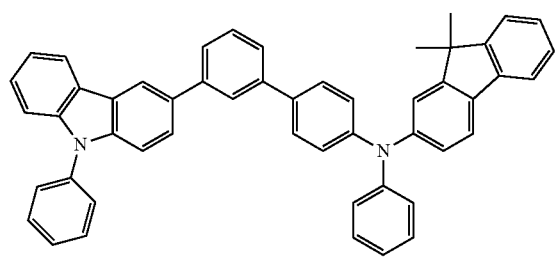
26
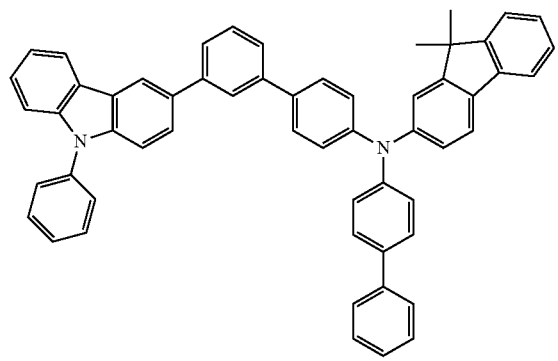
27
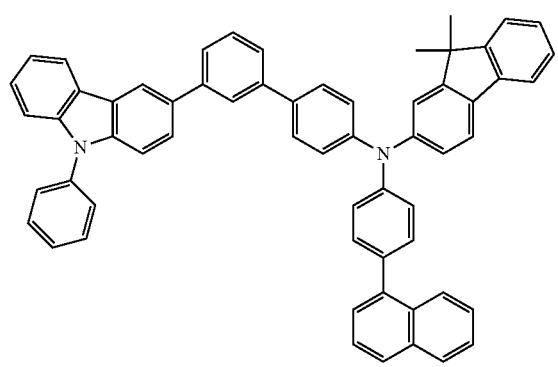
28
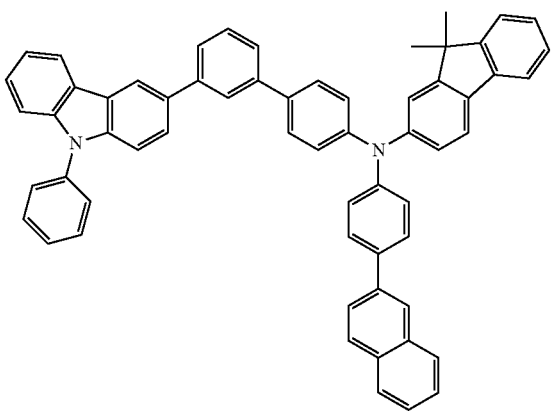
29
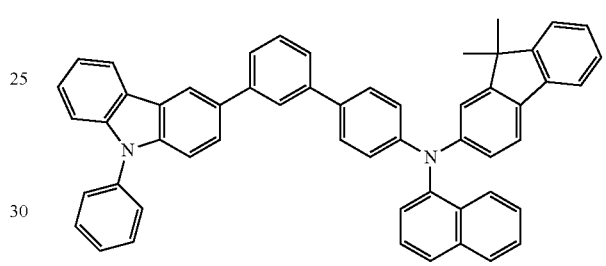
30
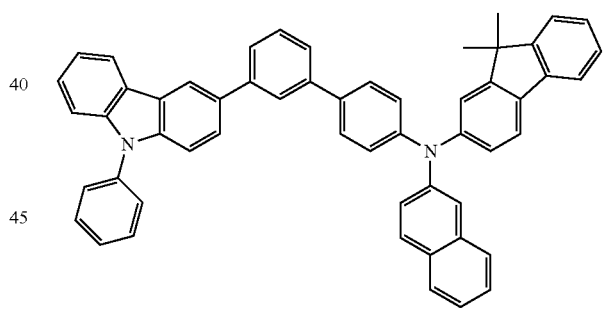
31
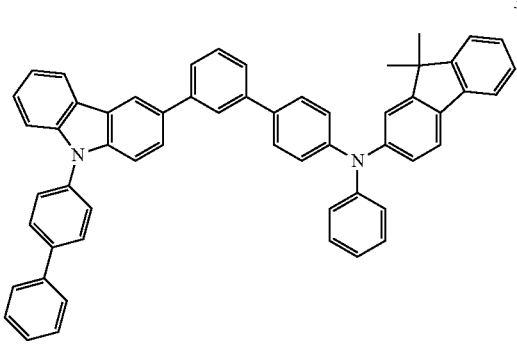

32
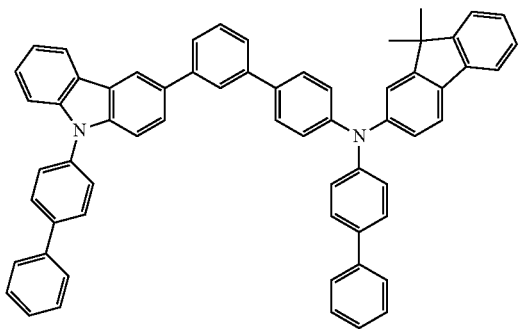
33
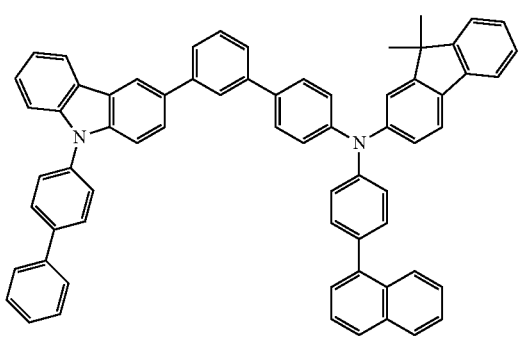
34
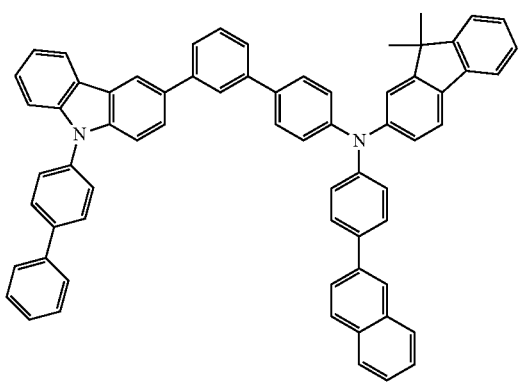
35
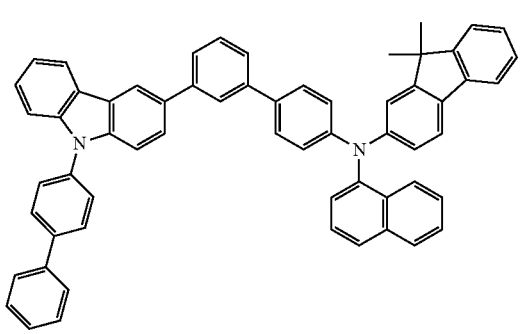
36
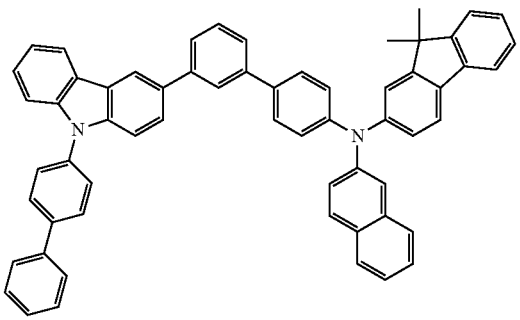
37
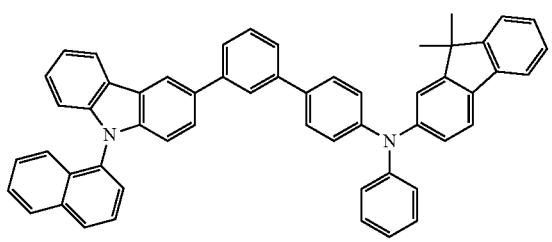
38
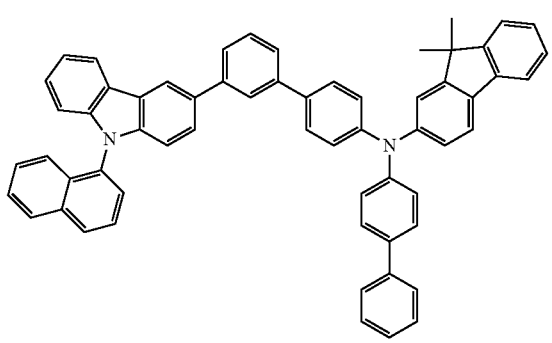
39
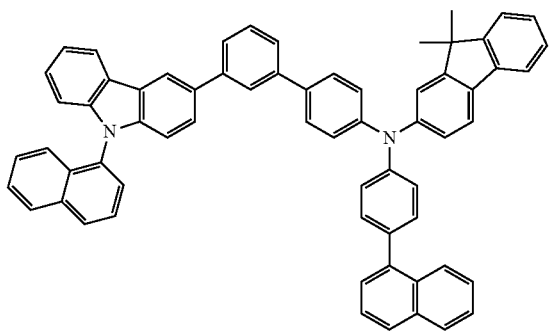

40
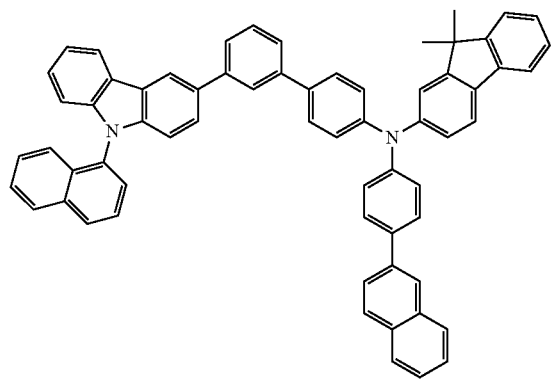
41
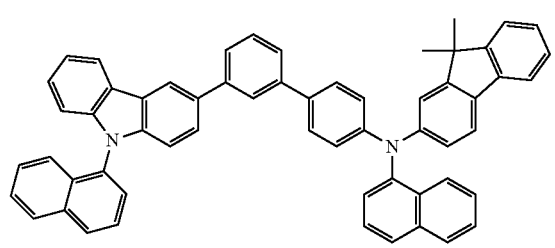
42
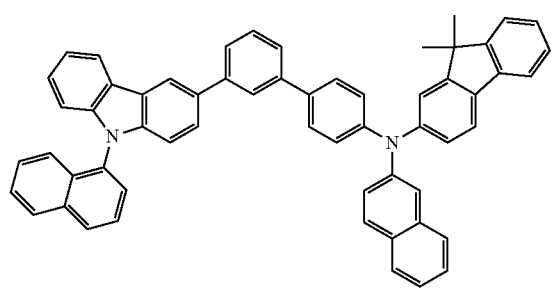
43
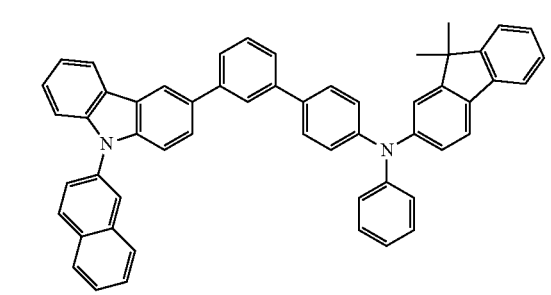
44
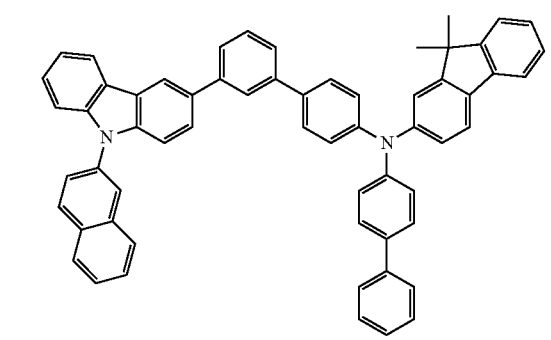
45
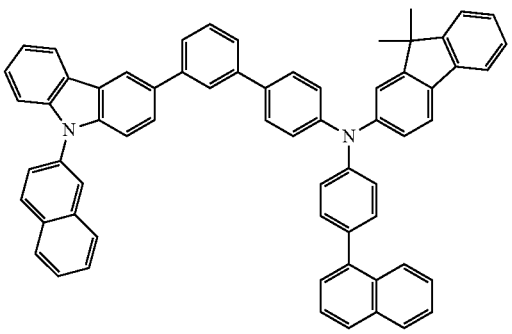
46
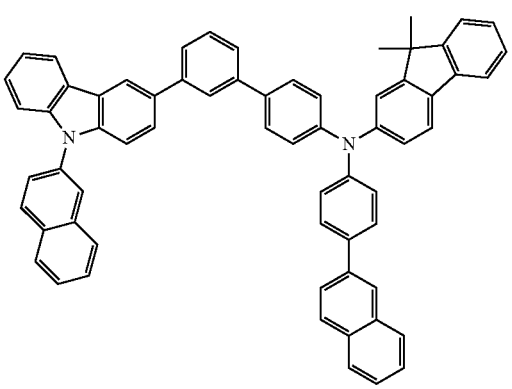
47
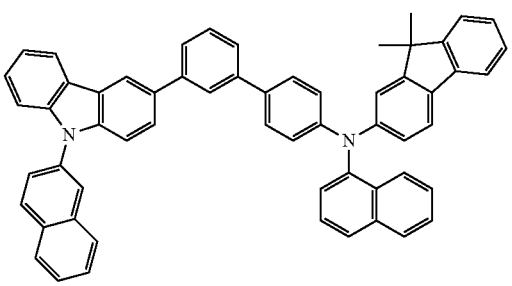
48
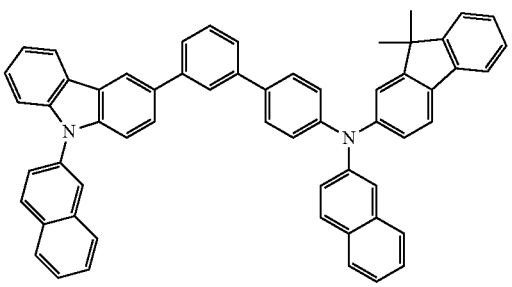

49
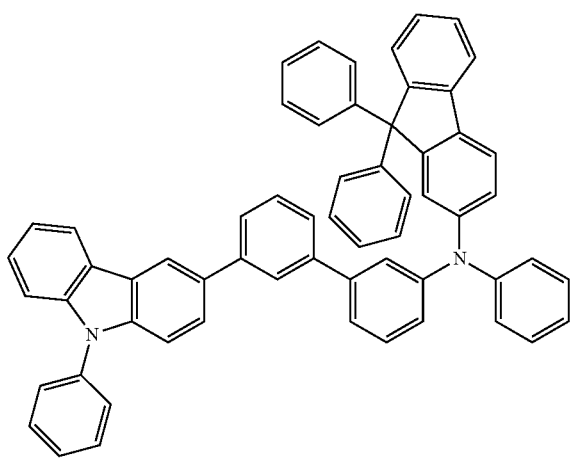
50
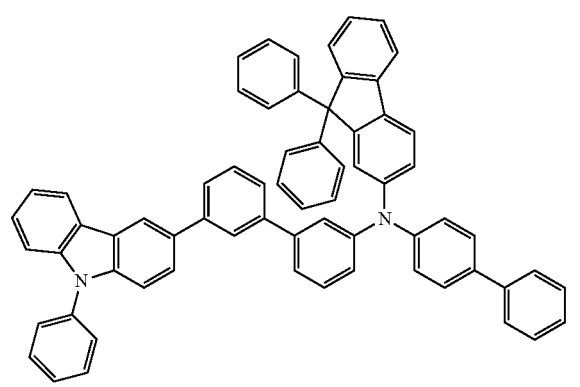
51
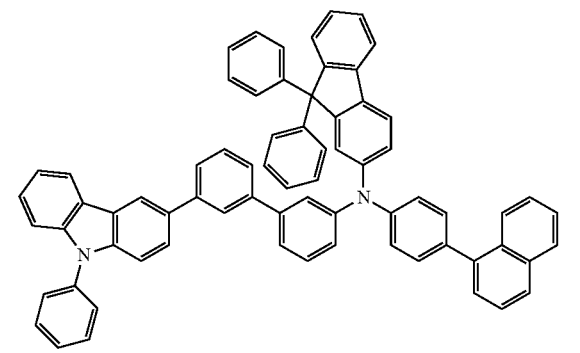
52
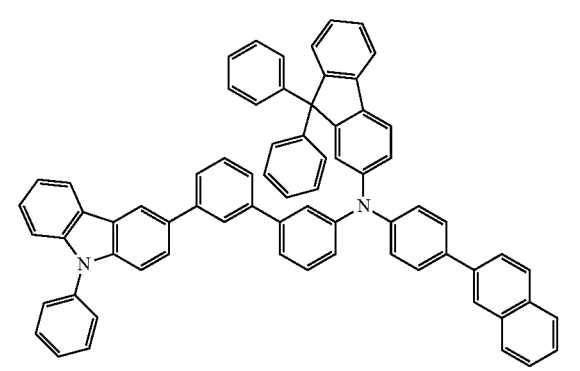
53
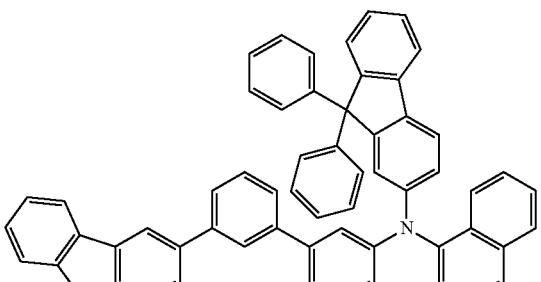
54
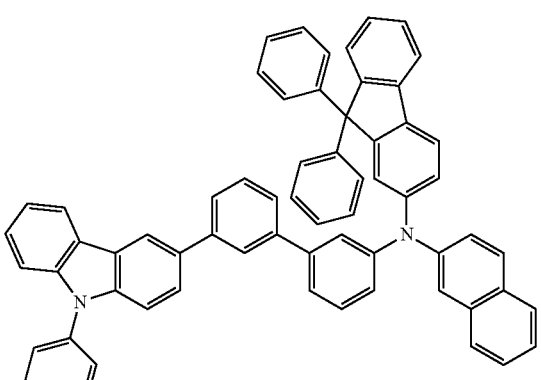
55
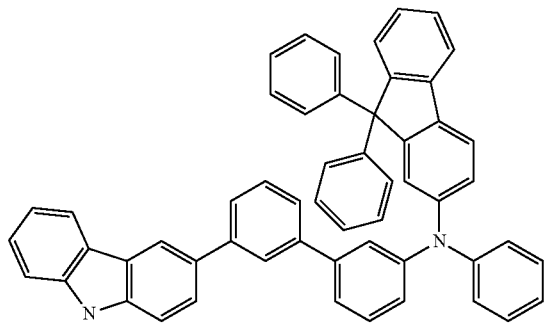
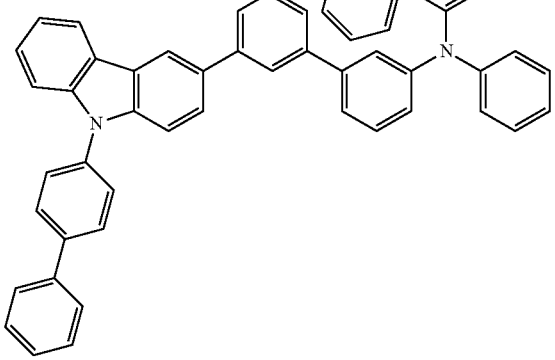

-continued
56
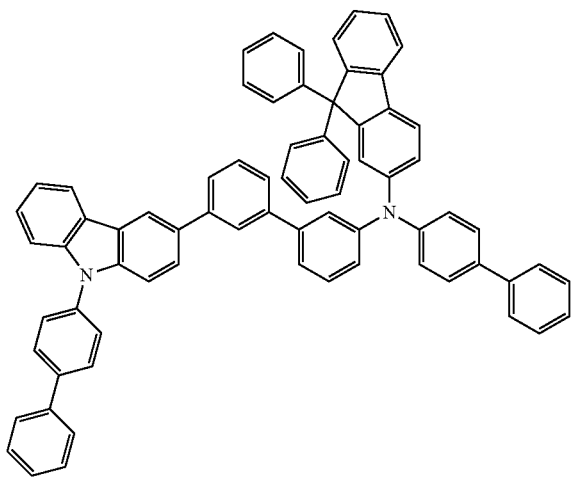
57
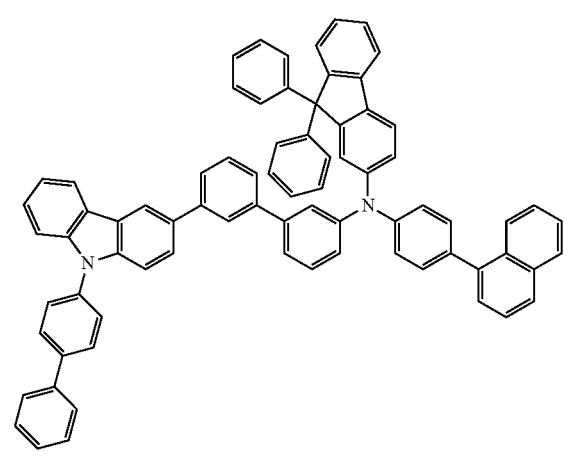
58
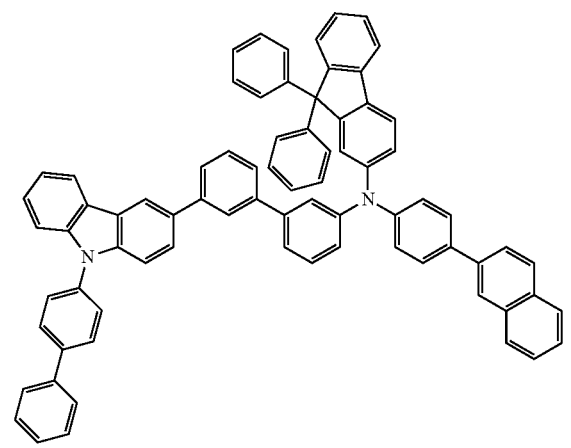
-continued
59
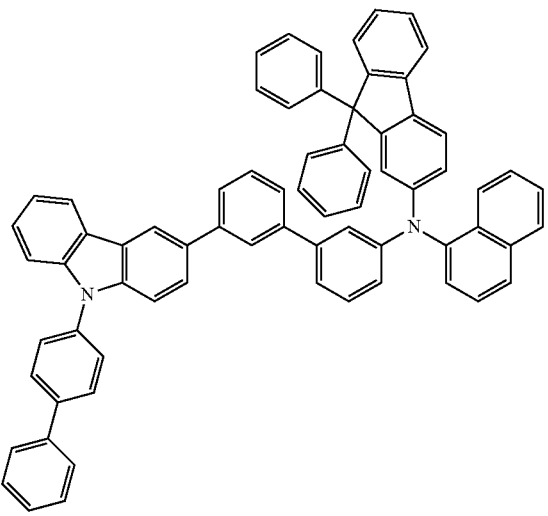
60
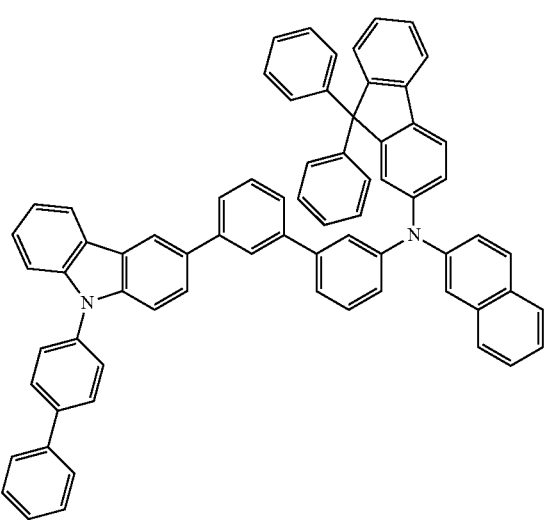
61
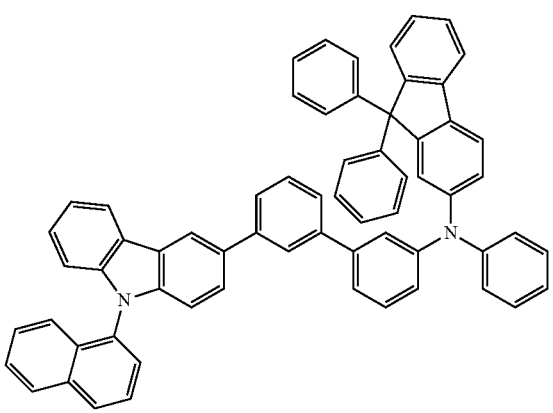

-continued
62
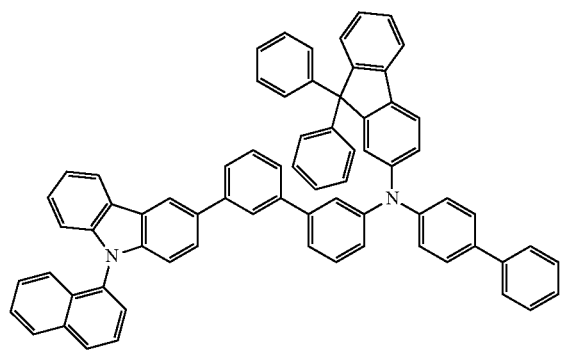
63
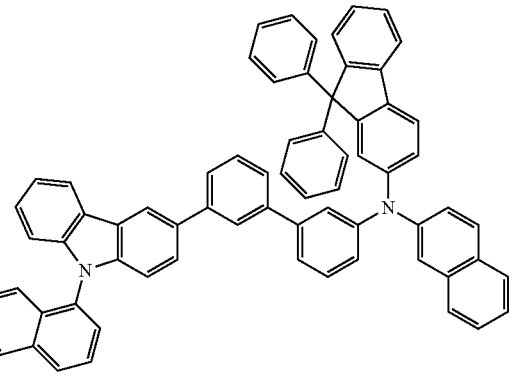
64
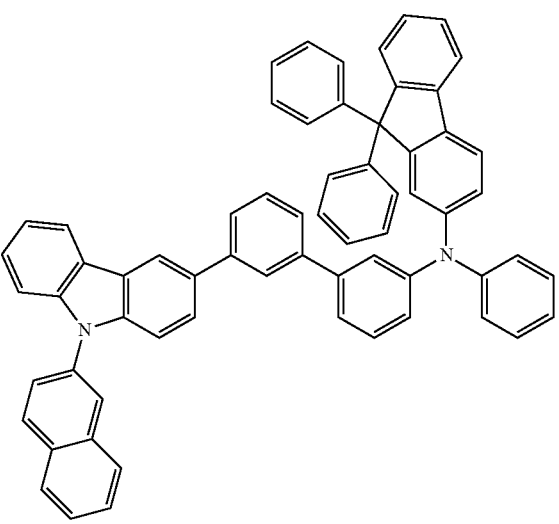
65
-continued
66
67
68
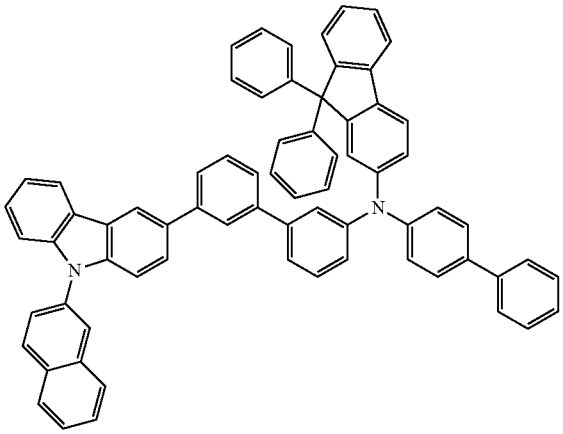

69
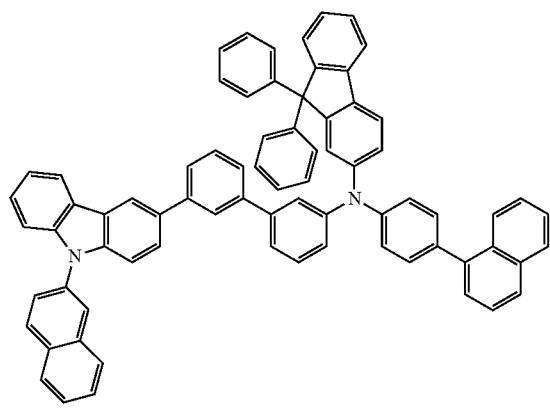
70
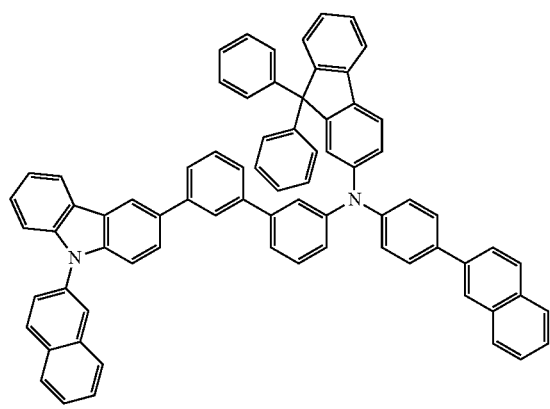
71
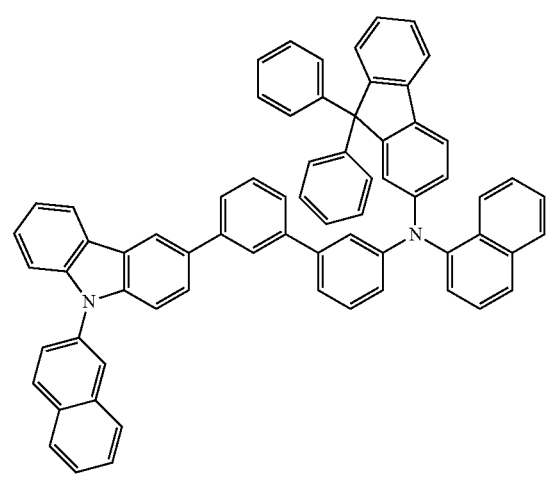
72
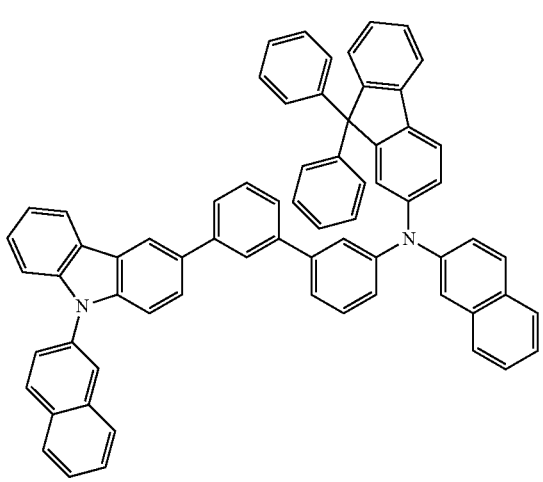
73
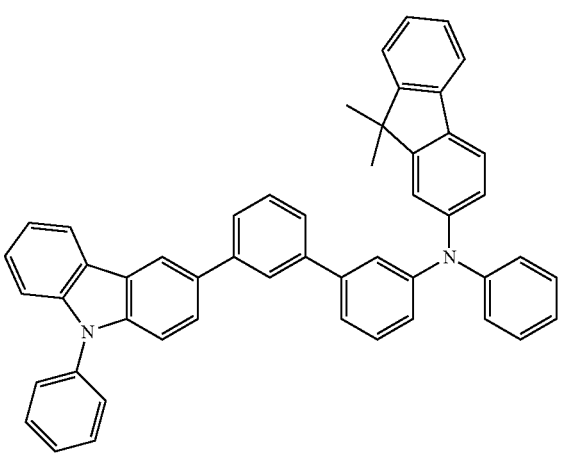
74
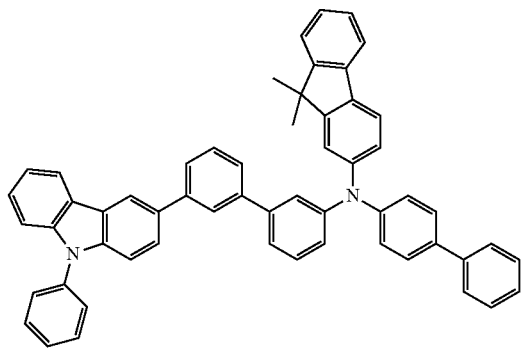

75
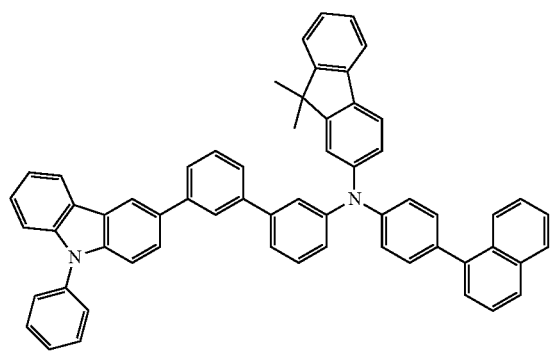
76
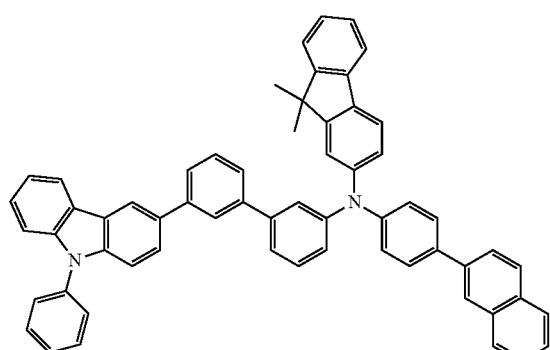
77
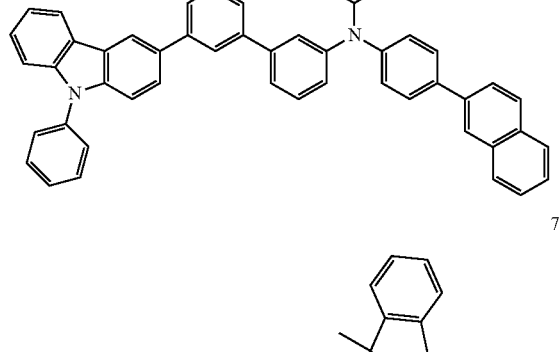
78
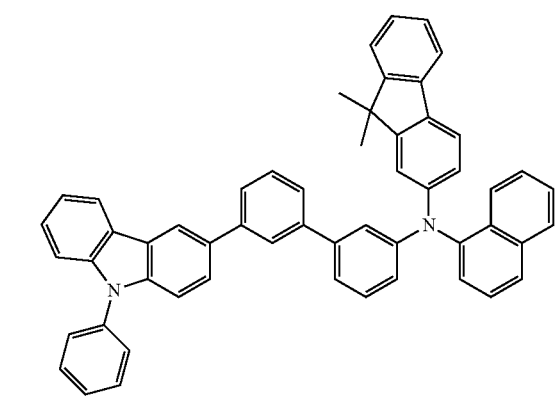
79
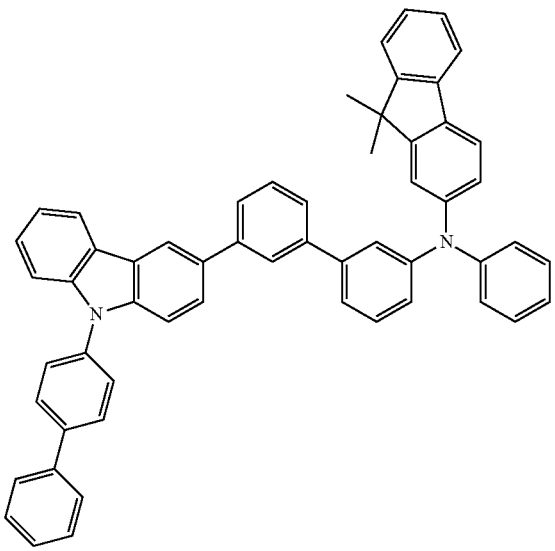
80
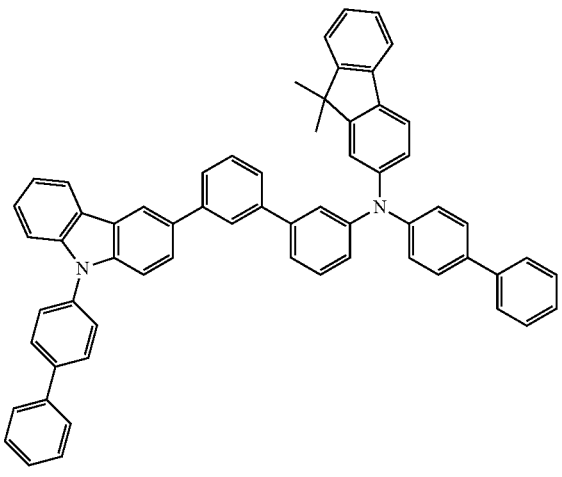
81
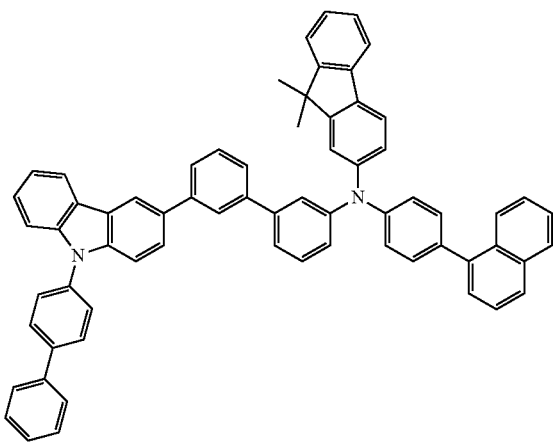

82
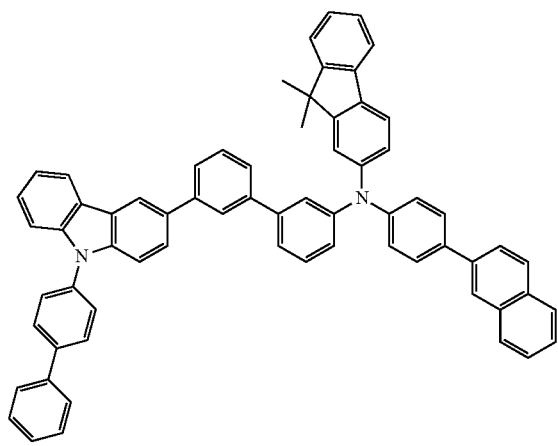
83
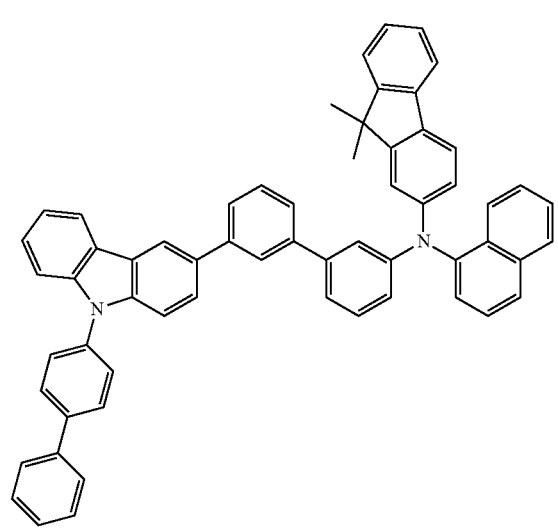
84
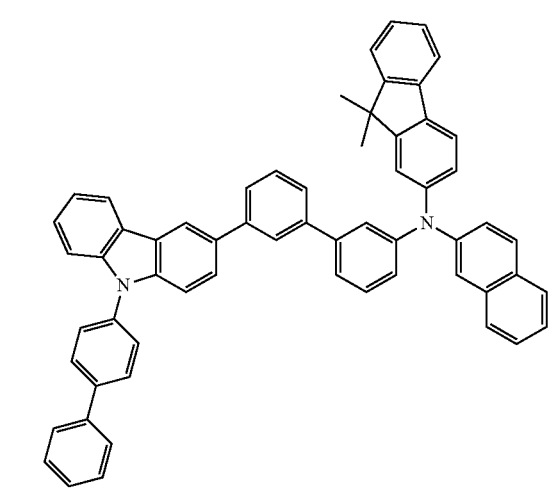
85
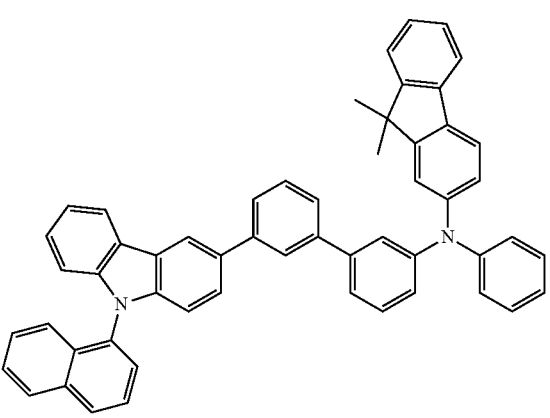
86
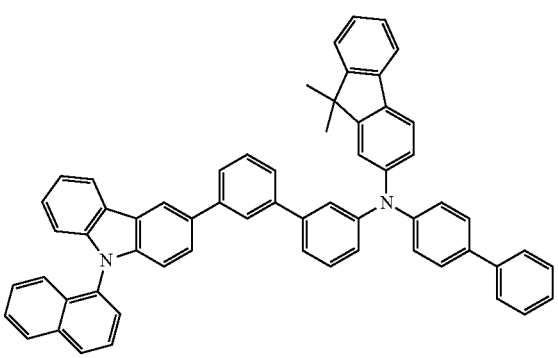
87
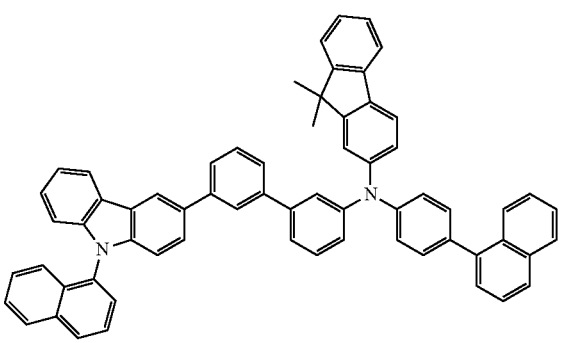
88
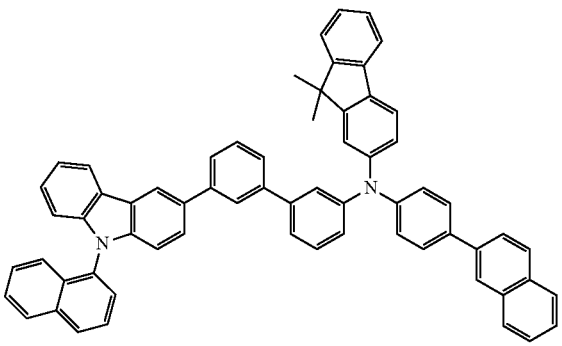

89
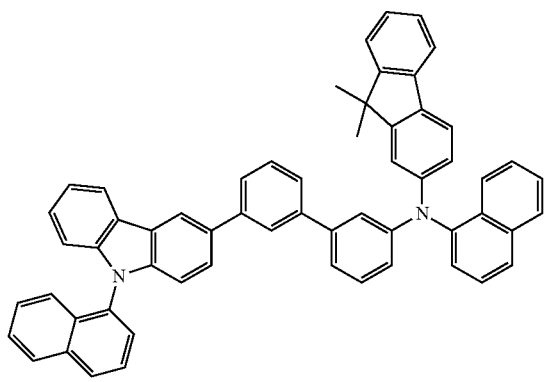
90
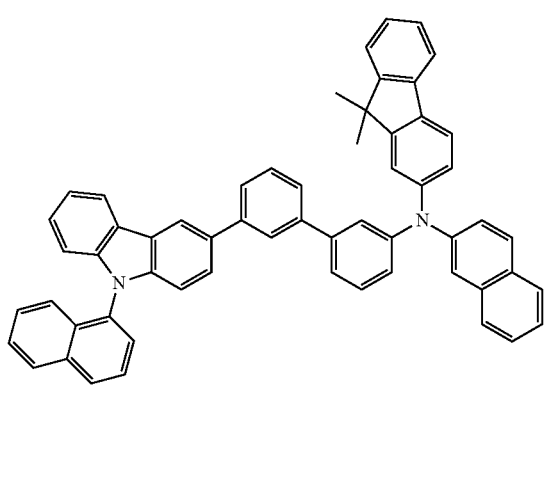
91
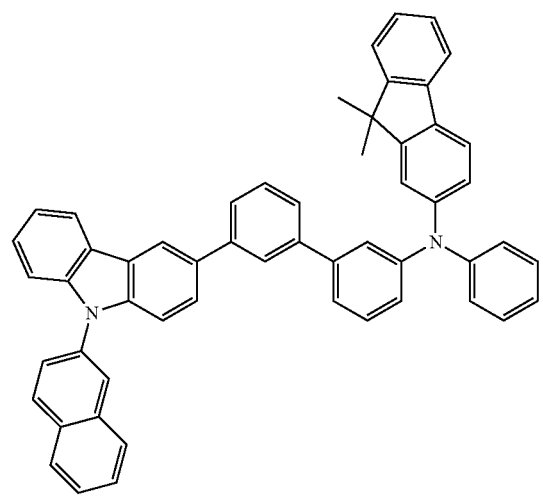
92
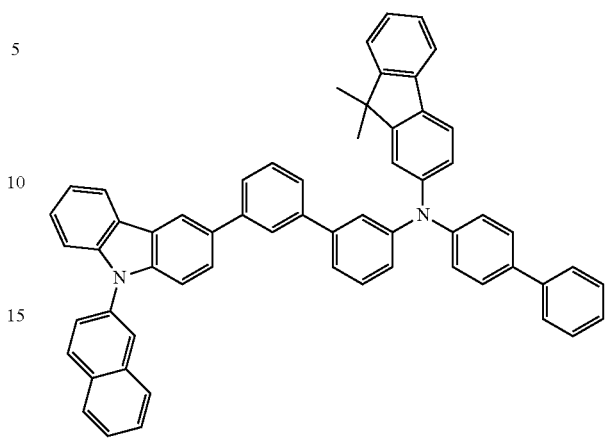
93
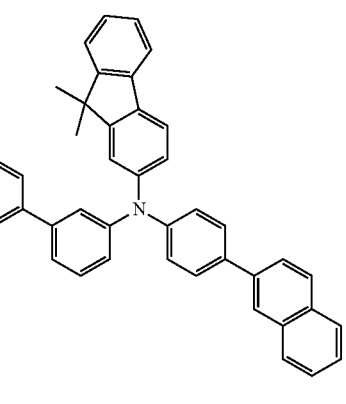
94

-continued

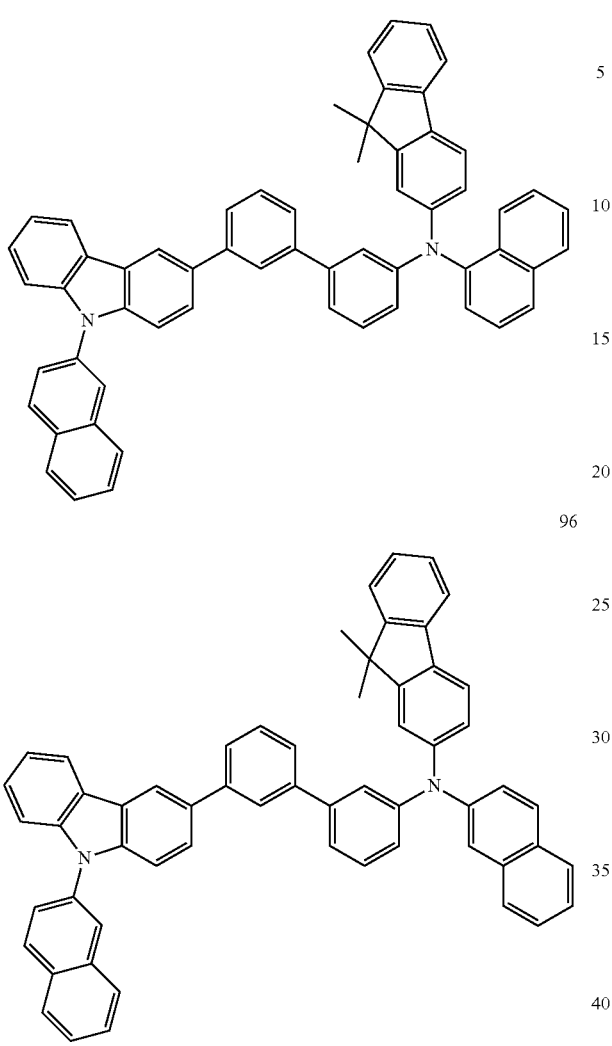

95

96

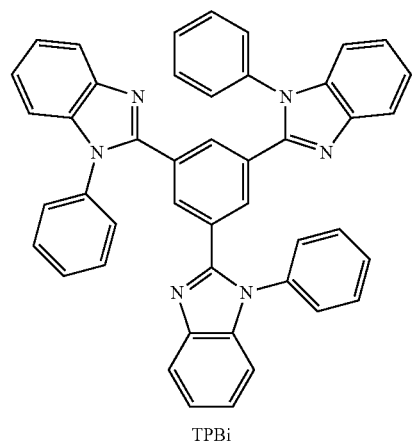

TPBi

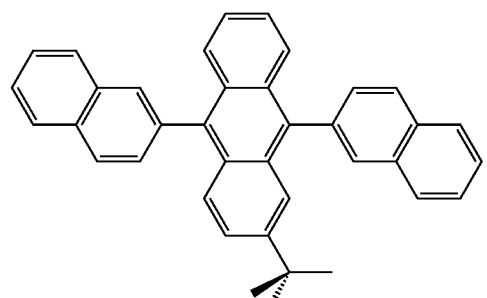

TBADN

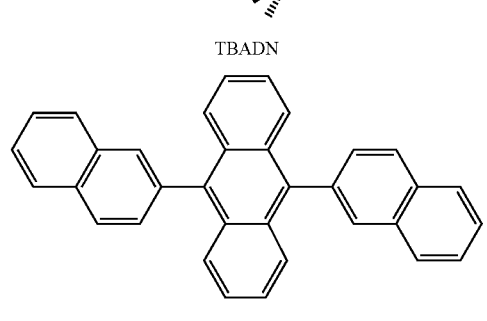

ADN

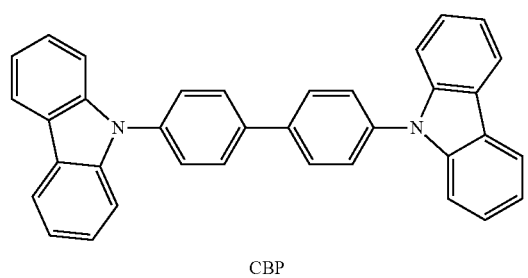

CBP

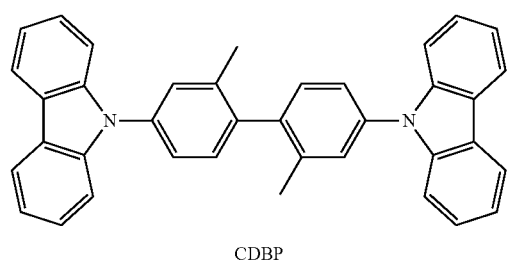

CDBP

The interlayer 14 may include the amine-based compound represented by Formula 1 or 2. Accordingly, the charges in the EML may be balanced. Efficiency, power, and life characteristics of the OLED 10 may be improved.

A thickness of the interlayer 14 may be in a range of about 5 Å to about 1,000 Å, for example, about 5 Å to about 100 Å. When a thickness of the interlayer 14 is within this range, effective charge balance may be achieved between the first electrode 3 and the second electrode 19 without substantial increase in driving voltage.

The EML 13 may be formed on the interlayer 14 by using various methods such as vacuum deposition, spin coating, casting, LB deposition, inkjet printing, laser printing, or LITI. When the EML 13 is formed by vacuum deposition and spin coating, the deposition conditions and the coating conditions of the EML 13 may be referred to the deposition conditions and the coating conditions of the HIL.

The EML 13 may be a blue EML emitting blue light or a red EML emitting red light.

The EML 13 may include a host and a dopant.

The host may include at least one of TPBi, TBADN, AND (also referred to as "DNA"), CBP, CDBP, and TCP:

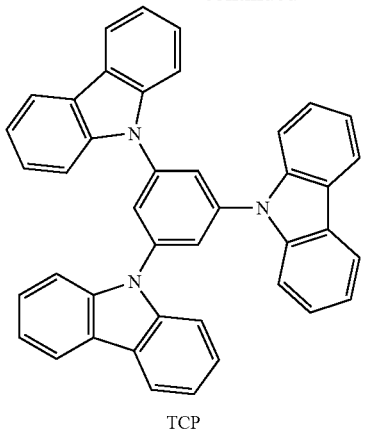

TCP

Also, the host may include a compound represented by Formula 301.

$$Ar_{301}\text{-}[(L_{301})_{xb1}\text{-}R_{301}]_{xb2}$$ <Formula 301>

In Formula 301, $Ar_{301}$ may be selected from, a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —Si($Q_{301}$)($Q_{302}$)($Q_{303}$) (here, $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group);

description of $L_{301}$ may be referred to the description of $L_{201}$ of the present specification;

$R_{301}$ may be selected from, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 is selected from 0, 1, 2, and 3; and xb2 is selected from 1, 2, 3, and 4.

For example, in Formula 301, $L_{301}$ may be selected from, a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, as examples.

For example, the host may include a compound represented by Formula 301A:

<Formula 301A>

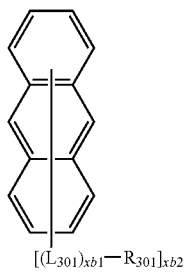

$[(L_{301})_{xb1}-R_{301}]_{xb2}$

In Formula 301A, descriptions of the substituents may be referred to the descriptions in the present specification.

The compound represented by Formula 301A may include at least one of Compounds H1 to H42, as examples:

H1

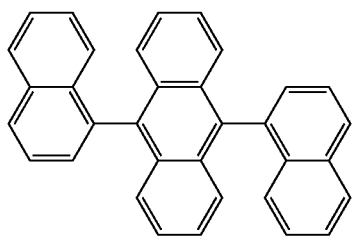

H2

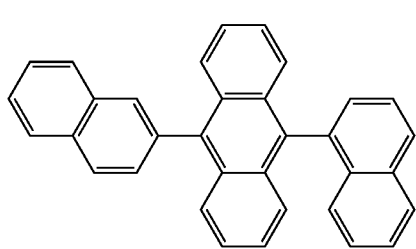

H3

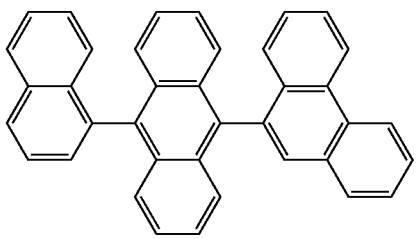

H4

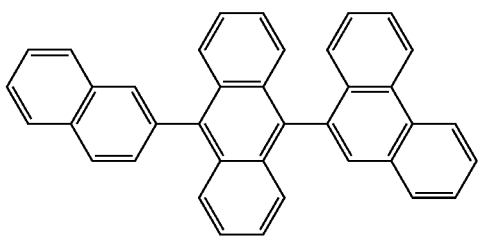

H5

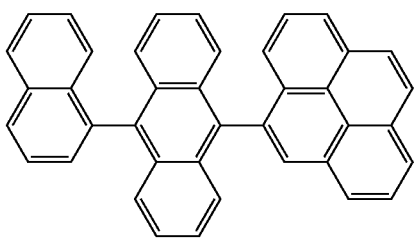

H6

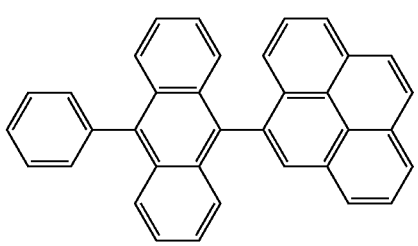

H7

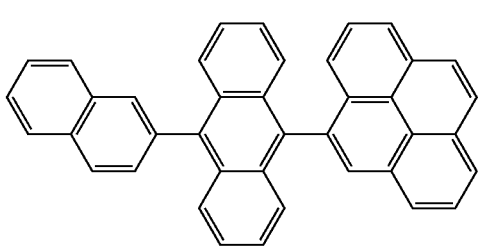

H8

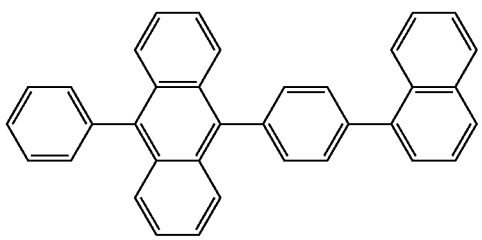

-continued
H9
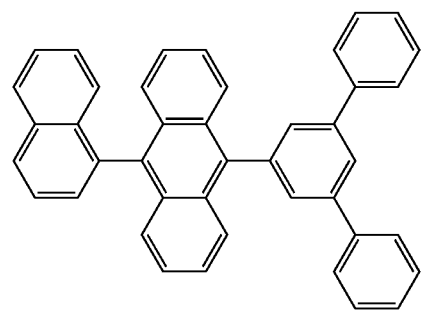
H10
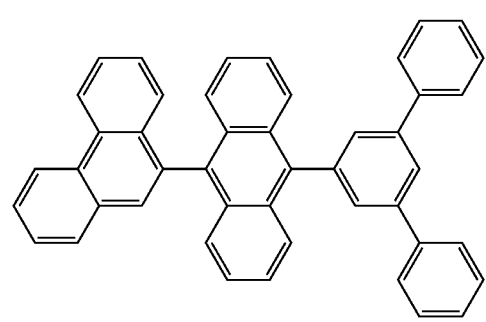
H15
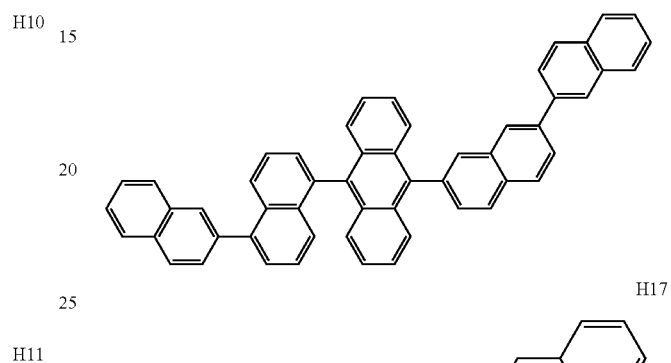
H11
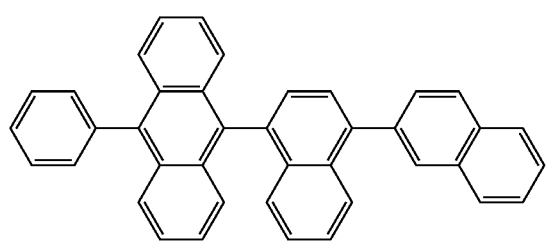
H16
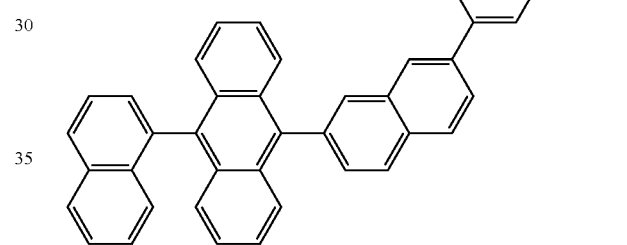
H12
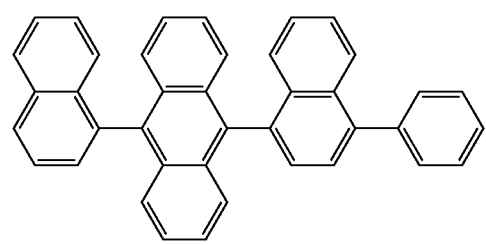
H17
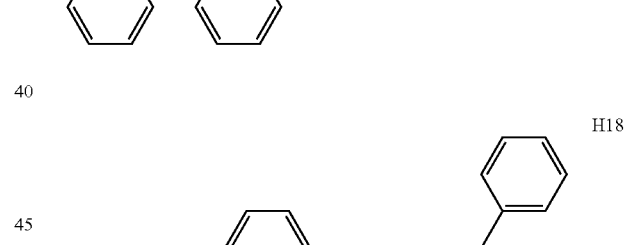
H13
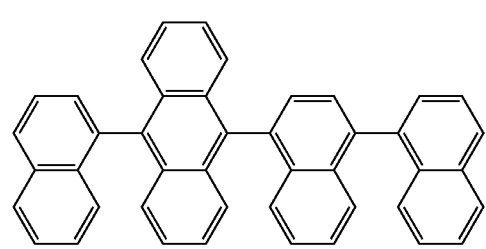
H18
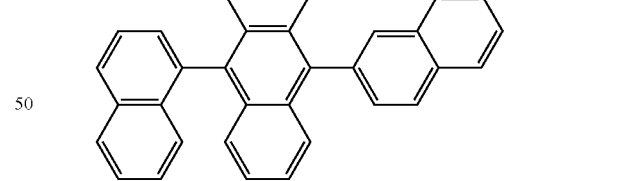
H14
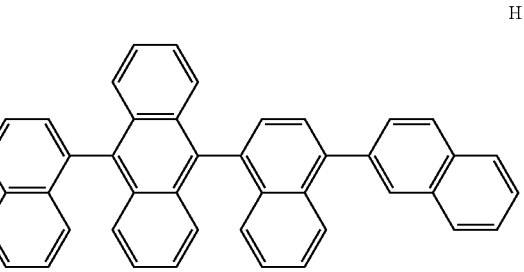
H19
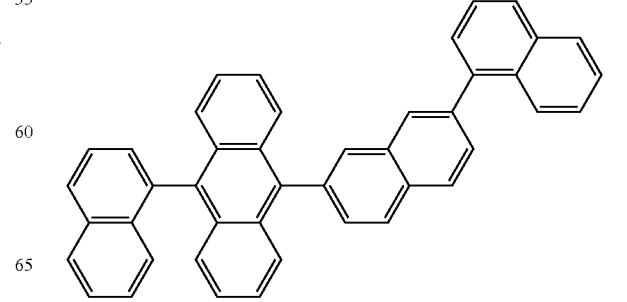

H20 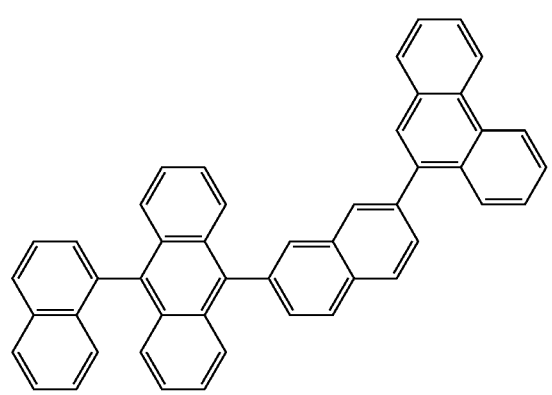
H21 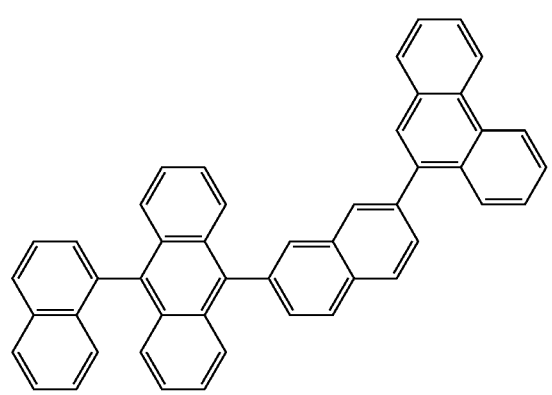
H22 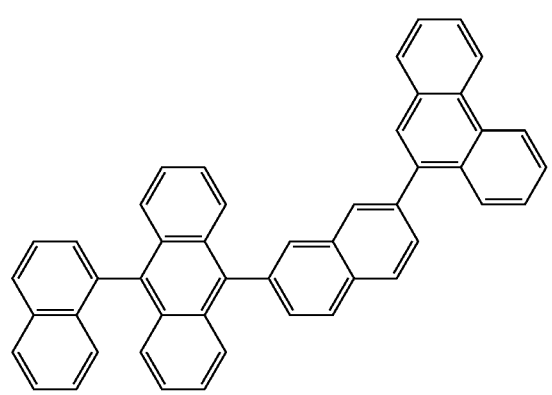
H23 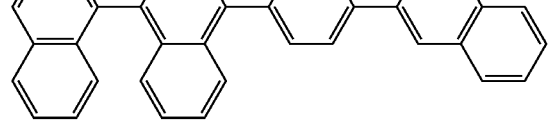
H24 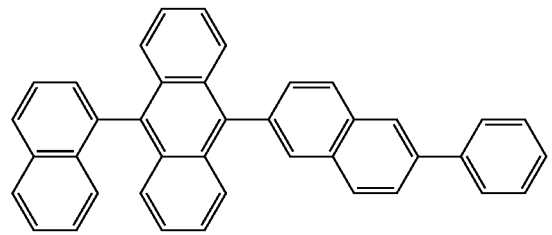
H25 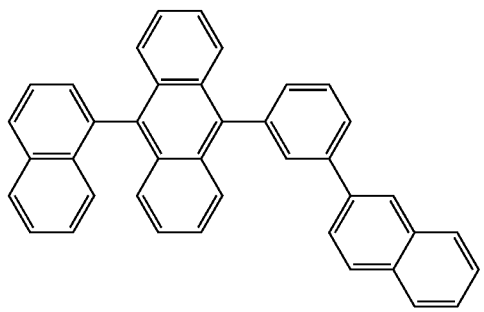
H26 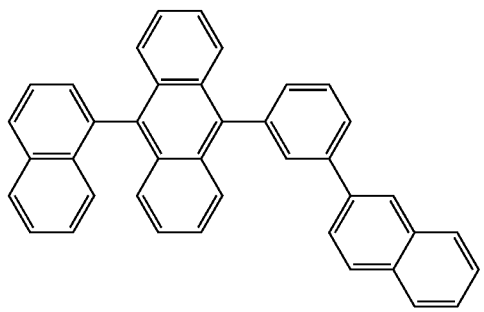
H27 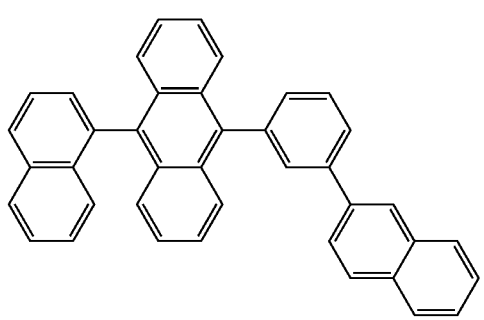
H28 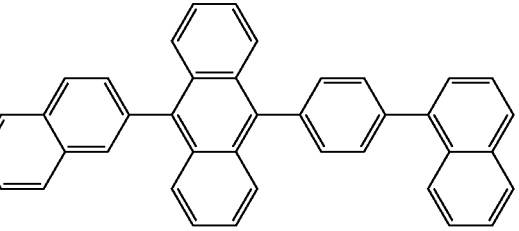
H29 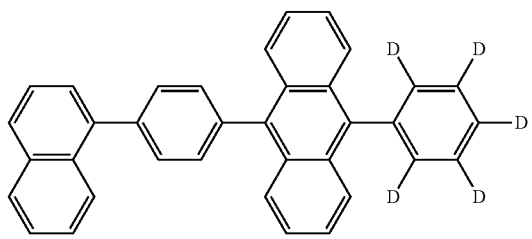
H30 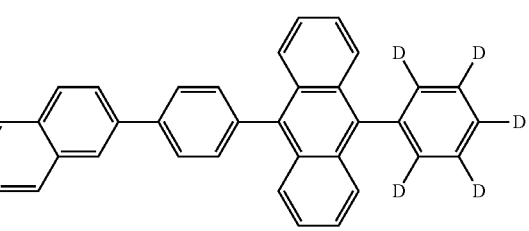

-continued
H31
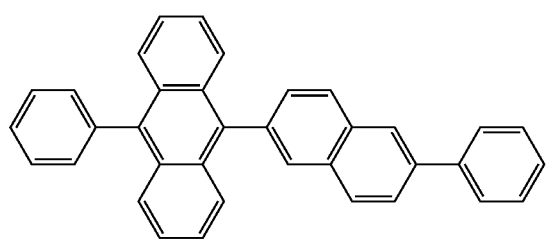
H32
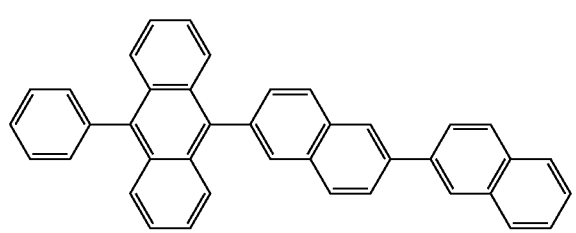
H33
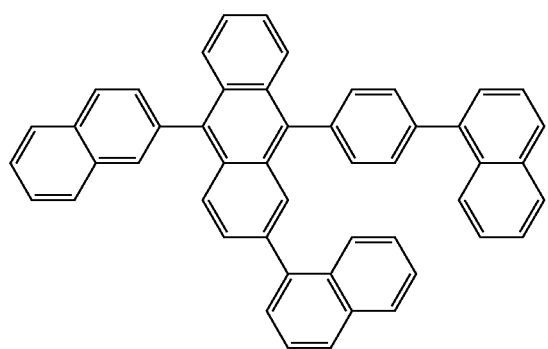
H34
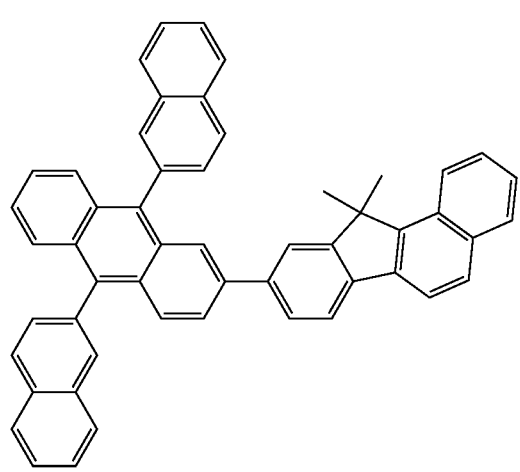
-continued
H35
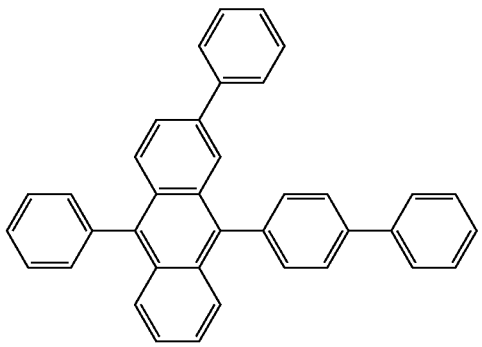
H36
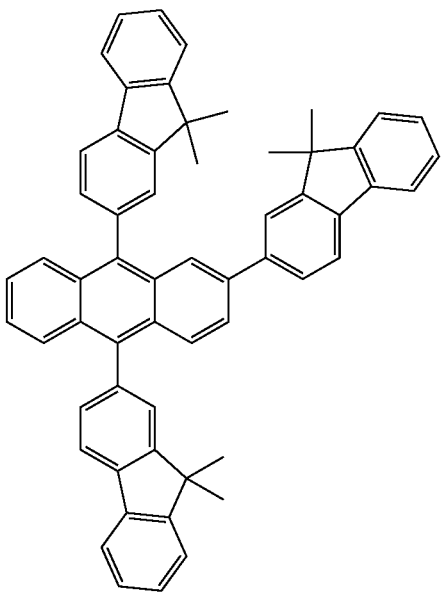
H37
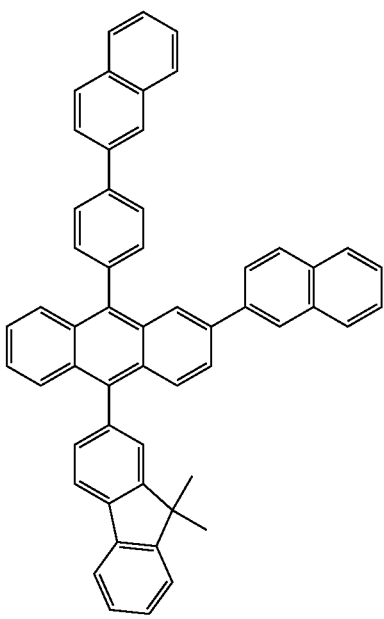

H38
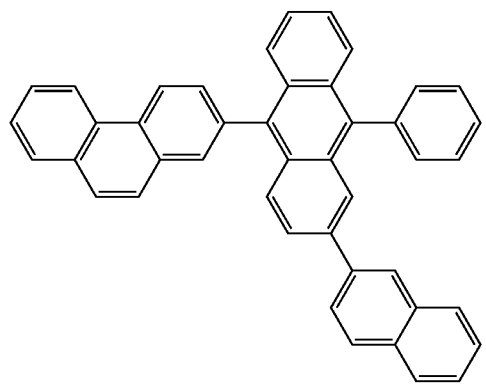
H39
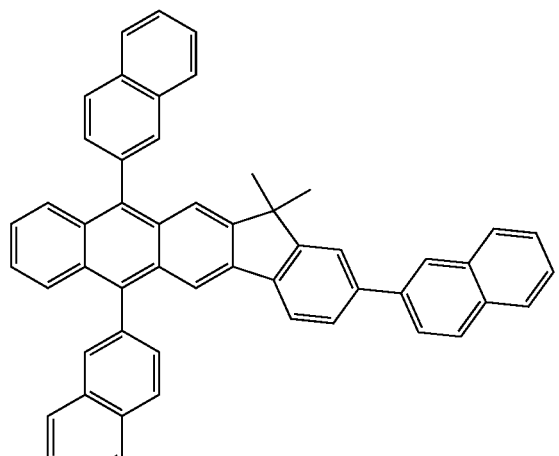
H40
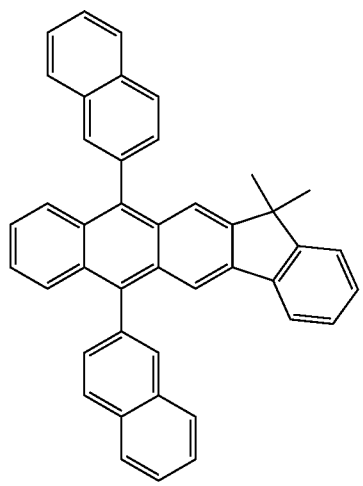
H41
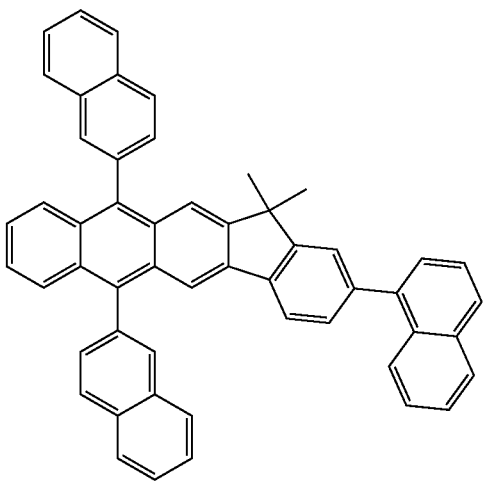
H42
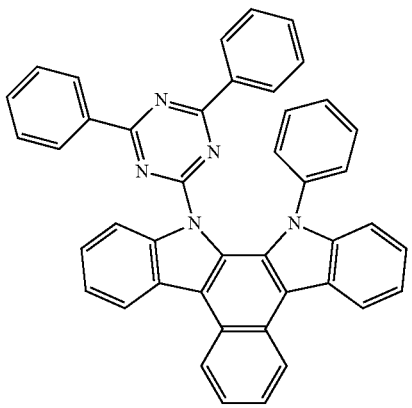
Also, the host may include at least one of Compounds H43 to H49, as examples:
H43

H44 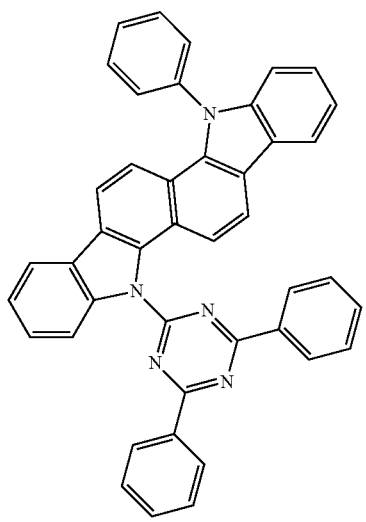
H45 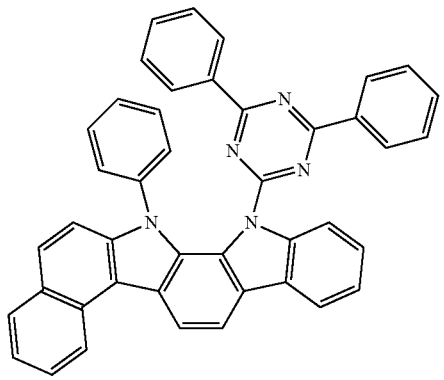
H46 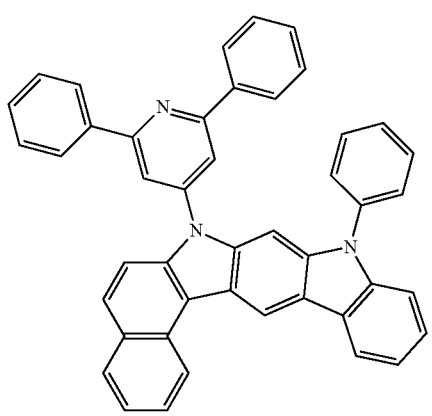
H47 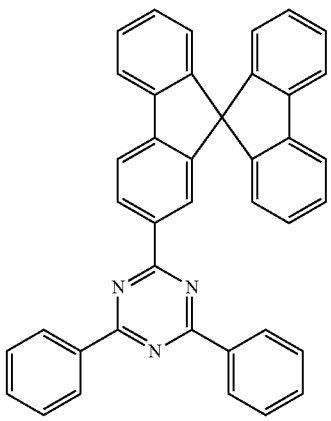
H48 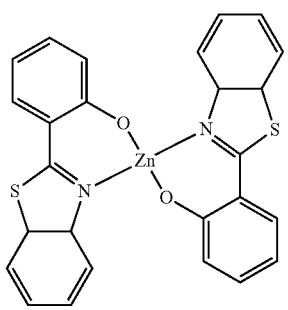
H49 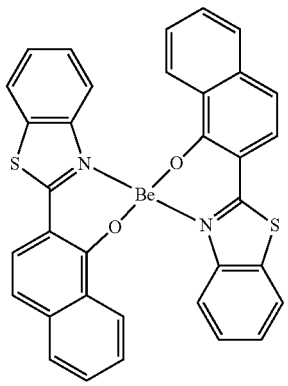
The dopant may include at least one of a fluorescent dopant and a phosphorescent dopant.
The phosphorescent dopant may include an organic metal complex represented by Formula 401:

<Formula 401>

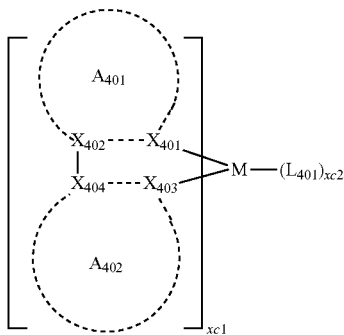

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may each independently be a nitrogen atom or a carbon atom;

rings $A_{401}$ and $A_{402}$ may each independently be selected from a substituted or unsubstituted a benzene, a substituted or unsubstituted a naphthalene, a substituted or unsubstituted a fluorene, a substituted or unsubstituted a spirofluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted a benzene, substituted a naphthalene, substituted a fluorene, substituted a spiro-fluorene, substituted indene, substituted pyrrole, substituted thiophene, substituted furan, substituted imidazole, substituted pyrazole, substituted thiazole, substituted isothiazole, substituted oxazole, substituted isooxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzooxazole, substituted isobenzooxazole, substituted triazole, substituted oxadiazole, substituted triazine, substituted dibenzofuran, and substituted dibenzothiophene is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ is an organic ligand;

xc1 is an integer of 1, 2, or 3; and xc2 is an integer of 0, 1, 2, or 3;

$L_{401}$ may be a monovalent, divalent, or trivalent organic ligand. For example, $L_{401}$ may be selected from a halogen ligand (e.g., Cl or F), a diketone ligand (e.g., acetylacetonate, 1,3-diphenyl-1,3-propanedionate, 2,2,6,6-tetramethyl-3,5-heptanedionate, or hexafluoroacetonate), a carboxylic acid ligand (e.g., picolinate, dimethyl-3-pyrazolecarboxylate, or benzoate), a carbon monoxide ligand, an isonitrile ligand, a cyano ligand, and a phosphorus ligand (e.g., phosphine or phosphite).

In Formula 401, when $A_{401}$ has at least two substituents, the at least two substituents of $A_{401}$ may link to each other and form a saturated or unsaturated ring.

In Formula 401, when $A_{402}$ has at least two substituents, the at least two substituents of $A_{402}$ may link to each other and form a saturated or unsaturated ring.

In Formula 401, when xc1 is 2 or greater, a plurality of ligands,

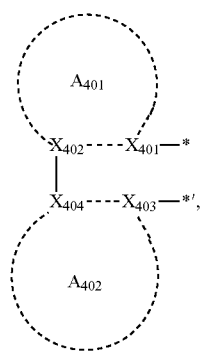

may be identical to or different from each other. In Formula 401, when xc1 is 2 or greater, $A_{401}$ and $A_{402}$ may be linked to each other by directly linking to another neighboring ligand of $A_{401}$ and $A_{402}$ or with a connection group (e.g., a $C_1$-$C_5$ alkylene group, —N(R')— (here, R' is $C_1$-$C_{10}$ alkyl group or a $C_6$-$C_{20}$ aryl group), or —C(=O)—) therebetween.

In one embodiment, the phosphorescent dopant may be selected from Compounds PD1 to PD74 below, as examples:

PD1
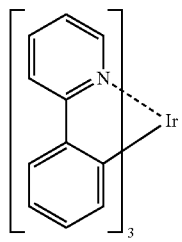

PD2
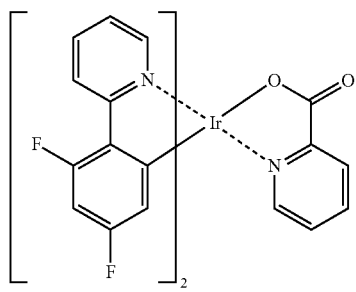

PD3
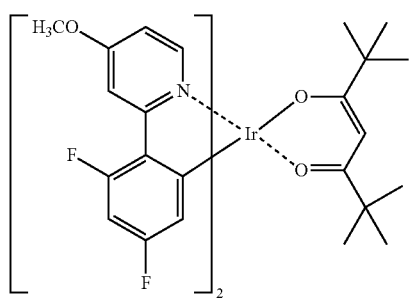

PD4
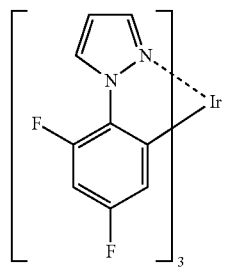

PD5
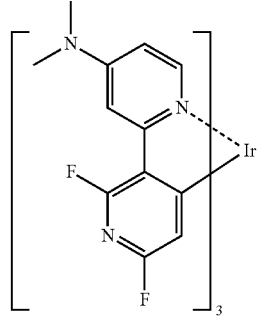

PD6
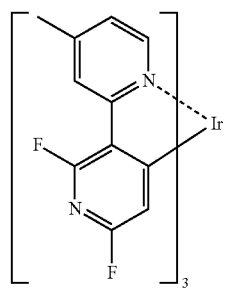

PD7
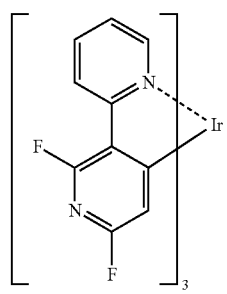

PD8
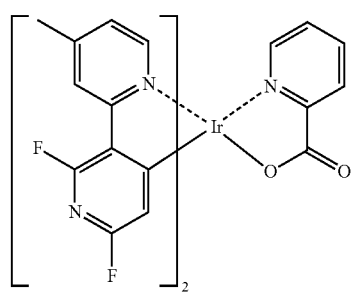

-continued
PD9 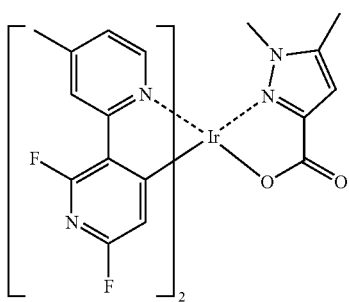
PD10 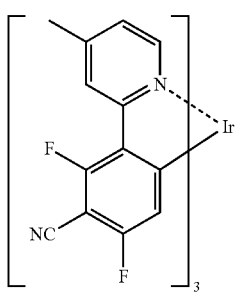
PD11 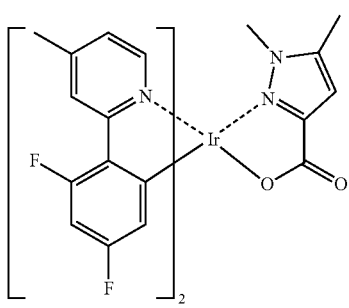
PD12 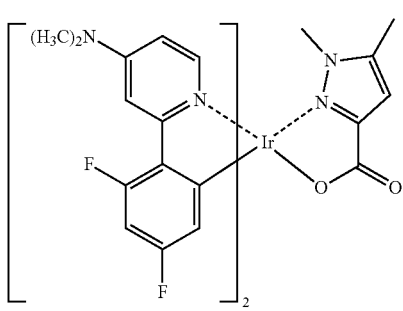
PD13 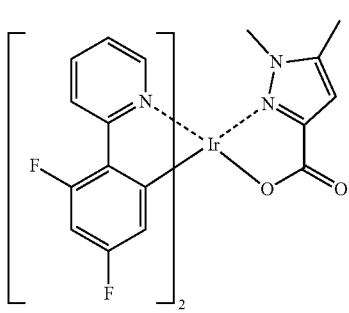
-continued
PD14 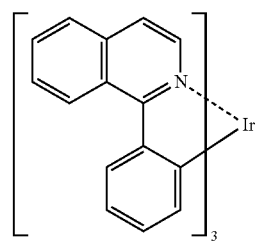
PD15 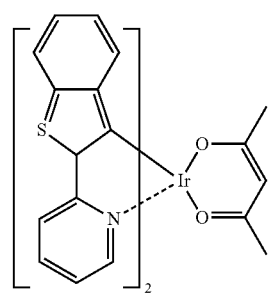
PD16 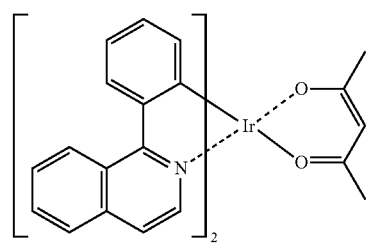
PD17 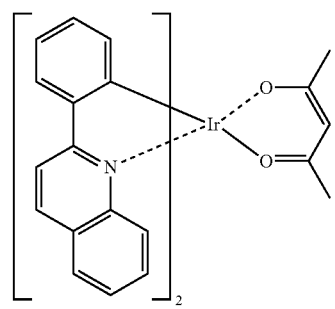
PD18 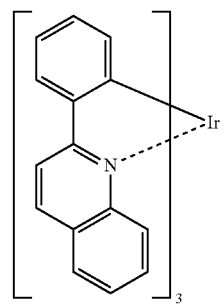

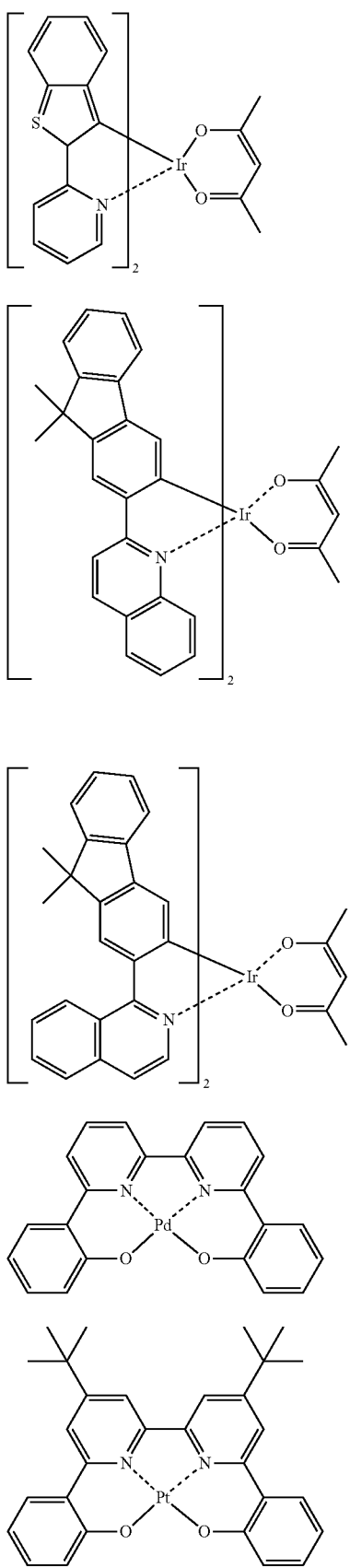
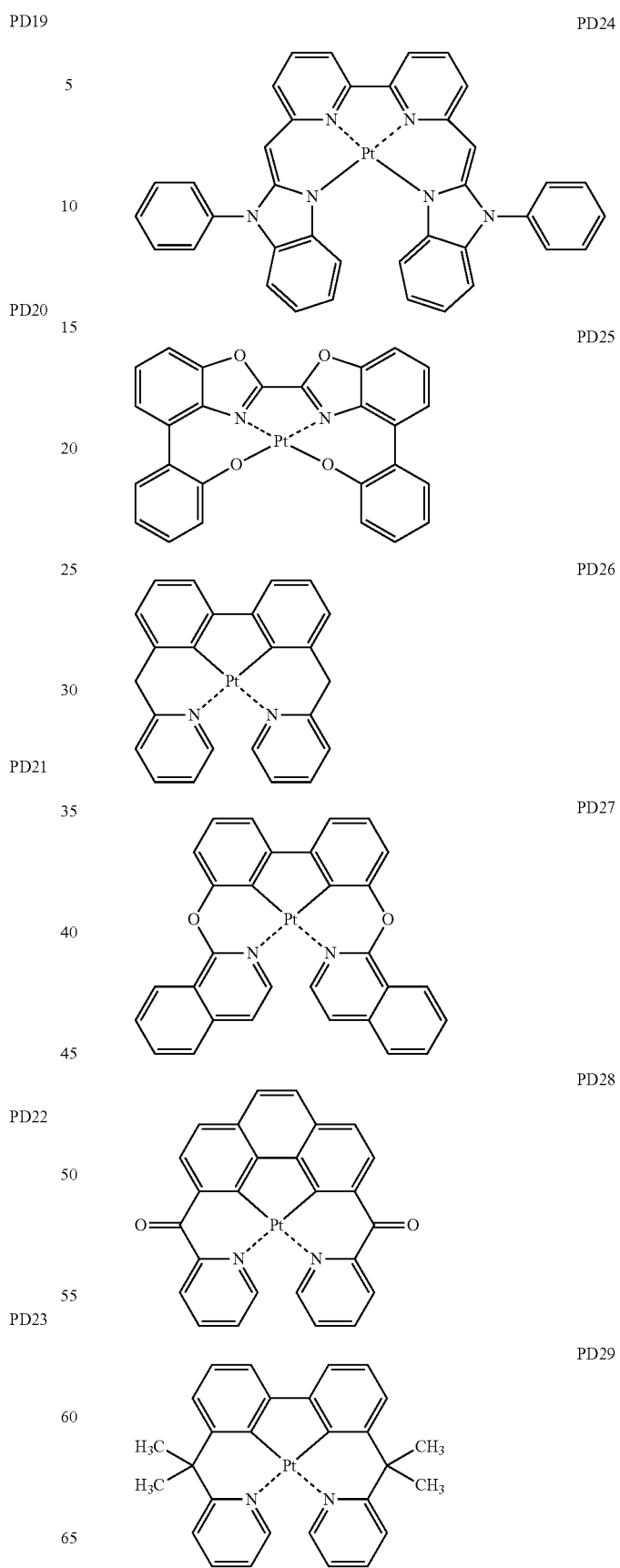

-continued
PD30 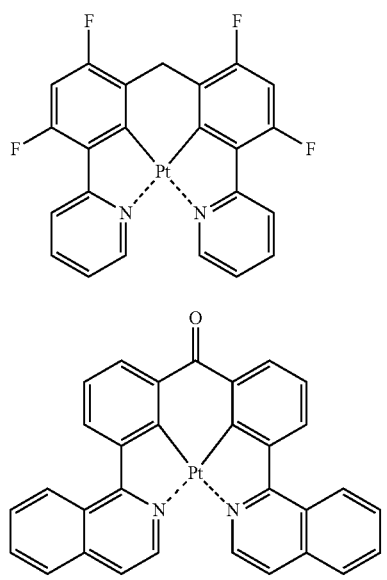
PD31 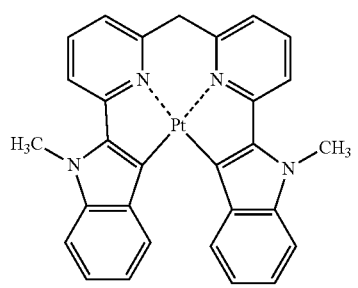
PD32 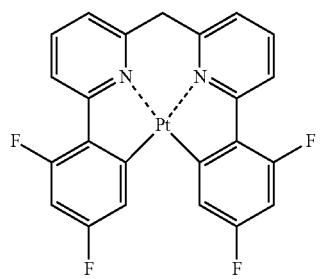
PD33 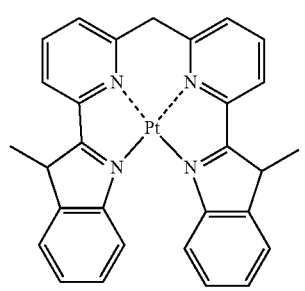
-continued
PD35 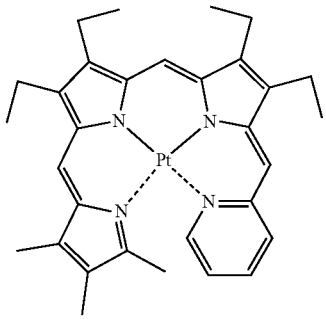
PD36 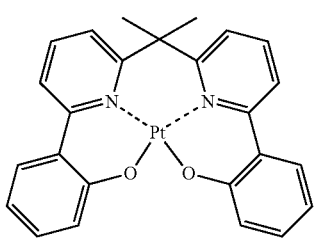
PD37 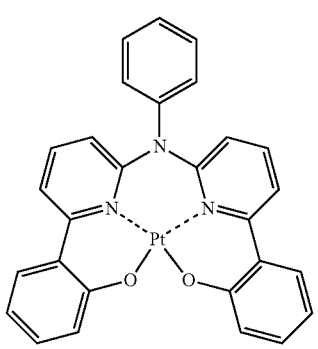
PD38 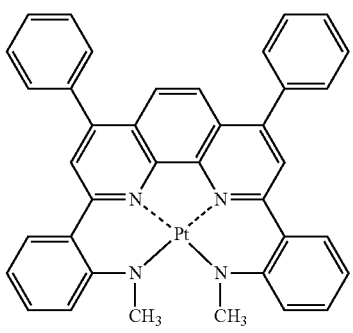
PD34
PD39 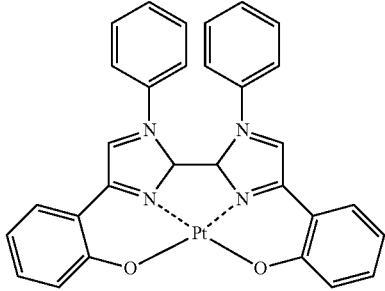

PD40 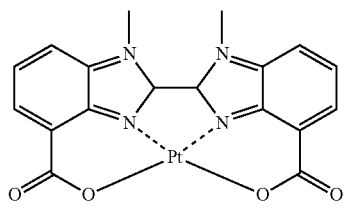
PD41 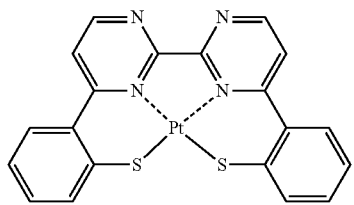
PD42 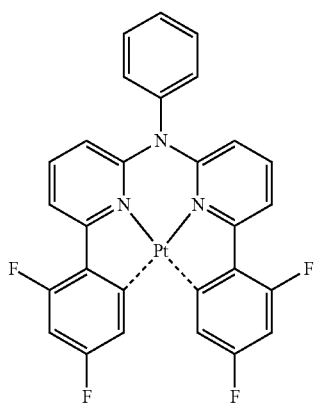
PD43 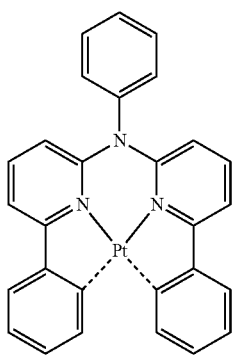
PD44 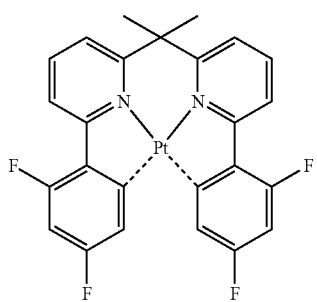
PD45 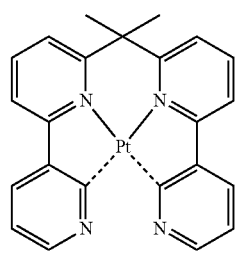
PD46 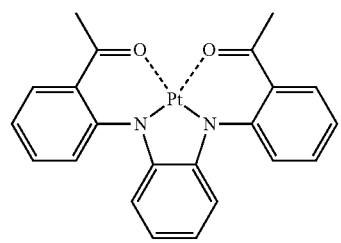
PD47 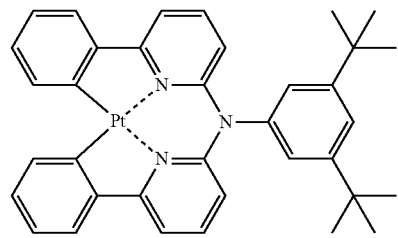
PD48 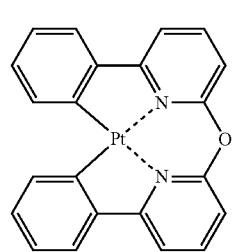
PD49 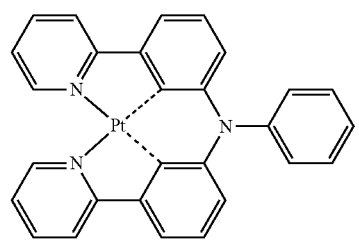
PD50 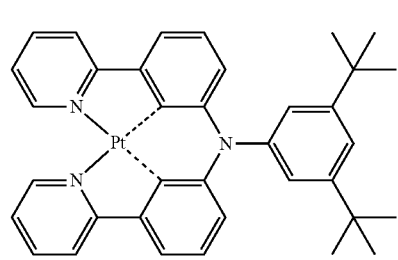

PD51 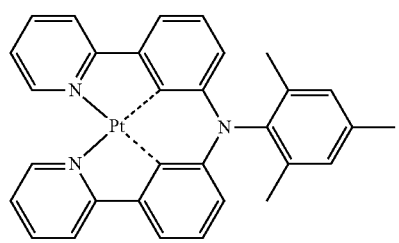
PD57 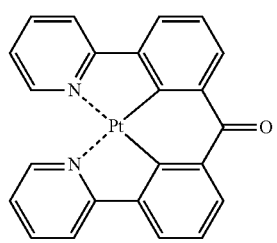
PD52 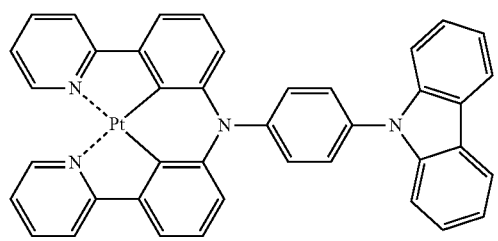
PD58 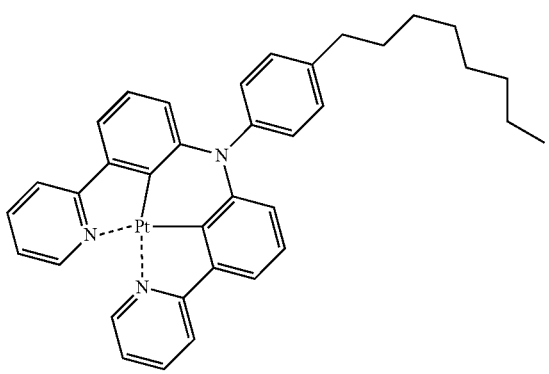
PD53 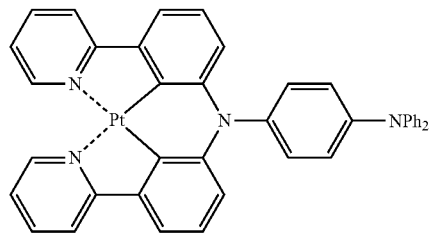
PD59 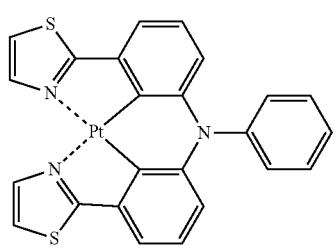
PD54 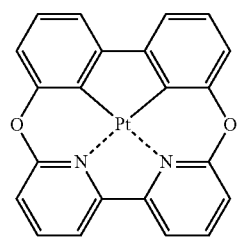
PD60 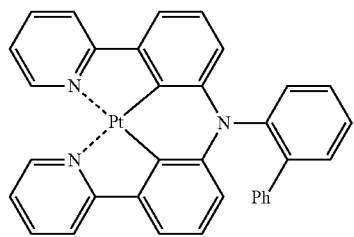
PD55 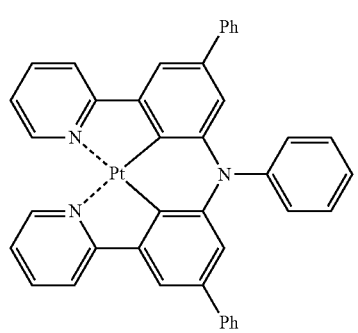
PD56 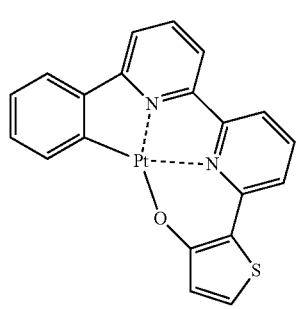
PD61 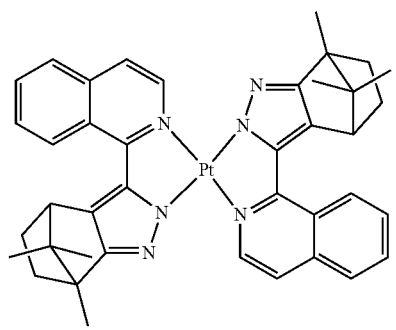

PD62 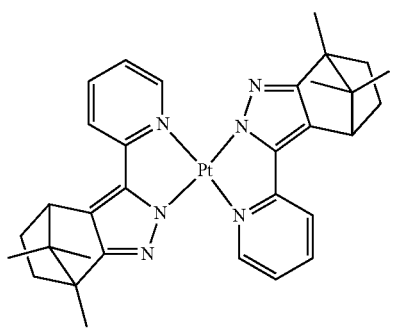
PD63 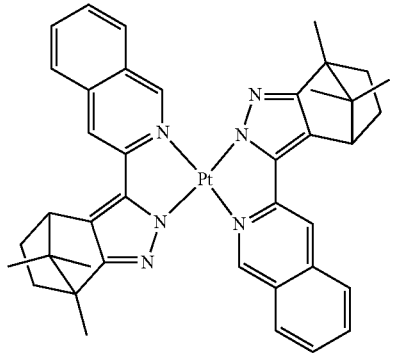
PD64 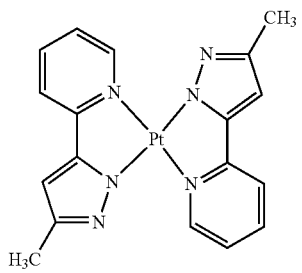
PD65 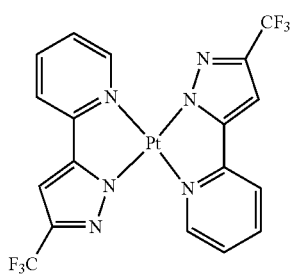
PD66 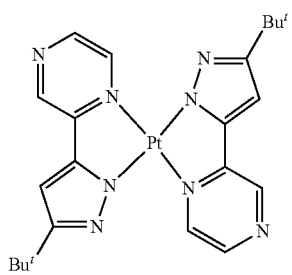
PD67 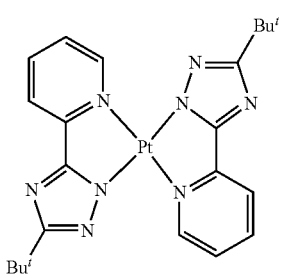
PD68 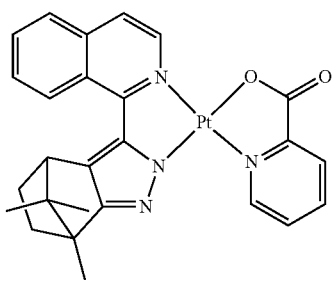
PD69 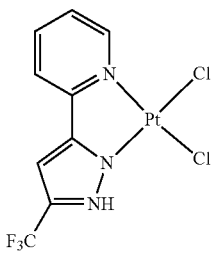
PD70 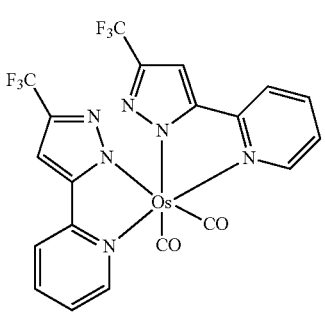
PD71 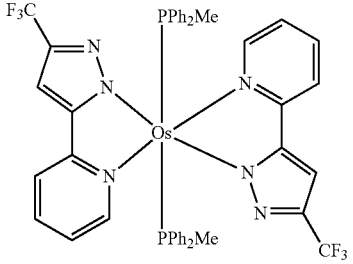

-continued
PD72
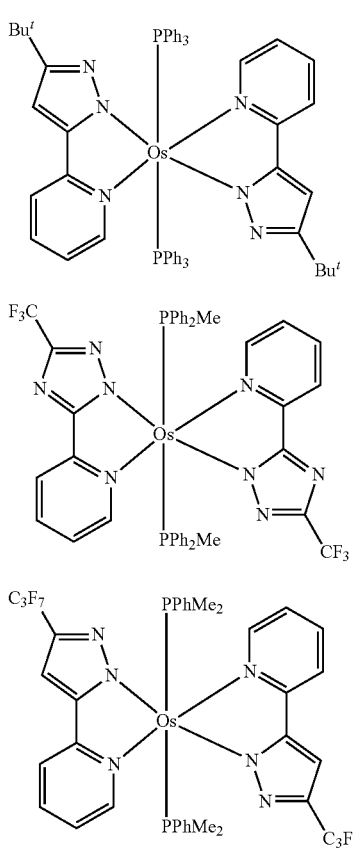
PD73
PD74
Also, the phosphorescent dopant may include PtOEP below:
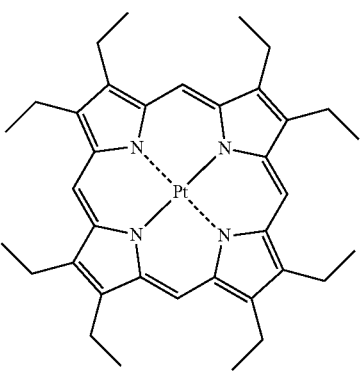
PtOEP
The fluorescent dopant may include at least one of DPAVBi, BDAVBi, TBPe, DCM, DCJTB, Coumarin 6, and C545T below:
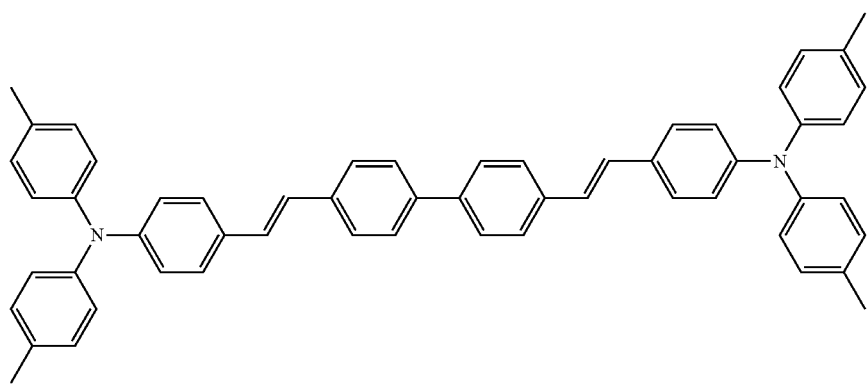
DPAVBi
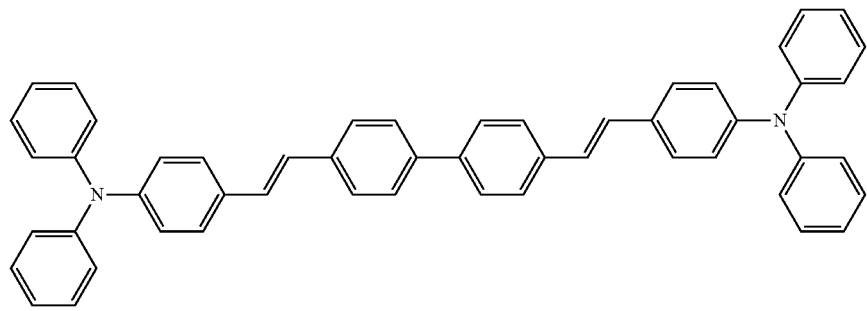
BDAVBi

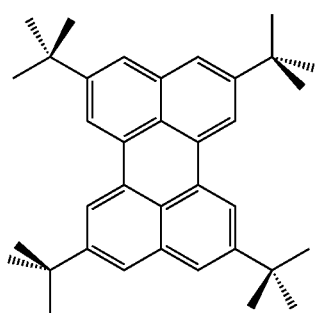
TBPe

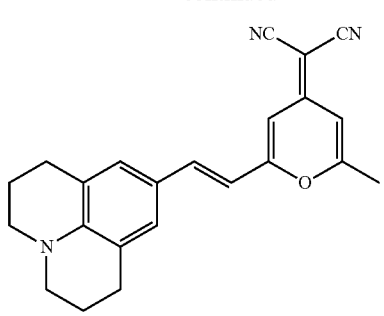
DCM

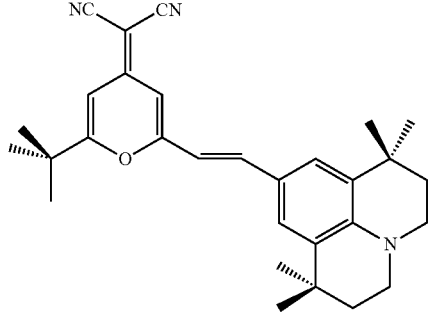
DCJTB

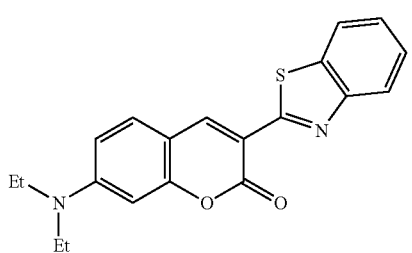
Coumarin 6

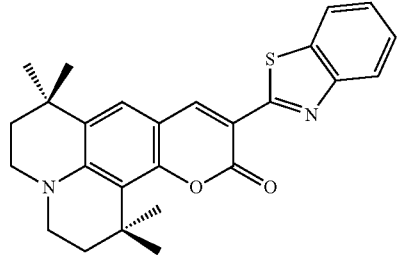
C545T

Also, the fluorescent dopant may include a compound represented by Formula 501 below:

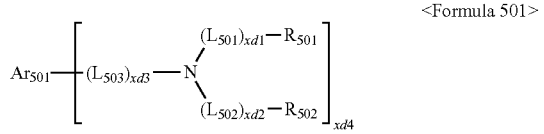
<Formula 501>

In Formula 501, $Ar_{501}$ is selected from, a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene group, a pentaphene, and an indenoanthracene;

a naphthalene, a heptalene, a fluorene, a Spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —Si($Q_{501}$)($Q_{502}$)($Q_{503}$) (here, $Q_{501}$ to $Q_{503}$ are each independently selected from a hydrogen, a $C_1$-$C_{60}$ alkyl group, a $C_2$-$C_{60}$ alkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group);

the descriptions of $L_{501}$ to $L_{503}$ are as defined in the description of $L_{201}$;

$R_{501}$ and $R_{502}$ are each independently selected from, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 are each independently selected from 0, 1, 2, and 3;

xb4 is selected from 1, 2, 3, and 4.

The fluorescent host may include at least one of Compounds FD1 to FD8:

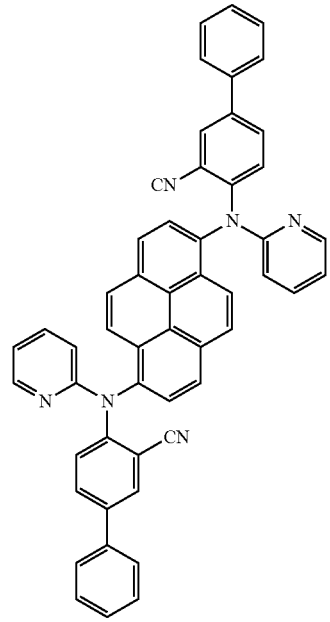

FD4

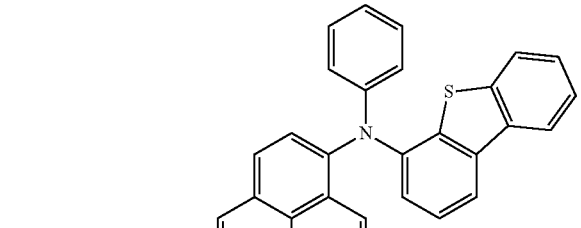

FD6

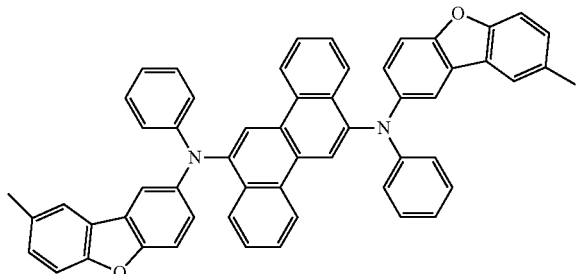

FD7

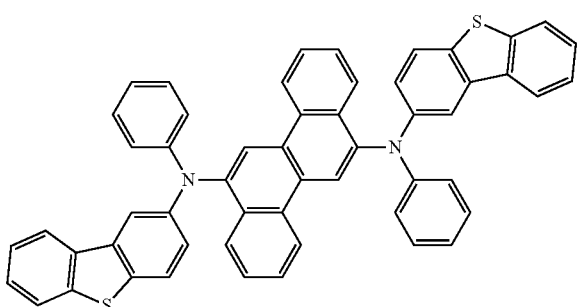

FD8

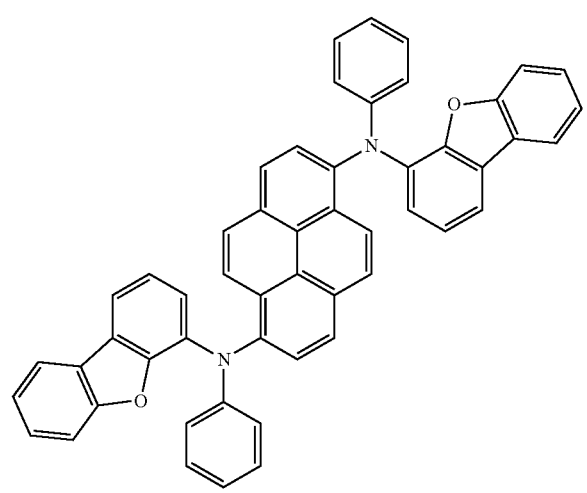

FD5

An amount of the dopant in the EML 13 may be generally within a range of about 0.01 parts to about 15 parts by weight based on about 100 parts by weight of a host, as an example.

A thickness of the EML 13 may be in a range of about 100 Å to about 1,000 Å, for example, about 200 Å to about 600 Å. When a thickness of the EML 13 is within this range, light-emitting properties may be excellent without substantial increase in driving voltage.

Next, the electron transport region 16 may be disposed on the EML 13.

The electron transport region 16 may include at least one of a HBL, an ETL, and an EIL, as examples.

For example, the electron transport region 16 may have a structure of ETL/EIL or EBL/ETL/EIL sequentially stacked on the EML 13.

The electron transport region 16 may include the HBL. The HBL may be formed to prevent triplet excitons or holes from being diffused to the ETL, when the EML 13 uses a phosphorescent dopant.

When the electron transport region 16 includes the HBL, the HBL may be formed on the EML 13 by using various methods such as vacuum deposition, spin coating, casting, LB deposition, inkjet printing, laser printing, or LITI. When the HBL is formed by as vacuum deposition and spin coating, the deposition conditions and the coating conditions of the HBL may be referred to the de deposition conditions and the coating conditions of the HIL.

The HBL may include, for example, at least one of BCP and Bphen below:

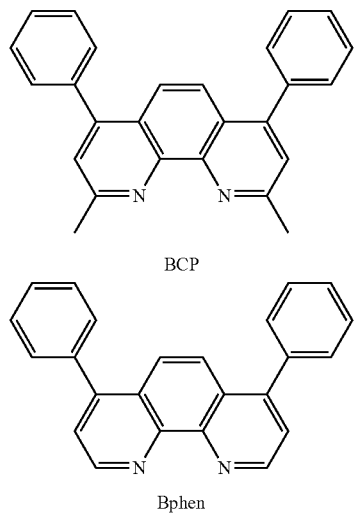

BCP

Bphen

A thickness of the HBL may be in a range of about 20 Å to about 1,000 Å, for example, about 30 Å to about 300 Å. When a thickness of the HBL is within this range, hole blocking properties may be excellent without substantial increase in driving voltage.

The electron transport region 16 may include the ETL. The ETL may be formed on the EML 13 or the HBL by using various methods such as vacuum deposition, spin coating, casting, LB deposition, inkjet printing, laser printing, or LITI. When ETL is formed by vacuum deposition and spin coating, the deposition conditions and the coating conditions of the ETL may be referred to the de deposition conditions and the coating conditions of the HIL.

The ETL may further include at least one of BCP and Bphen above and $Alq_3$, Balq, TAZ, and NTAZ below:

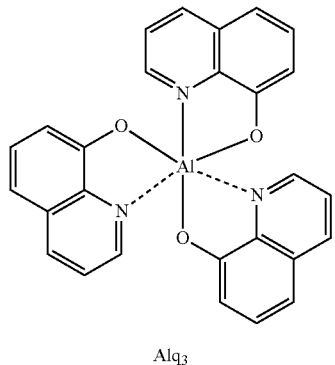

$Alq_3$

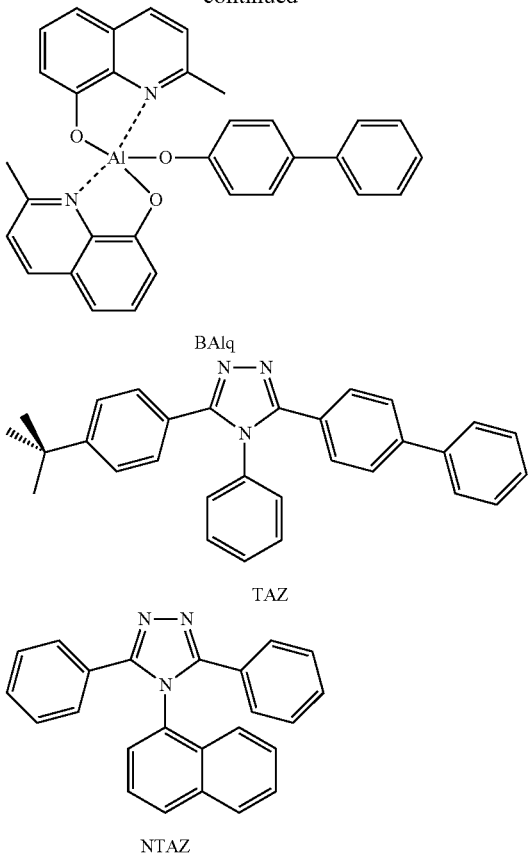

BAlq

TAZ

NTAZ

Also, the ETL may include at least one compound represented by Formula 601:

$$Ar_{601}\text{-}[(L_{601})_{xe1}\text{-}E_{601}]_{xe2}$$ <Formula 601>

In Formula 601, $Ar_{601}$ may be selected from, a naphthalene, a heptalene, a fluorene, a Spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —Si($Q_{301}$)($Q_{302}$)($Q_{303}$) (here, $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group);

the description of $L_{601}$ is as defined in the description of $L_{201}$;

$E_{601}$ may be selected from, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphtyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 is selected from 0, 1, 2, and 3;

xe2 is selected from 1, 2, 3, and 4;

Also, the ETL may include at least one of compounds represented by Formula 602 below:

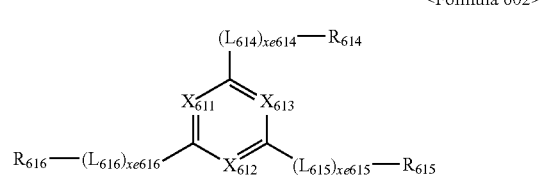

<Formula 602>

In Formula 602, $X_{611}$ is N or C-$(L_{611})_{xe611}$-$R_{611}$, $X_{612}$ is N or C-$(L_{612})_{xe612}$-$R_{612}$, $X_{613}$ is N or C-$(L_{613})_{xe613}$-$R_{613}$, and at least one of $X_{611}$ to $X_{613}$ is N;

each of descriptions of $L_{611}$ to $L_{616}$ are as defined in the description of $L_{201}$ in the present specification;

$R_{611}$ to $R_{616}$ are each independently selected from, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 are each independently selected from 0, 1, 2, and 3.

The compound represented by Formula 601 and the compound represented by Formula 602 may include at least one of Compounds ET1 to ET15:

ET1
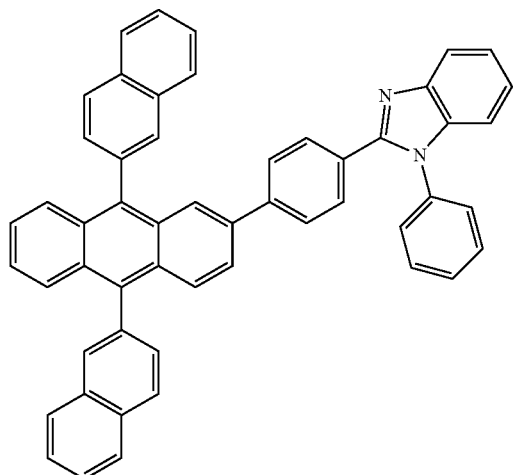
ET2
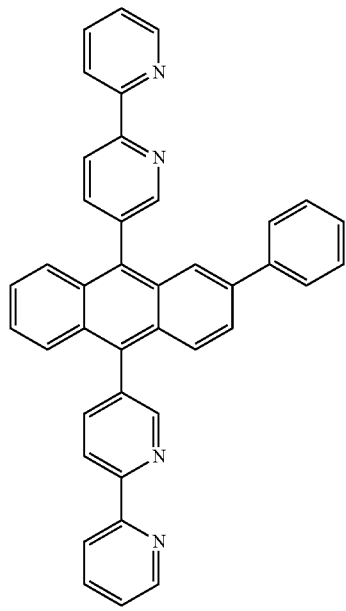
ET3
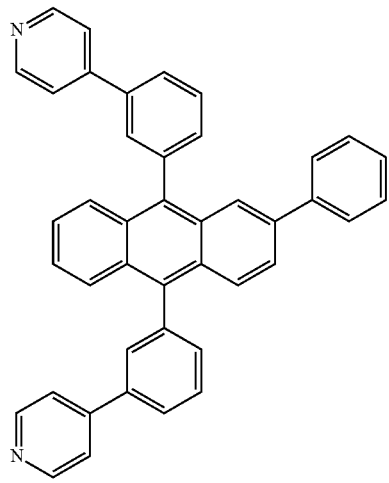
ET4
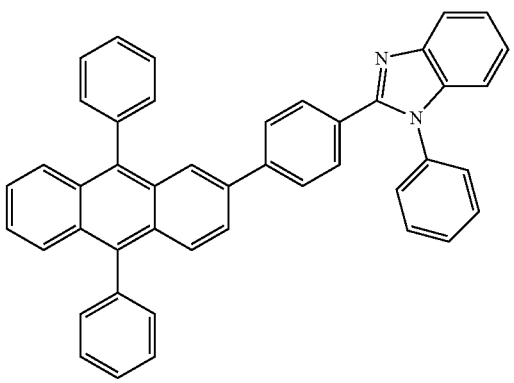
ET5
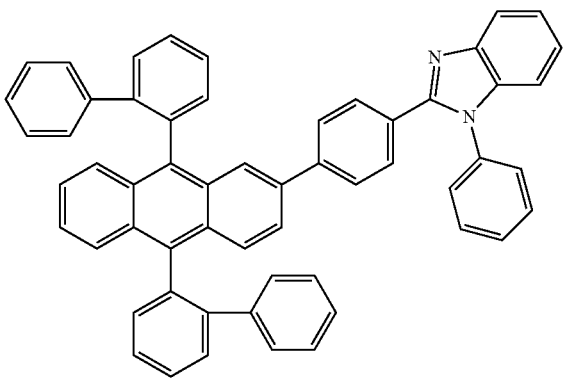
ET6
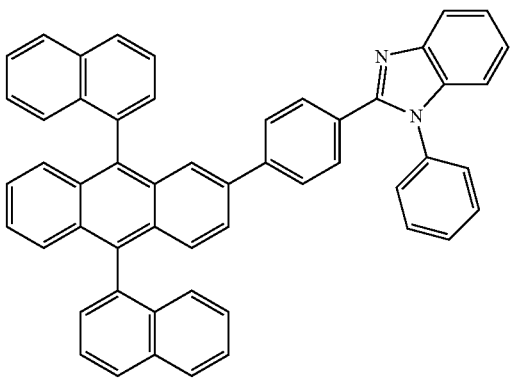

ET7
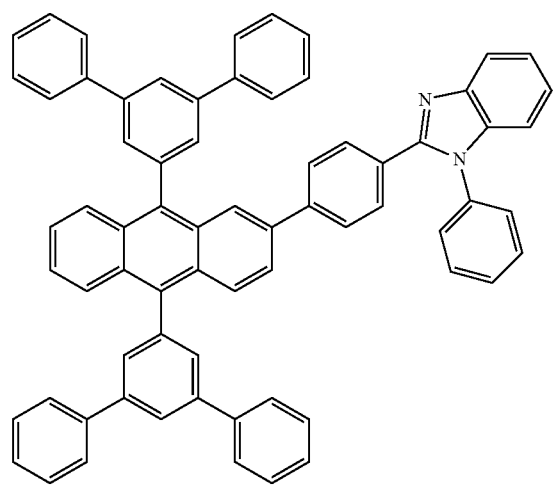
ET8
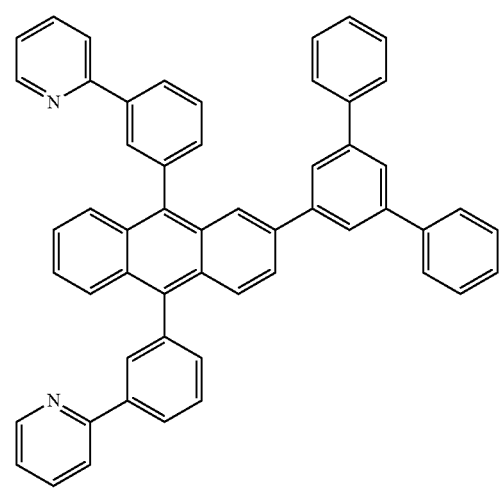
ET9
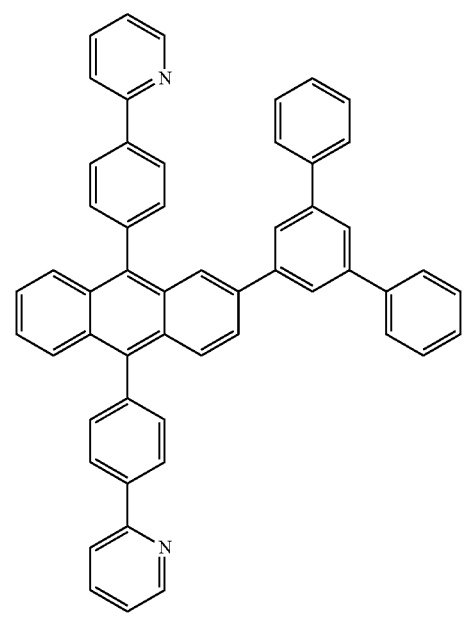
ET10
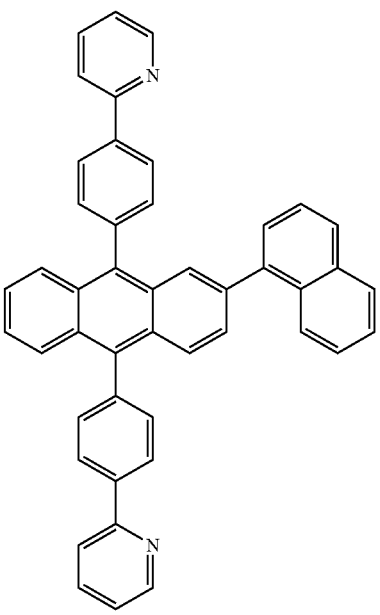
ET11
ET12
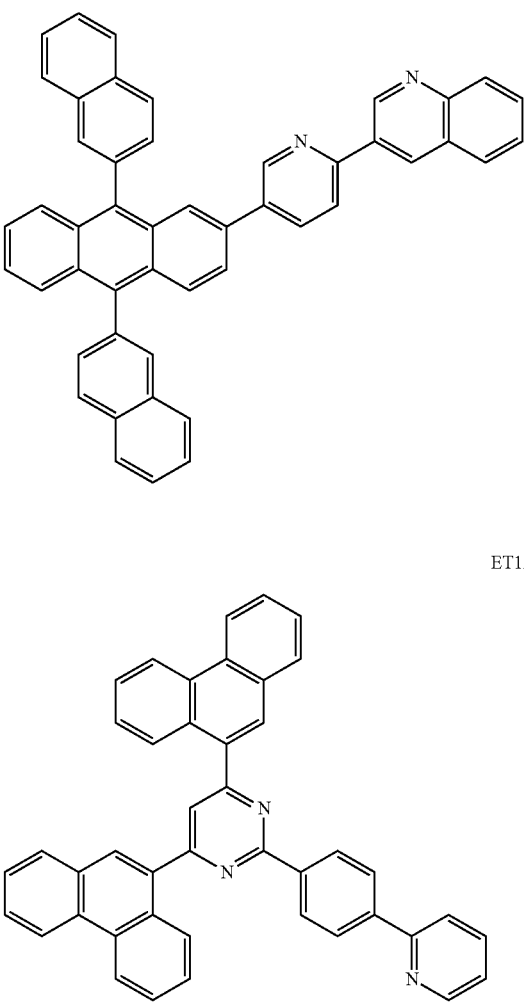

ET13

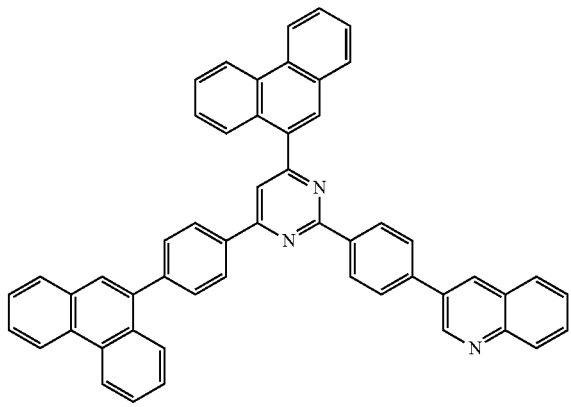

ET14

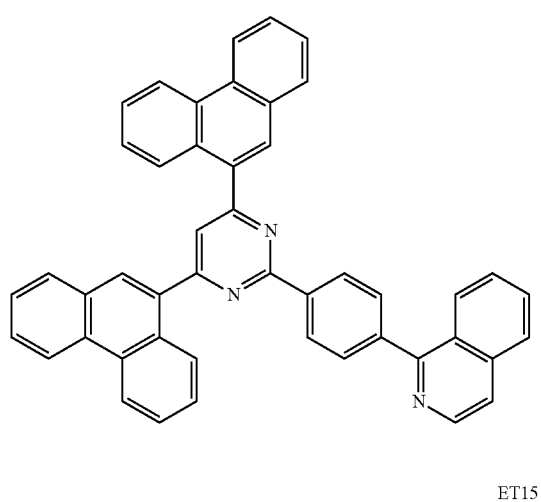

ET15

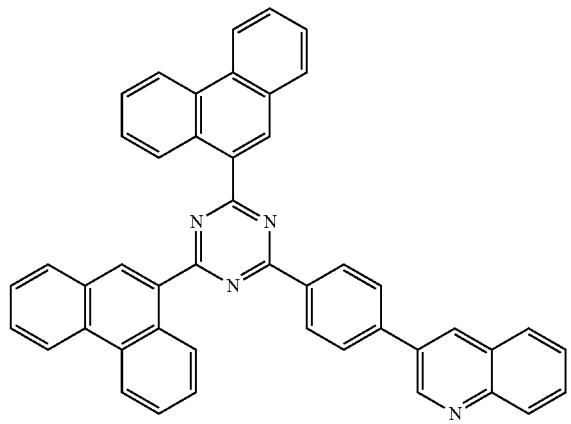

A thickness of the ETL may be in a range of about 100 Å to about 1,000 Å, for example, about 150 Å to about 500 Å. When a thickness of the ETL is within this range, electron transporting properties may be excellent without substantial increase in driving voltage.

The ETL may further include a metal-containing material in addition to the materials above.

The metal-containing material may include a Li-complex. The Li-complex may include, for example, Compound ET-D1 (lithium quinolate (LiQ)) or ET-D2:

ET-D1

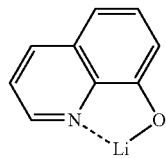

ET-D2

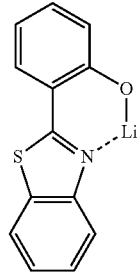

The electron transport region 16 may include the EIL that facilitates injection of electrons from the second electrode 19.

The EIL may be formed on the ETL by using various methods such as vacuum deposition, spin coating, casting, LB deposition, inkjet printing, laser printing, or LITI. When EIL is formed by vacuum deposition and spin coating, the deposition conditions and the coating conditions of the EIL may be referred to the de deposition conditions and the coating conditions of the HIL.

The EIL may include at least one selected from LiF, NaCl, CsF, $Li_2O$, BaO, and LiQ.

A thickness of the EIL may be in a range of about 1 Å to about 100 Å, for example, about 3 Å to about 90 Å. When a thickness of the EIL is within this range, electron injecting properties may be excellent without substantial increase in driving voltage.

The second electrode 19 may be disposed on the electron transport region 16. The second electrode 19 may be a cathode, which is an electron injection electrode. In this regard, a metal for forming the second electrode 19 may include a metal, an alloy, an electric conducting compound, and a mixture thereof having a low work function. The second electrode 19 may be formed as a thin film by using lithium (Li), magnesium (Mg), aluminum (Al), aluminum-lithium (Al—Li), calcium (Ca), magnesium-indium (Mg—In), or magnesium-silver (Mg—Ag). Also, ITO or IZO may be used as metal for forming the second electrode 19. The second electrode 19 may be a reflective electrode, a semi-transparent electrode, or a transparent electrode.

In some embodiments, the hole transport region 7 may include at least one of Compounds HT1 to HT20, and the interlayer 14 may include at least one of Compounds 1 to 96, as examples.

Figure 2:
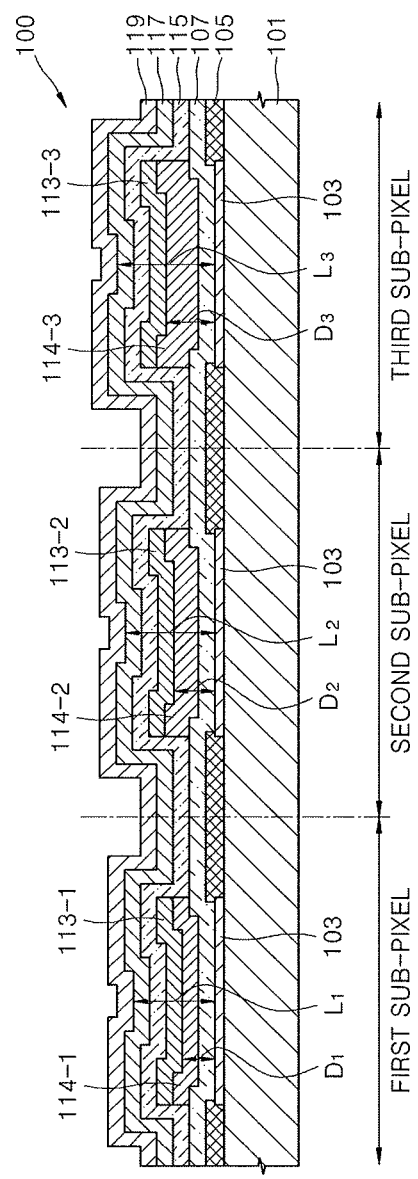
FIG. 2 illustrates a schematic view of a full-color OLED according to an embodiment.

FIG. 2 illustrates a schematic view of a full-color organic light-emitting device (OLED) 100 according to an embodiment.

A substrate 101 of the OLED 100 shown in FIG. 2 may include a first sub-pixel, a second sub-pixel, and a third pixel.

A plurality of first electrodes 103 may be patterned according to the first sub-pixel, the second sub-pixel, and the third sub-pixel. A common layer, i.e., a hole transport region 107, may be disposed on the first electrode 103.

An EML including a first EML 113-1, a second EML 113-2, and a third EML 113-3 may be formed on the hole transport region 107. The first EML 113-1 emitting blue light may be patterned to be disposed on the first sub-pixel, the second EML 113-2 emitting green light may be patterned to be disposed on the second sub-pixel, and the third EML 113-3 emitting red light may be patterned to be disposed on the third sub-pixel.

A first interlayer 114-1 pattered to be formed only on the first sub-pixel may be disposed between the first EML 113-1 and the hole transport region 107, a second interlayer 114-2 pattered to be formed only on the second sub-pixel may be disposed between the second EML 113-2 and the hole transport region 107, and a third interlayer 114-3 pattered to be formed only on the third sub-pixel may be disposed between the third EML 113-3 and the hole transport region 107.

Common layers, i.e., an ETL 115, an EIL 117, and a second electrode 119, may be sequentially disposed on the EML. The ETL 115 and the EIL 117 may serve as an electron transport region.

As used herein, the term "common layer" denotes a layer that is formed over all of the first sub-pixel, the second sub-pixel, and the third sub-pixel without being patterned according to each of the sub-pixels.

In FIG. 2, a pixel insulation layer 105 may be formed on an edge part of the plurality of first electrodes 103. The pixel insulation layer 105 may define a pixel area and may include suitable organic insulation materials (e.g., a silicon-based material), inorganic insulation materials, or organic/inorganic composite insulation materials.

In FIG. 2, descriptions of the first substrate 101, the first electrode 103, the hole transport region 107, the first EML 113-1, the second EML 113-2, the third EML 113-3, the ETL 117, and the second electrode 119 may be as defined in the descriptions regarding the OLED 10 shown in FIG. 1.

The first interlayer 114-1 may be patterned on the first sub-pixel and disposed between the first EML 113-1 and the hole transport region 107, the second interlayer 114-2 is patterned on the second sub-pixel and disposed between the second EML 113-2 and the third interlayer 114-3 is patterned on the third sub-pixel and disposed between the third EML 113-3 and the hole transport region 107.

A method of forming the first interlayer 114-1, the second interlayer 114-2, and the third interlayer 114-3 may be understood with reference to a method of forming the HIL.

The first interlayer 114-1 and the third interlayer 114-3 may each independently include an amine-based compound represented by Formula 1 or 2.

The second interlayer 114-2 does not include the amine-based compound represented by Formula 1 or 2. For example, the second interlayer 114-2 may include one of materials included in the hole transport region 7.

A material included in the first interlayer 114-1 and a material included in the hole transport region 107 are different from each other, and a material included in the third interlayer 114-3 and the material included in the hole transport region 107 are different from each other.

Materials and thickness of the first electrode 103 and the second electrode 119 may be selected so that the OLED 100 may have a resonant structure. For example, when the first electrode 103 is a reflective electrode and the second electrode 119 is a semitransparent electrode, the OLED 100 may be a top-emission type OLED having a resonance structure. Also, when the first electrode 103 is a semitransparent electrode and the second electrode 119 is a reflective electrode, the OLED 100 may be a bottom-emission type OLED having a resonance structure.

For example, when the first electrode 103 is a reflective electrode and the second electrode 119 is a semitransparent electrode, the OLED 100 may satisfy Equations 1, 2, and 3, so that first-color light, second-color light, and third-color light may resonant between the reflective first electrode 103 and the semitransparent second electrode 119:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \qquad \text{<Equation 1>}$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \qquad \text{<Equation 2>}$$

$$\frac{\lambda_3}{2n_3} \cdot m_3 - \frac{\lambda_3}{10} \leq L_3 \leq \frac{\lambda_3}{2n_3} \cdot m_3 + \frac{\lambda_3}{10} \qquad \text{<Equation 3>}$$

In Equations 1 to 3, $L_1$ is a distance between the first electrode of the first sub-pixel and the second electrode;

$L_2$ is a distance between the first electrode of the second sub-pixel and the second electrode;

$L_3$ is a distance between the first electrode of the third sub-pixel and the second electrode;

$\lambda_1$, $\lambda_2$, and $\lambda_3$ are each respectively a wavelength of blue light emitted from the first sub-pixel, a wavelength of green light emitted from the second sub-pixel, and a wavelength of red light emitted from the third sub-pixel;

$n_1$ is a refractive index of layers between the first electrode and the second electrode of the first sub-pixel;

$n_2$ is a refractive index of layers between the first electrode and the second electrode of the second sub-pixel;

$n_3$ is a refractive index of layers between the first electrode and the second electrode of the third sub-pixel;

$m_1$, $m_2$, and $m_3$ are each independently a natural number.

When the OLED 100 satisfies Equations 1, 2, and 3, blue light emitted from the first sub-pixel, green light emitted from the second sub-pixel, and red light emitted from the third sub-pixel may be emitted extracted to the outside of the OLED 100 passing through the second electrode 119 by constructive interference while resonancing between the first electrode 103 and the second electrode 119, and thus efficiency of the OLED 100 may improve.

In Equations 1, 2, and 3, $m_1$, $m_2$, and $m_3$ may be 1.

In Equations 1, 2, and 3, when $m_1$, $m_2$, and $m_3$ are each independently 1, a distance ($D_3$) between the first electrode 103 of the third sub-pixel and the third EML 113-3 may be in a range of about 400 Å to about 1000 Å, for example, about 500 Å to about 900 Å, a distance ($D_2$) between the first electrode 103 of the second sub-pixel and the second EML 113-2 may be in a range of about 300 Å to about 900 Å, for example, about 400 Å to about 800 Å, and a distance ($D_1$) between the first electrode 103 of the first sub-pixel and the first EML 113-1 may be in a range of about 200 Å to about 800 Å, for example, about 300 Å to about 700 Å.

Also, in Equations 1, 2, and 3, $m_1$, $m_2$, and $m_3$ may be 2.

In Equations 1, 2, and 3, when $m_1$, $m_2$, and $m_3$ are each independently 2, a distance ($D_3$) between the first electrode 103 of the third sub-pixel and the third EML 113-3 may be in a range of about 1,600 Å to about 2,300 Å, for example, about 1,700 Å to about 2100 Å, a distance ($D_2$) between the first electrode 103 of the second sub-pixel and the second EML 113-2 may be in a range of about 1,300 Å to about 2,000 Å, for example, about 1,400 Å to about 1,900 Å, and a distance ($D_1$) between the first electrode 103 of the first sub-pixel and the first EML 113-1 may be in a range of about 900 Å to about 1,800 Å, for example, about 1,000 Å to about 1,600 Å.

When $D_1$, $D_2$, and $D_3$ are within these ranges above, optimum constructive interference may occur during vibration of each of the colors. In addition, an OLED emits light as exitons radiate, but the exiton radiation may be considered as an electric dipole radiation. A weak microcavity phenomenon is a phenomenon where a damping rate of a dipole changes due to an image dipole induced by a reflector when dipole radiation is located at a distance below or equal to a wavelength of light to be emitted to the reflector, thereby changing strength of radiation. In this regard, when the distances $D_1$, $D_2$, and $D_3$ are within ranges above, light emitting efficiencies of blue light emitted from the first sub-pixel, green light emitted from the second sub-pixel, and red light emitted from the third sub-pixel may improve by the weak microcavity effect.

$D_1$, $D_2$, and $D_3$ may have a relationship of $D_3 > D_2 = D_1$.

In some embodiments, the hole transport region 107 may includes at least one of Compounds HT1 to HT20, and at least one of the first interlayer 114-1 and the third interlayer 114-3 may include at least one of Compounds 1 to 96, as examples.

The full-color OLED has been described by referring to FIG. 2, as an example. In other implementations, the first emission layer 113-1 may be extended to areas of the second sub-pixel and the third sub-pixel and may be formed as a common layer. Also, the second interlayer 114-2 of the second sub-pixel may be omitted. However, the full-color OLED may have various forms, for example, including one of the first interlayer 114-1 and the third interlayer 114-3 shown in FIG. 2.

The OLED 100 may be included in a flat display device including a thin film transistor. The thin film transistor may include a gate electrode, a source electrode, a drain electrode, a gate insulation layer, and an active layer, and one of the source' and drain electrodes may be electrically contacted to the first electrode 103 of the OLED 100. The active layer may include crystalline silicon, amorphous silicon, an organic semiconductor, an oxide semiconductor, as examples.

As used herein, examples of the $C_1$-$C_{60}$ alkyl group include a monovalent linear or branched aliphatic hydrocarbon group having 1 to 60 carbon atoms, such as a methyl group, an ethyl group, a propyl group, an isobutyl group, a sec-butyl group, a pentyl group, an isoamyl group, a hexyl group, and the like. The term "substituted $C_1$-$C_{60}$ alkylene group" refers to a divalent group that has the same structure as the $C_1$-$C_{60}$ alkyl group.

As used herein, the term "$C_1$-$C_{60}$ alkoxy group" denotes a monovalent group having a formula of —$OA_{101}$ (here, $A_{101}$ is the $C_1$-$C_{60}$ alkyl group). Examples of the $C_1$-$C_{60}$ alkoxy group include a methoxy group, an ethoxy group, and an isopropyloxy group.

As used herein, the term "$C_2$-$C_{60}$ alkenyl group" refers to a structure including at least one carbon double bond in the middle or at an end of the $C_2$-$C_{60}$ alkyl group. Examples of the $C_2$-$C_{60}$ alkenyl group include an ethenyl group, a propenyl group, and a butenyl group. As used herein, the term "$C_2$-$C_{60}$ alkenylene group" denotes a divalent group that has the same structure as the $C_2$-$C_{60}$ alkenyl group.

As used herein, the $C_2$-$C_{60}$ alkynyl group has a structure including at least one carbon triple bond in the middle or at an end of the $C_2$-$C_{60}$ alkyl group. Examples of the $C_2$-$C_{60}$ alkynyl group include an ethynyl group and a propynyl group. As used herein, the term "$C_2$-$C_{60}$ alkynylene group" denotes a divalent group that has the same structure as the $C_2$-$C_{60}$ alkynyl group.

As used herein, the term "$C_3$-$C_{10}$ cycloalkyl group" denotes a $C_3$-$C_{60}$ monovalent hydrocarbon monocyclic group. Examples of the $C_3$-$C_{10}$ cycloalkyl group include a cyclopropyl group, a cyclobutyl group, a cyclopentyl group, a cyclohexyl group, and a cycloheptyl group. As used herein, the term "$C_3$-$C_{10}$ cycloalkylene group" denotes a divalent group that has the same structure as the $C_3$-$C_{10}$ cycloalkyl group.

As used herein, the term "$C_3$-$C_{10}$ heterocycloalkyl group" denotes a $C_3$-$C_{10}$ monovalent monocyclic group including at least one hetero atom of N, O, P, and S as a ring-forming atom. Examples of the $C_3$-$C_{10}$ heterocycloalkyl group include a tetrahydrofuranyl group and a tetrahydrothiophenyl group. As used herein, the term "$C_3$-$C_{10}$ heterocycloalkylene group" denotes a divalent group that has the same structure as the $C_3$-$C_{10}$ heterocycloalkyl group.

As used herein, the term "$C_3$-$C_{10}$ cycloalkenyl group" denotes a $C_3$-$C_{10}$ monocyclic group having at least one double bond in the ring while not losing its aromacity. Examples of the $C_3$-$C_{10}$ cycloalkenyl group include a cyclopentyl group, a cyclohexenyl group, and a cycloheptenyl group. As used herein, the term "$C_3$-$C_{10}$ cycloalkenylene group" denotes a divalent group that has the same structure as the $C_3$-$C_{10}$ cycloalkenyl group.

As used herein, the term "$C_3$-$C_{10}$ heterocycloalkenyl group" denotes a $C_3$-$C_{10}$ monovalent monocyclic group including at least one hetero atom of N, O, P, and S as a ring-forming atom and at least one double bond in the ring. Examples of the $C_3$-$C_{10}$ heterocycloalkenyl group include a 2,3-hydrofuranyl group and a 2,3-hydrothiophenyl group. As used herein, the term "$C_3$-$C_{10}$ heterocycloalkenylene group" denotes a divalent group that has the same structure as the $C_3$-$C_{10}$ heterocycloalkenyl group.

As used herein, the term "$C_6$-$C_{60}$ aryl group" denotes a monovalent group having a $C_6$-$C_{60}$ carbocyclic aromatic system, and the term "$C_6$-$C_{60}$ arylene group" denotes a divalent group that has a $C_6$-$C_{60}$ carbocyclic aromatic system. Examples of the $C_6$-$C_{60}$ aryl group include a phenyl group, a naphthyl group, an anthracenyl group, a phenanthrenyl group, a pyrenyl group, and a chrysenyl group. As used herein, when the $C_6$-$C_{60}$ aryl group and the $C_6$-$C_{60}$ arylene group include at least two rings, the rings may be fused to each other.

As used herein, the term "$C_2$-$C_{60}$ heteroaryl group" denotes a monovalent group including at least one hetero atom selected from N, O, P, and S as a ring-forming atom and having a $C_2$-$C_{60}$ carbocyclic aromatic system. The term "$C_1$-$C_{60}$ heteroarylene group" denotes a divalent group including at least one hetero atom selected from N, O, P, and S as a ring-forming atom and having a $C_2$-$C_{60}$ carbocyclic aromatic system. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and a $C_2$-$C_{60}$ heteroarylene group include at least two rings, the rings may be fused to each other.

As used herein, the term "$C_6$-$C_{60}$ aryloxy group" denotes —$OA_{102}$ (here, $A_{102}$ is the $C_6$-$C_{60}$ aryl group), and the term "$C_6$-$C_{60}$ arylthio group" denotes —$SA_{103}$ (here, $A_{103}$ is the $C_6$-$C_{60}$ aryl group).

As used herein, the term "monovalent non-aromatic condensed polycyclic group" denotes a monovalent group having at least two rings that are condensed to each other, including only carbon as a ring-forming atom (e.g., the number of the included carbon atoms may be 8 to 60), and having non-aromaticity as a whole molecule. Examples of the non-aromatic condensed polycyclic group include a fluorenyl group. As used herein, the term "divalent non-aromatic condensed polycyclic group" denotes a divalent group that has the same structure as the monovalent non-aromatic condensed polycyclic group.

As used herein, the term: monovalent non-aromatic heterocondensed polycyclic group" denotes a monovalent group having at least two rings that are condensed to each other, including a heteroatom selected from N, O, P, and S in addition to carbon as a ring-forming atom (e.g., the number of the included carbon atoms included may be 2 to 60), and having non-aromaticity as a whole molecule. Examples of the non-aromatic condensed polycyclic group include a carbazolyl group. As used herein, the term "divalent non-aromatic heterocondensed polycyclic group" denotes a divalent group that has the same structure as the monovalent non-aromatic heterocondensed polycyclic group.

As used herein, at least one substituent of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and substituted monovalent non-aromatic heterocondensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, —N($Q_{11}$)($Q_{12}$), —Si($Q_{13}$)($Q_{14}$)($Q_{15}$), and —B($Q_{16}$)($Q_{17}$);

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one of a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

$Q_1$ to $Q_7$, $Q_{11}$ to $Q_{17}$, $Q_{21}$ to $Q_{27}$, and $Q_{31}$ to $Q_{37}$ are, each independently, selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphtyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, isoa benzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group.

An OLED according to one or more embodiments will now be described in greater detail with reference to the following examples. However, these examples are for illustrative purpose only and are not intended to limit the scope of embodiments.

EXAMPLE

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Subs 2(1) to 2(6) that Belong to Sub 2

Subs 2(1) to 2(6), i.e. compounds that belong to Sub 2, were synthesized according to Reaction Scheme 1:

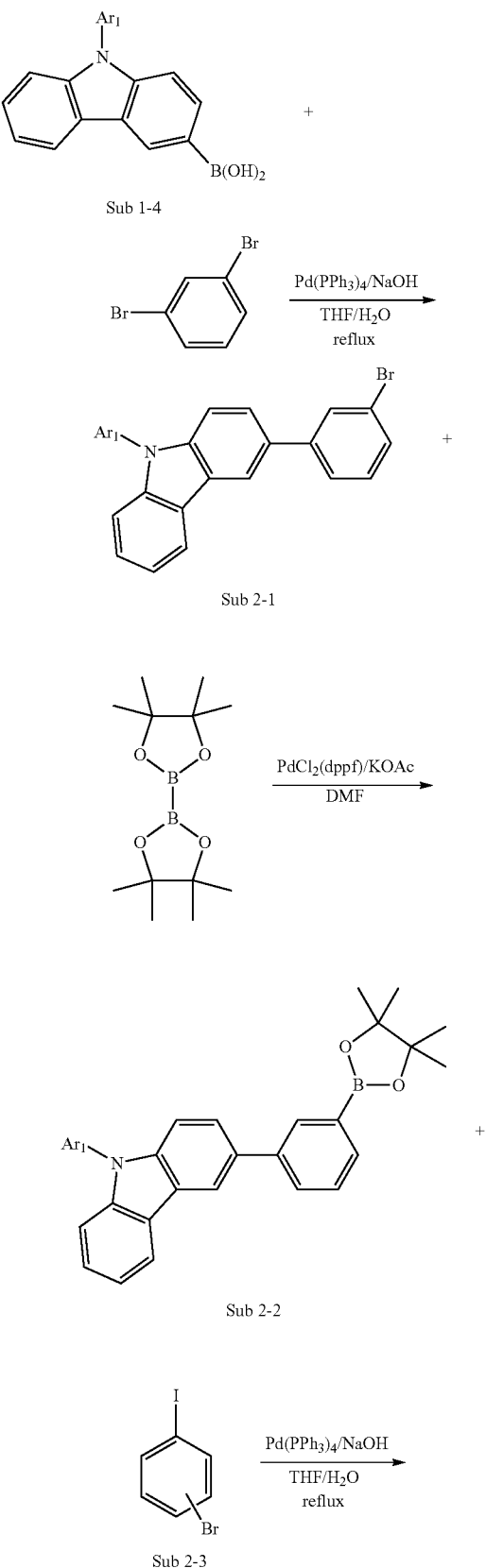

<Reaction Scheme 1>

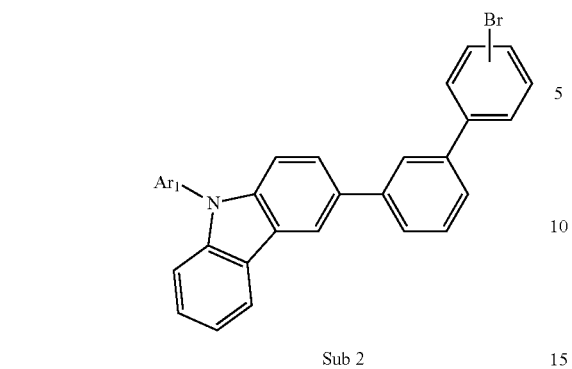

Sub 2

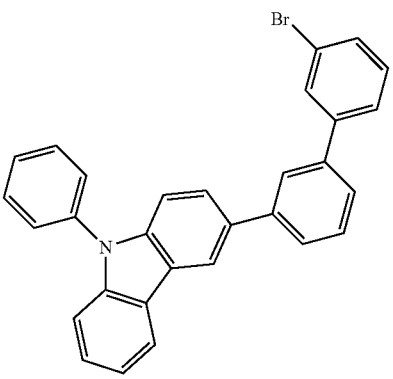

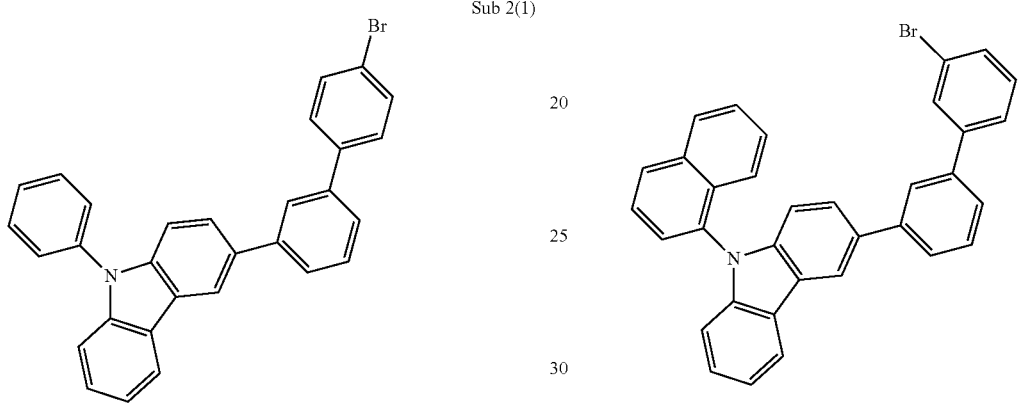

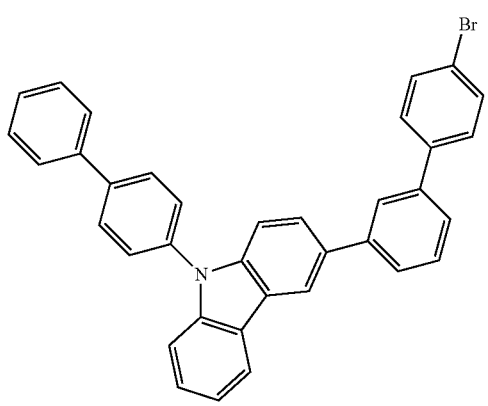

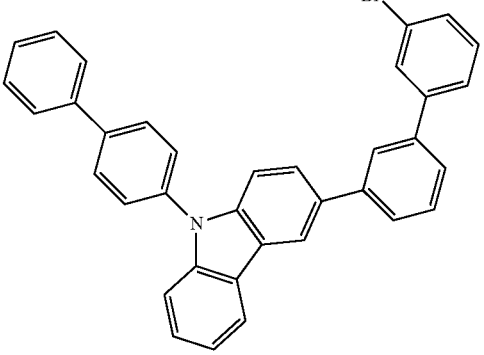

When synthesizing Subs 2(1) to Sub 2(6), $Ar_1$ and Sub 2-3 in Reaction Scheme 1 were as shown in Table 1:

TABLE 1

| | Reaction Scheme 1 | |
|---|---|---|
| Compound | $Ar_1$ | Sub 2-3 |
| Sub 2(1) | phenyl group | 1-bromo-4-iodobenzene group |
| Sub 2(2) | 1-naphthyl group | 1-bromo-4-iodobenzene group |
| Sub 2(3) | biphenyl group | 1-bromo-4-iodobenzene group |
| Sub 2(4) | phenyl group | 1-bromo-3-iodobenzene group |
| Sub 2(5) | 1-naphthyl group | 1-bromo-3-iodobenzene group |
| Sub 2(6) | biphenyl group | 1-bromo-3-iodobenzene group |

Synthesis of Sub 1-2

1 equivalent of a carbazole group and 1.1 equivalent of Sub 1-1 were added to toluene, and then 0.05 equivalent of $Pd_2(dba)_3$, 0.1 equivalent of $PPh_3$, and 3 equivalents of NaOt-Bu were each added thereto. Then, the mixture was refluxed with stirring at 100° C. for 24 hours and extracted with ether and water to obtain an organic layer. The resultant organic layer was dried and concentrated with MgSO$_4$, and then silica gel column chromatography and recrystallization were performed on the resultant to obtain Sub 1-2.

Synthesis of Sub 1-3

1 equivalent of Sub 1-2 was dissolved in methylenechloride, and 1.1 equivalent of N-bromosuccimide NBS was slowly added thereto and stirred at room temperature for 24 hours. When the reaction was completed, HCl at a concentration of 5% and water were added to remove remaining NBS and extracted with ether and water to obtain an organic layer. The resultant organic layer was dried and concentrated with MgSO$_4$, and then silica gel column chromatography and recrystallization were performed on the organic produced to obtain Sub 1-3.

Synthesis of Sub 1-4

1 equivalent of Sub 1-3 was dissolved in anhydrous ether, a temperature of the reacting solution was lowered to −78° C., 1.1 equivalent of n-BuLi (2.5M in hexane) was slowly added thereto, and the mixture was stirred for 30 minutes. Then, a temperature of the mixture was lowered again to −78° C., and 1.5 equivalent of Triisopropylborate was dropwisely added thereto. The mixture was then stirred at room temperature, water was added to dilute the mixture, and then 2N HCl was added. When the reaction was completed, an organic layer extracted therefrom with ethyl acetate and water was dried and concentrated with MgSO$_4$, and then silica gel column chromatography and recrystallization were performed on the organic produced to obtain Sub 1-4.

Synthesis of Sub 2-1

1 equivalent of Sub 1-4 was dissolved in THF, and then 1.1 equivalent of 1,3-dibromobenzene, 0.03 equivalent of Pd(PPh$_3$)$_4$, 3 equivalents of NaOH, and water were added thereto and refluxed while stirring. When the reaction was completed, an organic layer extracted therefrom with ether and water was dried and concentrated with MgSO$_4$, and then silica gel column chromatography and recrystallization were performed on the organic produced to obtain Sub 2-1.

Synthesis of Sub 2-2

1 equivalent of Sub 2-1 was dissolved in DMF, and then 1.1 equivalent of bis(pinacolato)diboron, 0.03 equivalent of PdCl$_2$(dppf), and 3 equivalents of KOAc were sequentially added thereto and stirred for 24 hours to synthesize a borate compound. Then, silica gel column chromatography and recrystallization were performed on the compound to obtain Sub 2-2.

Synthesis of Sub 2

1 equivalent of Sub 2-2 was dissolved in THF, and then 1.1 equivalent of Sub 2-3, 0.03 equivalent of Pd(PPh$_3$)$_4$, 3 equivalents of NaOH, and water were sequentially added thereto and refluxed while stirring. Then, when the reaction was completed, an organic layer extracted therefrom with ether and water was dried and concentrated with MgSO$_4$, and then silica gel column chromatography and recrystallization were performed on the organic produced to obtain Sub 2.

MS data of Subs 2(1) to 2(6) that belong to Sub 2 are as shown in Table 2:

TABLE 2

| Compound | FD-MS | Compound | FD-MS |
|---|---|---|---|
| Sub 2(1) | m/z = 473.08(C$_{30}$H$_{20}$BrN = 474.39) | Sub 2(2) | m/z = 523.09(C$_{34}$H$_{22}$BrN = 524.45) |
| Sub 2(3) | m/z = 549.11(C$_{36}$H$_{24}$BrN = 550.49) | Sub 2(4) | m/z = 473.08(C$_{30}$H$_{20}$BrN = 474.39) |
| Sub 2(5) | m/z = 523.09(C$_{34}$H$_{22}$BrN = 524.45) | Sub 2(6) | m/z = 549.11(C$_{36}$H$_{24}$BrN = 550.49) |

Synthesis of Subs 3(1) to 3(24) that belong to Sub 3

Subs 3(1) to 3(24) that belong to Sub 3 may be each synthesized according to Reaction Scheme 2:

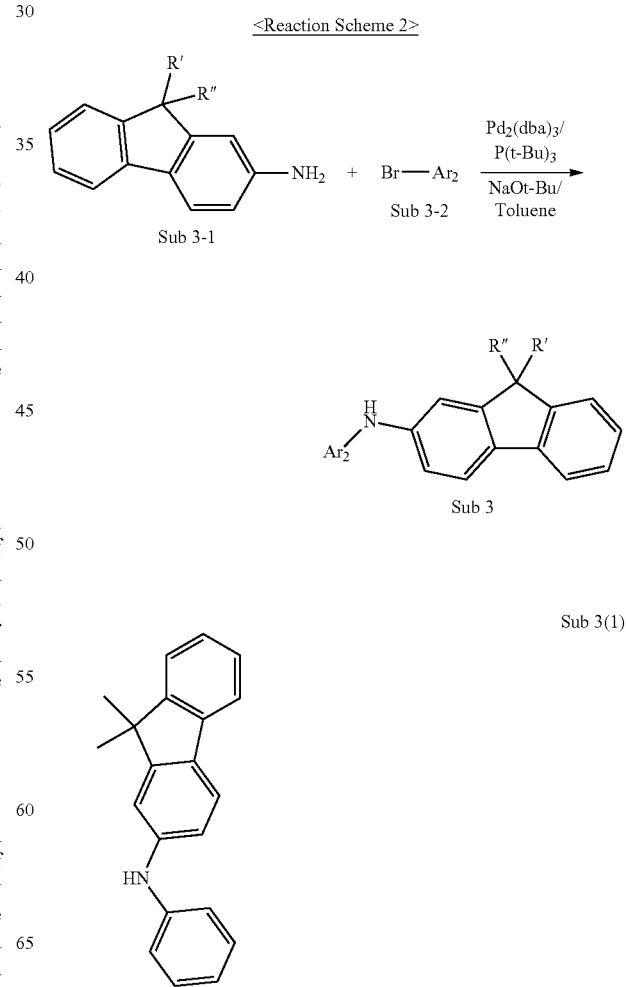

Sub 3(2)
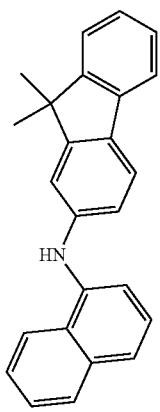
Sub 3(3)
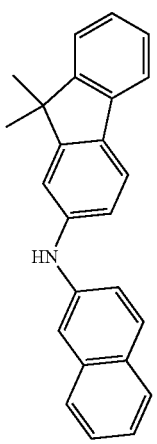
Sub 3(4)
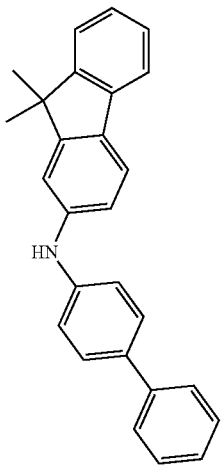
Sub 3(5)
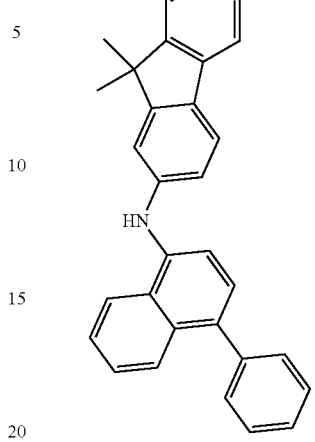
Sub 3(6)
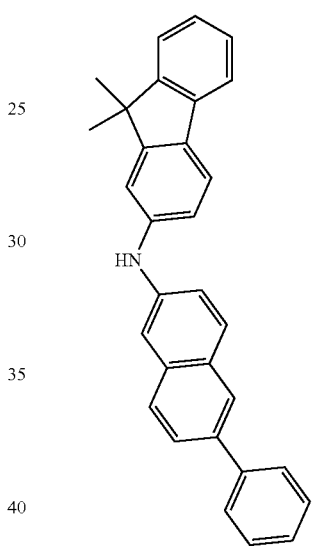
Sub 3(7)
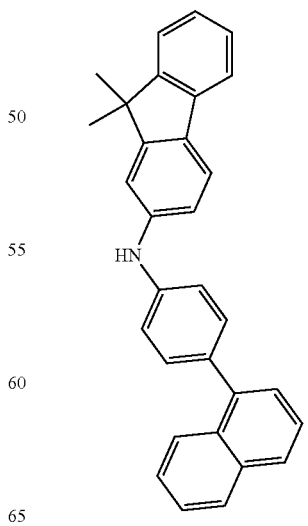

Sub 3(8)
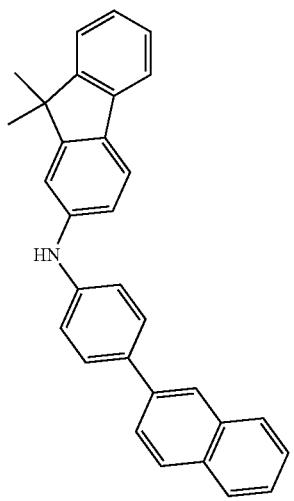
Sub 3(9)
Sub 3(10)
Sub 3(11)
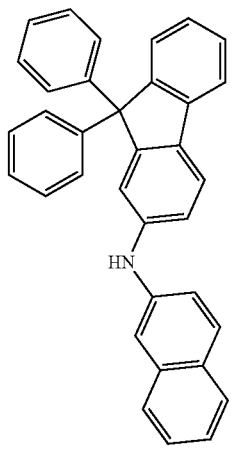
Sub 3(12)
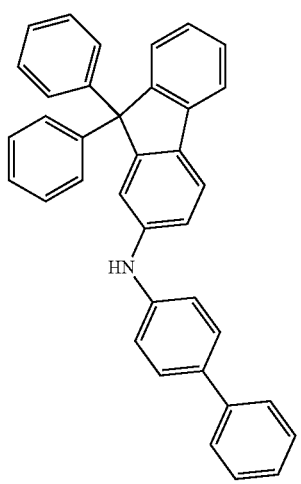
Sub 3(13)
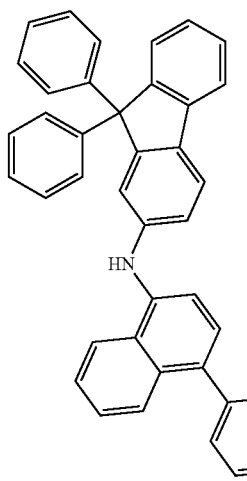

Sub 3(14)
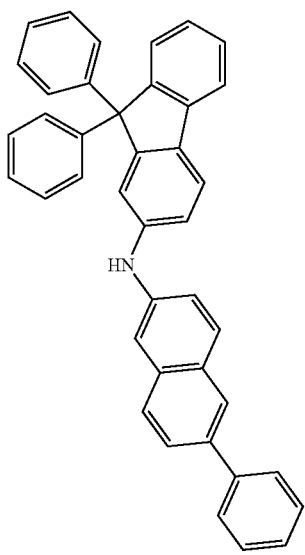
Sub 3(17)
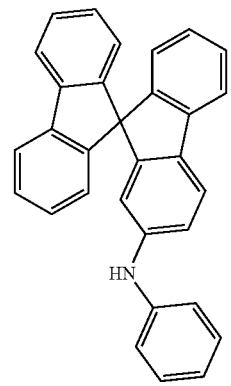
Sub 3(15)
Sub 3(18)
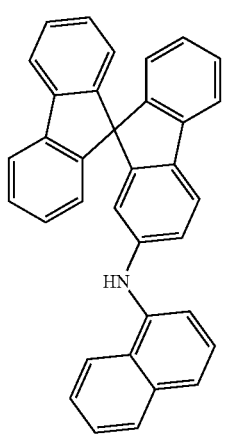
Sub 3(16)
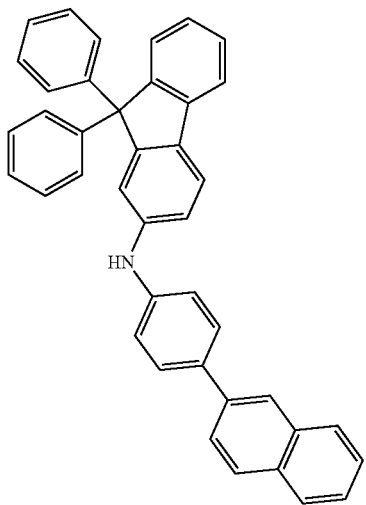
Sub 3(19)
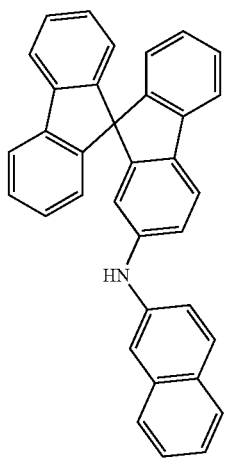

Sub 3(20)
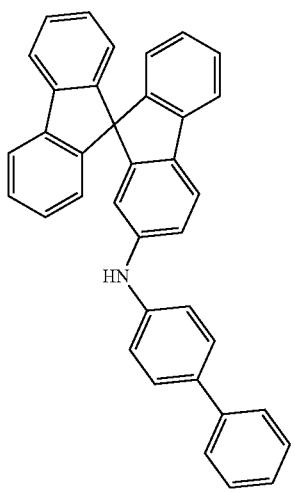
Sub 3(21)
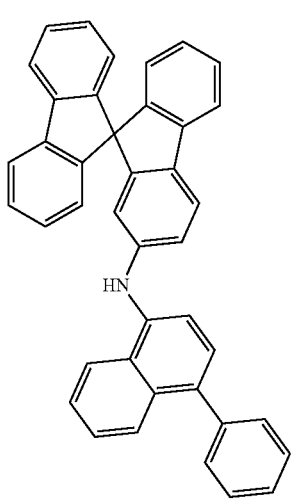
Sub 3(22)
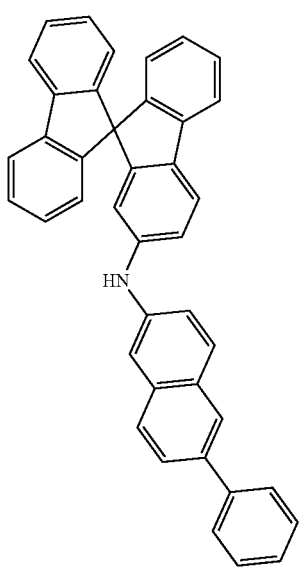
Sub 3(23)
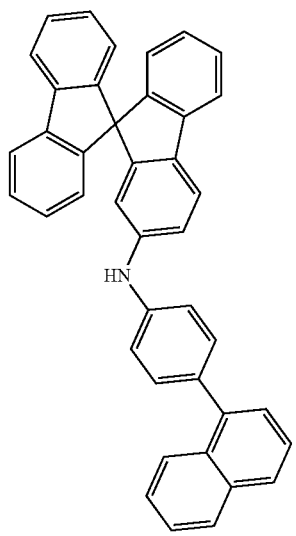
Sub 3(24)
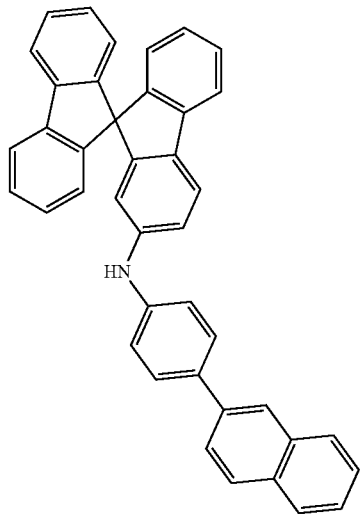
When synthesizing Sub 3(1) to Sub 3(24), Sub 3-1 and Ar$_2$ in Reaction Scheme 2 are as in Table 3:

TABLE 3
| Compound | Reaction Scheme 2 | |
|---|---|---|
| | Ar₂ | Sub 3-1 |
| Sub 3(1) | phenyl group | 9,9-dimethyl-9H-fluorene group-2-amine |
| Sub 3(2) | 1-naphthyl group | |
| Sub 3(3) | 2-naphthyl group | |
| Sub 3(4) | 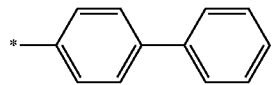 [SMILES: *c1ccc(-c2ccccc2)cc1] | |
| Sub 3(5) | 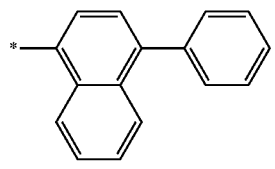 | |
| Sub 3(6) | 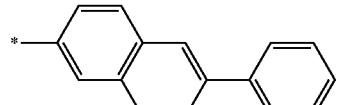 | |
| Sub 3(7) | 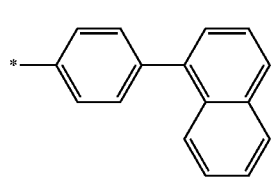 [SMILES: *c1ccc(-c2cccc3ccccc23)cc1] | |
| Sub 3(8) | 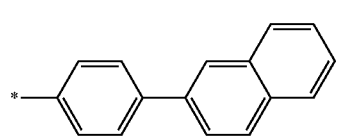 [SMILES: *c1ccc(-c2ccc3ccccc3c2)cc1] | |
| Sub 3(9) | phenyl group | 9,9-diphenyl group-9H-fluorene group-2-amine |
| Sub 3(10) | 1-naphthyl group | |
| Sub 3(11) | 2-naphthyl group | |
| Sub 3(12) | 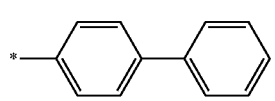 | |
| Sub 3(13) | 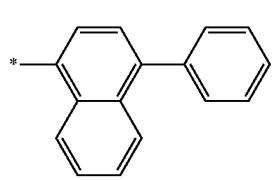 [SMILES: *c1ccc(-c2ccccc2)c2ccccc12] | |
| Sub 3(14) | 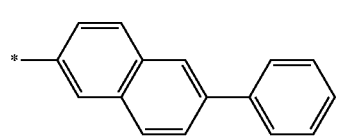 [SMILES: *c1ccc2cc(-c3ccccc3)ccc2c1] | |
| Sub 3(15) | 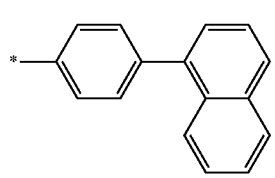 | |

TABLE 3-continued

Reaction Scheme 2

| Compound | Ar₂ | Sub 3-1 |
|---|---|---|
| Sub 3(16) | *—C₆H₄—(2-naphthyl) | |
| Sub 3(17) | phenyl group | spiro-fluorene-NH₂ |
| Sub 3(18) | 1-naphthyl group | |
| Sub 3(19) | 2-naphthyl group | |
| Sub 3(20) | *—biphenyl | |
| Sub 3(21) | *—(1-phenyl-naphthalen-4-yl) | |
| Sub 3(22) | *—(6-phenyl-naphthalen-2-yl) | |
| Sub 3(23) | *—C₆H₄—(1-naphthyl) | |
| Sub 3(24) | *—C₆H₄—(2-naphthyl) | |

1 equivalent of Sub 3-1, 1.1 equivalent of Sub 3-2, 0.05 equivalent of Pd₂(dba)₃, 0.1 equivalent of P(t-Bu)₃, 3 equivalents of NaOt-Bu, and 10.5 mL of toluene/1 mmol a starting material, were added to a round-bottom flask and reacted at a temperature of 100° C. When the reaction was completed, an organic layer extracted therefrom with ether and water was dried and concentrated with MgSO₄, and then silica gel column chromatography and recrystallization were performed on the organic produced to obtain Sub 3.

MS data of Subs 3(1) to 3(24) that belong to Sub 3 are as shown in Table 4:

TABLE 4

| Compound | FD-MS | Compound | FD-MS |
|---|---|---|---|
| Sub 3(1) | m/z = 285.15($C_{21}H_{19}N$ = 285.38) | Sub 3(2) | m/z = 335.17($C_{25}H_{21}N$ = 335.44) |
| Sub 3(3) | m/z = 335.17($C_{25}H_{21}N$ = 335.44) | Sub 3(4) | m/z = 361.18($C_{27}H_{28}N$ = 361.48) |
| Sub 3(5) | m/z = 411.20($C_{31}H_{25}N$ = 411.54) | Sub 3(6) | m/z = 411.20($C_{31}H_{25}N$ = 411.54) |
| Sub 3(7) | m/z = 411.20($C_{31}H_{25}N$ = 411.54) | Sub 3(8) | m/z = 411.20($C_{31}H_{25}N$ = 411.54) |
| Sub 3(9) | m/z = 409.18($C_{31}H_{23}N$ = 409.52) | Sub 3(10) | m/z = 459.20($C_{35}H_{25}N$ = 459.58) |
| Sub 3(11) | m/z = 459.20($C_{35}H_{25}N$ = 459.58) | Sub 3(12) | m/z = 485.21($C_{37}H_{27}N$ = 485.62) |
| Sub 3(13) | m/z = 535.23($C_{41}H_{29}N$ = 535.68) | Sub 3(14) | m/z = 535.23($C_{41}H_{29}N$ = 535.68) |
| Sub 3(15) | m/z = 535.23($C_{41}H_{29}N$ = 535.68) | Sub 3(16) | m/z = 535.23($C_{41}H_{29}N$ = 535.68) |
| Sub 3(17) | m/z = 407.17($C_{31}H_{21}N$ = 407.51) | Sub 3(18) | m/z = 457.18($C_{35}H_{23}N$ = 457.56) |
| Sub 3(19) | m/z = 457.18($C_{35}H_{23}N$ = 457.56) | Sub 3(20) | m/z = 483.20($C_{37}H_{25}N$ = 483.60) |
| Sub 3(21) | m/z = 533.21($C_{41}H_{27}N$ = 533.66) | Sub 3(22) | m/z = 533.21($C_{41}H_{27}N$ = 533.66) |
| Sub 3(23) | m/z = 533.21($C_{41}H_{27}N$ = 533.66) | Sub 3(24) | m/z = 533.21($C_{41}H_{27}N$ = 533.66) |

Synthesis Example 1

Synthesis of Compound 2

1 equivalent of Sub 3(12), and 1.1 equivalent of Sub 2(1), 0.05 equivalent of $Pd_2(dba)_3$, 0.1 equivalent of $P(t-Bu)_3$, 3 equivalents of NaOt-Bu, and 10.5 mL of toluene/1 mmol a starting material, were added to a round-bottom flask and reacted at a temperature of 100° C. When the reaction was completed, an organic layer extracted therefrom with ether and water was dried and concentrated with $MgSO_4$, and then silica gel column chromatography and recrystallization were performed on the organic produced to obtain Compound 2. The synthesized compound was confirmed by MS/FAB and $^1$H NMR.

m/z=878.37 ($C_{67}H_{46}N_2$=879.10)

$^1$H NMR (CDCl$_3$, 400 MHz) δ(ppm) 7.13-7.23 (m, 15H), 7.30-7.75 (m, 28H), 7.92 (s, 1H), 8.22 (d, J=7.7 Hz, 1H), 8.43 (d, J=1.3 Hz, 1H)

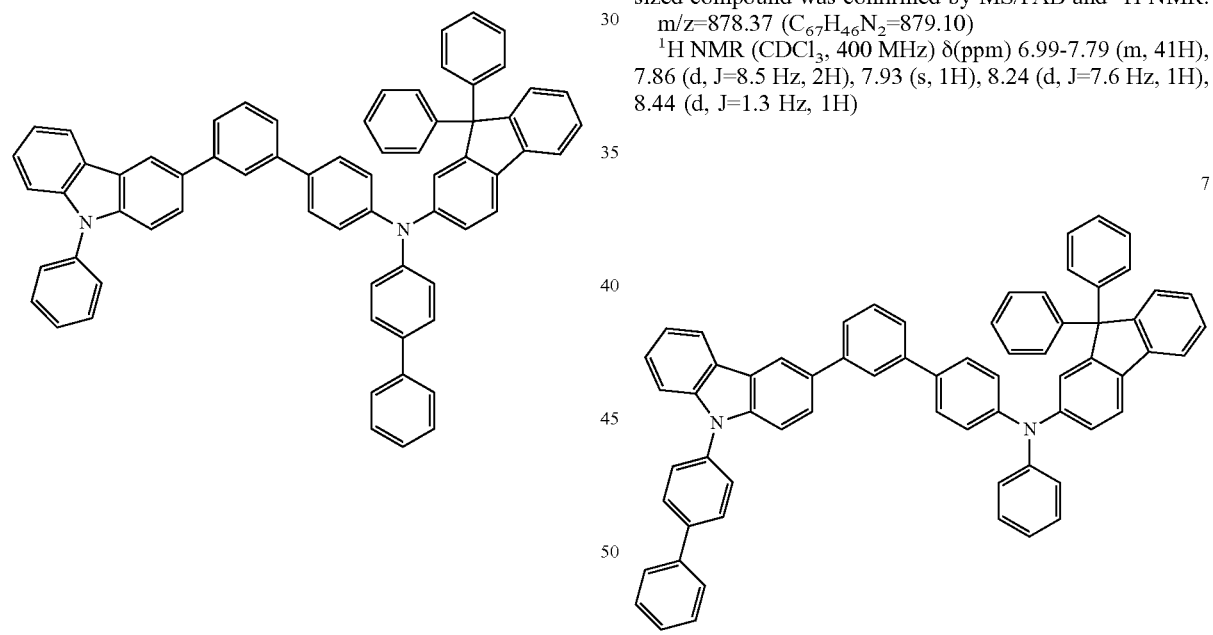

Synthesis Example 2

Synthesis of Compound 8

Compound 8 was synthesized in the same manner used in Synthesis Example 1, except that Sub 2(3) was used instead of Sub 2(1). The synthesized compound was confirmed by MS/FAB and $^1$H NMR.

m/z=954.40 ($C_{73}H_{50}N_2$=955.19)

$^1$H NMR (CDCl$_3$, 400 MHz) δ(ppm) 7.12-7.79 (m, 45H), 7.86 (d, J=8.5 Hz, 2H), 7.94 (s, 1H), 8.24 (d, J=7.6 Hz, 1H), 8.45 (d, J=1.4 Hz, 1H)

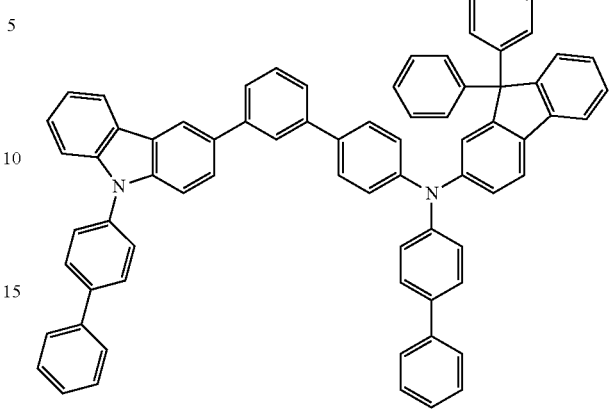

Synthesis Example 3

Synthesis of Compound 7

Compound 7 was synthesized in the same manner used in Synthesis Example 1, except that Sub 3(9) and Sub 2(3) were used instead of Sub 3(12) and Sub 2(1). The synthesized compound was confirmed by MS/FAB and $^1$H NMR.

m/z=878.37 ($C_{67}H_{46}N_2$=879.10)

$^1$H NMR (CDCl$_3$, 400 MHz) δ(ppm) 6.99-7.79 (m, 41H), 7.86 (d, J=8.5 Hz, 2H), 7.93 (s, 1H), 8.24 (d, J=7.6 Hz, 1H), 8.44 (d, J=1.3 Hz, 1H)

Synthesis Example 4

Synthesis of Compound 26

Compound 26 was synthesized in the same manner used in Synthesis Example 1, except that Sub 3(4) was used instead of Sub 3(12). The synthesized compound was confirmed by MS/FAB and $^1$H NMR.

m/z=754.33 ($C_{57}H_{42}N_2$=754.96)

$^1$H NMR (CDCl$_3$, 400 MHz) δ(ppm) 1.45 (s, 6H), 7.15 (brs, 2H), 7.27-7.34 (m, 8H), 7.39-7.74 (m, 23H), 7.94 (s, 1H), 8.21 (d, J=7.7 Hz, 1H), 8.42 (d, J=1.6 Hz, 1H)

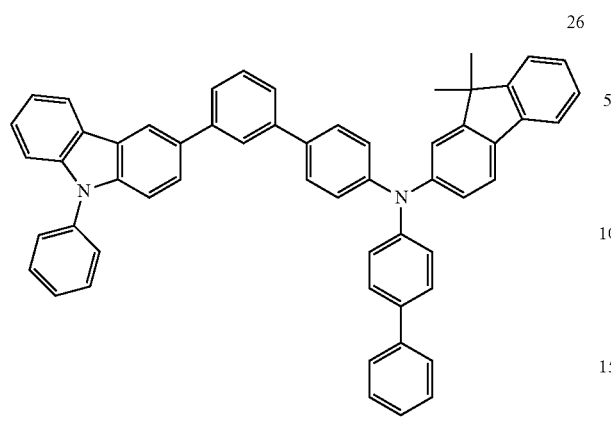

Synthesis Example 5

Synthesis of Compound 32

Compound 32 was synthesized in the same manner used in Synthesis Example 1, except that Sub 3(4) and Sub 2(3) were used instead of Sub 3(12) and Sub 2(1). The synthesized compound was confirmed by MS/FAB and ¹H NMR.

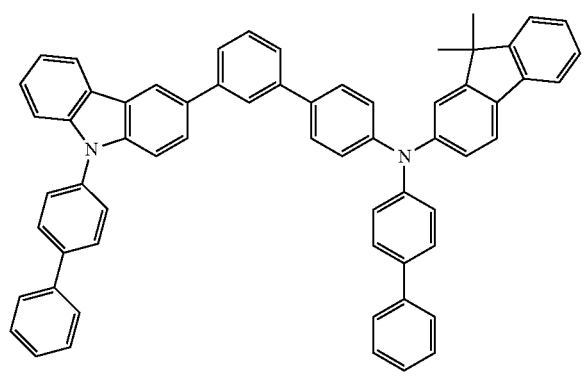

Synthesis Example 6

Synthesis of Compound 55

Compound 55 was synthesized in the same manner used in Synthesis Example 1, except that Sub 3(9) and Sub 2(6) were used instead of Sub 3(12) and Sub 2(1). The synthesized compound was confirmed by MS/FAB and ¹H NMR.

m/z=878.37 ($C_{67}H_{46}N_2$=879.10)

¹H NMR (CDCl$_3$, 400 MHz) δ(ppm) 6.97-7.75 (m, 41H), 7.80-7.87 (m, 3H), 8.18 (d, J=7.6 Hz, 1H), 8.36 (d, J=1.2 Hz, 1H)

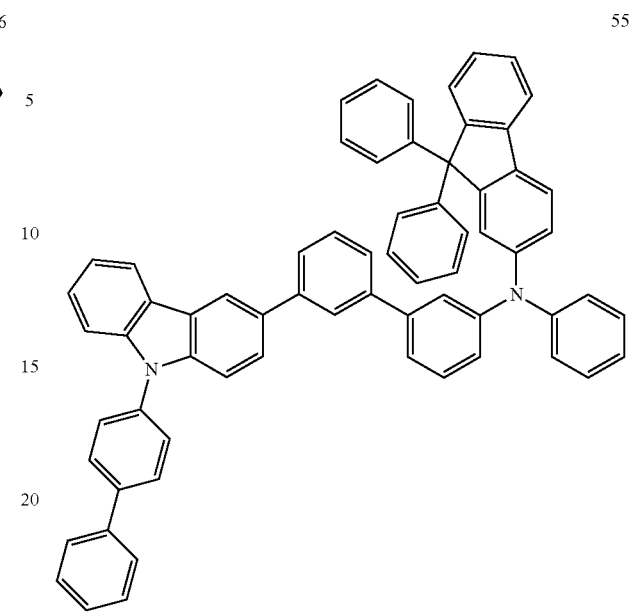

Synthesis Example 7

Synthesis of Compound 50

Compound 50 was synthesized in the same manner used in Synthesis Example 1, except that Sub 2(4) was used instead of Sub 2(1). The synthesized compound was confirmed by MS/FAB and ¹H NMR.

m/z=878.37 ($C_{67}H_{46}N_2$=879.10)

¹H NMR (CDCl$_3$, 400 MHz) δ(ppm) 7.06-7.76 (m, 43H), 7.84 (s, 1H), 8.18 (d, J=7.7 Hz, 1H), 8.38 (d, J=1.6 Hz, 1H)

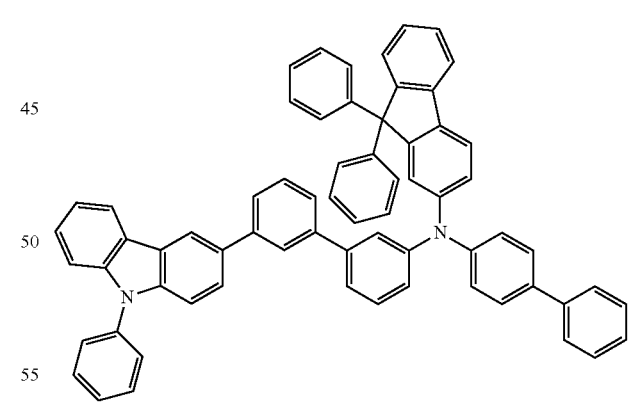

Synthesis Example 8

Synthesis of Compound 14

Compound 14 was synthesized in the same manner used in Synthesis Example 1, except that Sub 2(2) was used instead of Sub 2(1). The synthesized compound was confirmed by MS/FAB and ¹H NMR.

m/z=928.38 ($C_{71}H_{48}N_2$=929.15)

$^1$H NMR (CDCl$_3$, 400 MHz) δ(ppm) 7.01-7.24 (m, 16H), 7.27-7.79 (m, 27H), 7.92 (s, 1H), 8.02-8.10 (m, 2H), 8.25-8.29 (m, 1H), 8.48 (d, J=1.2 Hz, 1H)

14

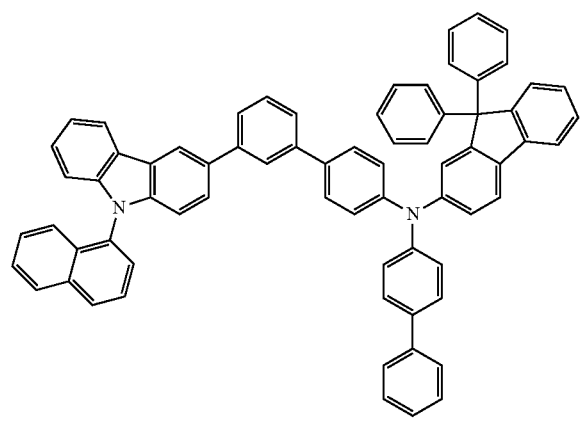

Synthesis Example 9

Synthesis of Compound 5

Compound 5 was synthesized in the same manner used in Synthesis Example 1, except that Sub 3(10) was used instead of Sub 3(12). The synthesized compound was confirmed by MS/FAB and $^1$H NMR.

m/z=852.35 (C$_{65}$H$_{44}$N$_2$=853.06)

$^1$H NMR (CDCl$_3$, 400 MHz) δ(ppm) 6.98 (dd, J=8.3, 2.1 Hz, 1H), 7.04 (d, J=8.6 Hz, 2H), 7.09-7.22 (m, 11H), 7.27-7.38 (m, 6H), 7.42-7.66 (m, 17H), 7.70 (dd, J=8.5, 1.7 Hz, 1H), 7.78 (d, J=8.3 Hz, 1H), 7.87-7.91 (m, 3H), 8.19 (d, J=7.7 Hz, 1H), 8.39 (d, J=1.6 Hz, 1H)

5

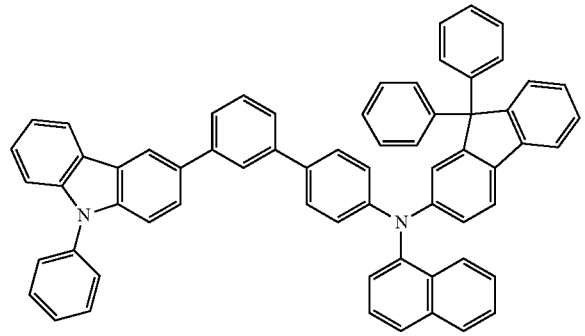

The amine-based compound represented by Formula 1 or 2 according to an embodiment may be synthesized by referring to the compounds of Subs 2(1) to 2(6), Subs 3(1) to 3(24), and Synthesis Examples 1 to 9.

Example 1

A Corning 15 Ω/cm$^2$ ITO glass substrate at a thickness of 1,200 Å, as an anode, was cut to a size of 50 mm×50 mm×0.7 mm, washed with ultrasonic waves in isopropyl alcohol and pure water for 5 minutes each, and then cleaned with UV and ozone for 30 minutes. The ITO glass substrate was mounted on a vacuum depositor.

Compound HT3 and Compound HT-D1 were co-deposited on the ITO layer at a weight ratio of 99:1 to form a HIL with a thickness of 100 Å, and Compound HT3 was deposited on the HIL to form a HTL with a thickness of 1300 Å, thereby completing preparation of a hole transport region.

Compound 26 was deposited on the hole transport region to form an interlayer with a thickness of 50 Å.

9,10-dinaphthalene-2-yl-anthracene (AND, as a host) and DPAVBi (as a dopant) were co-deposited on the interlayer at a weight ratio of 97:3 to form a blue EML with a thickness of 200 Å.

Then, Alq$_3$ was co-deposited on the blue EML to form an ETL with a thickness of 360 Å, LiF was deposited on the ETL to form an EIL with a thickness of 5 Å, and Al was deposited on the EIL to form a second electrode (a cathode) having a thickness of 1000 Å, thereby completing manufacture of OLED 1.

HT3

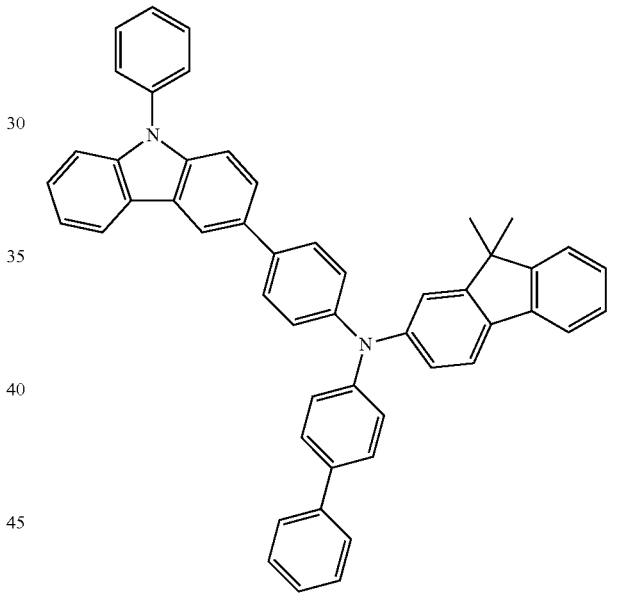

26

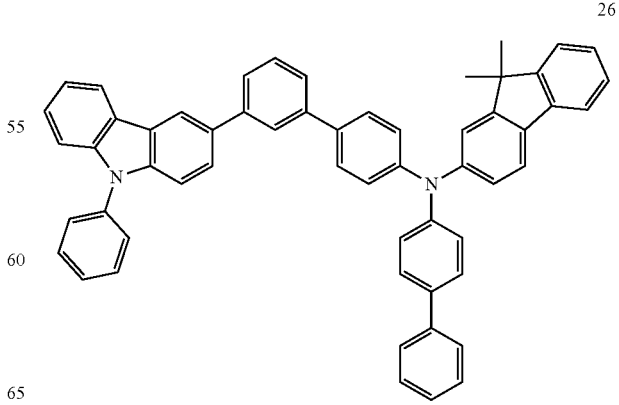

<Compound HT-D1>

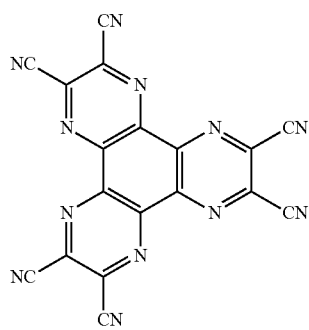

Example 2

OLED 2 was manufactured in the same manner used in Example 1, except that a thickness of the interlayer was changed to 100 Å.

Example 3

OLED 3 was manufactured in the same manner used in Example 1, except that Compound 32 was used instead of Compound 26 in the formation of the interlayer.

32

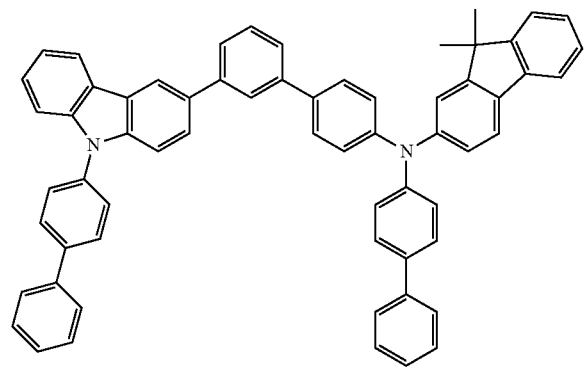

Example 4

OLED 3 was manufactured in the same manner used in Example 3, except that a thickness of the interlayer was changed to 100 Å.

Evaluation Example 1

Driving voltage, current density, luminance, efficiency, output, color coordinates, and lifespan ($T_{97}$) data of OLEDs 1 to 4 prepared in Examples 1 to 4 were evaluated by using an I-V-L Measurement Unit. (Keithley 238, PhotoResearch), and the results are shown in Table 5 and FIG. 3 (time-luminance data). The $T_{97}$ data (at 760 nit) is a time measured for a luminance of the device to decrease to 97% from the initial luminance 100% after start performing the device.

TABLE 5

|  | Driving voltage (V) | Current density (mA/cm$^2$) | Efficiency (Cd/A) | Output (lm/W) | CIE_x | CIE_y | Cd/A/y | $T_{97}$ (@760 nit) |
|---|---|---|---|---|---|---|---|---|
| OLED 1 | 4.2 | 12.2 | 5.0 | 3.7 | 0.144 | 0.047 | 106.8 | 86 |
| OLED 2 | 4.0 | 10.5 | 5.3 | 4.2 | 0.145 | 0.043 | 123.6 | 151 |
| OLED 3 | 4.2 | 12.0 | 5.0 | 3.8 | 0.144 | 0.046 | 108.9 | 100 |
| OLED 4 | 3.9 | 9.9 | 5.6 | 4.5 | 0.145 | 0.042 | 132.0 | 100 |

Figure 3:
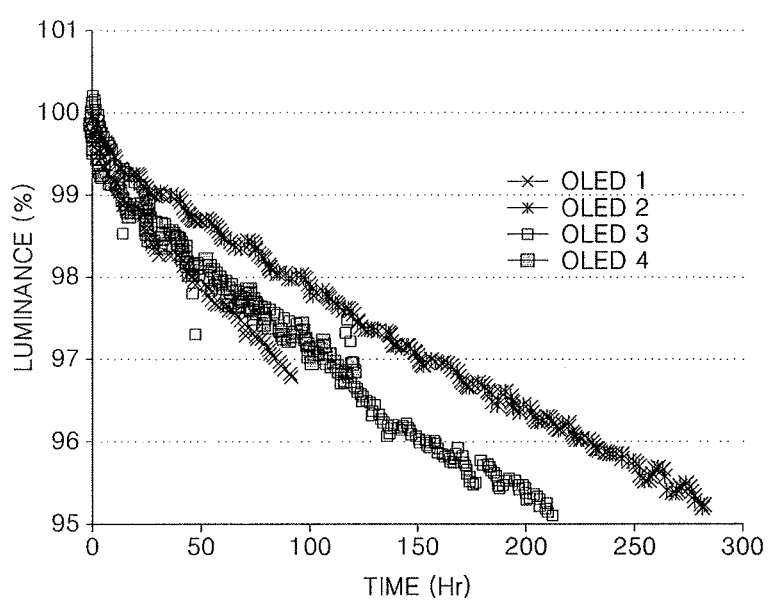
FIG. 3 illustrates a time-luminance graph of OLEDs 1 to 4 prepared in Examples 1 to 4.

According to Table 5 and FIG. 3, it may be confirmed that OLEDs 1 to 4 prepared in Examples 1 to 5 have excellent driving voltage, current density, luminance, efficiency, output, color coordinates, and lifespan data.

Evaluation Example 2

HOD 1, i.e., a hole-only device, was manufactured in the same manner used in Example 1 to manufacture OLED 1, except that Al was deposited on an EML to form a second electrode (a cathode) having a thickness of 1,000 Å instead of forming an ETL and an EIL on the EML.

HOD 2 was manufactured in the same manner used to manufacture HOD 1, except that Compound 32 was used instead of Compound 26 in the formation of an interlayer.

A voltage-current density data of HOD 1 and HOD 2 were evaluated by using an I-V-L Measurement Unit. (Keithley 238, PhotoResearch), and the results are shown in FIG. 4.

Figure 4:
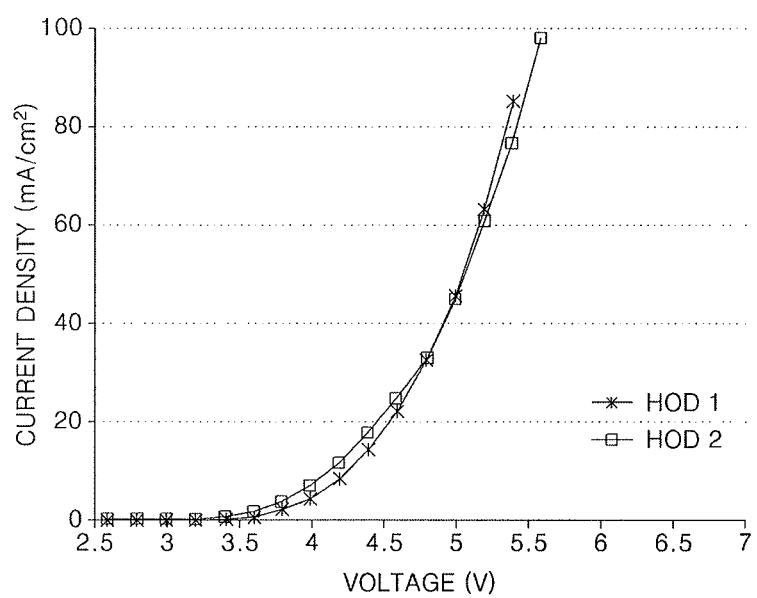
FIG. 4 illustrates a voltage-current density graph of HOD 1 and HOD 2 prepared in Evaluation Example 2.

Referring to FIG. 4, it was confirmed that electron leakage current may be prevented as hole injection into the EML increases, and thus lifespan of OLED 1 and OLED 3 may improve.

Example 5

OLED 5 emitting red light was prepared in the same manner used in Example 1, except that CBP was used as a red host and PtOEP was used as a red dopant (a weight ratio of the red host:the red dopant=98:2) and a thickness of the EML was 400A in the formation of the EML.

Example 6

OLED 6 emitting red light was prepared in the same manner used in Example 5, except that Compound 32 was used instead of Compound 26 in the formation of an interlayer.

Evaluation Example 3

Driving voltage, current density, efficiency, and lifespan ($T_{97}$) data of OLEDs 5 and 6 prepared in Examples 5 and 6 were evaluated in the same manner used in Evaluation Example 1, and the results are shown in Table 6.

TABLE 6

|  | Driving voltage (V) | Current density (mA/cm$^2$) | Efficiency (Cd/A) | $T_{97}$ (@760 nit) |
| --- | --- | --- | --- | --- |
| OLED 5 | 4.4 | 9.9 | 39.0 | 717 |
| OLED 6 | 4.4 | 10.7 | 41.0 | 700 or more |

Referring to Table 6, it was confirmed that OLEDs 5 and 6 prepared in Examples 5 and 6 may have excellent driving voltage, current density, efficiency, and lifespan data.

By way of summation and review, one or more embodiments provide an organic light-emitting device having a high efficiency and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting device (OLED), comprising:
   a first electrode;
   a second electrode facing the first electrode;
   an emission layer (EML) between the first electrode and the second electrode;
   a hole transport region between the first electrode and the EML, wherein the EML is a blue EML emitting blue light or a red EML emitting red light;
   an electron transport region between the EML and the second electrode; and
   an interlayer between the EML and the hole transport region,
   wherein the interlayer includes an amine-based compound represented by Formula 1 or 2:

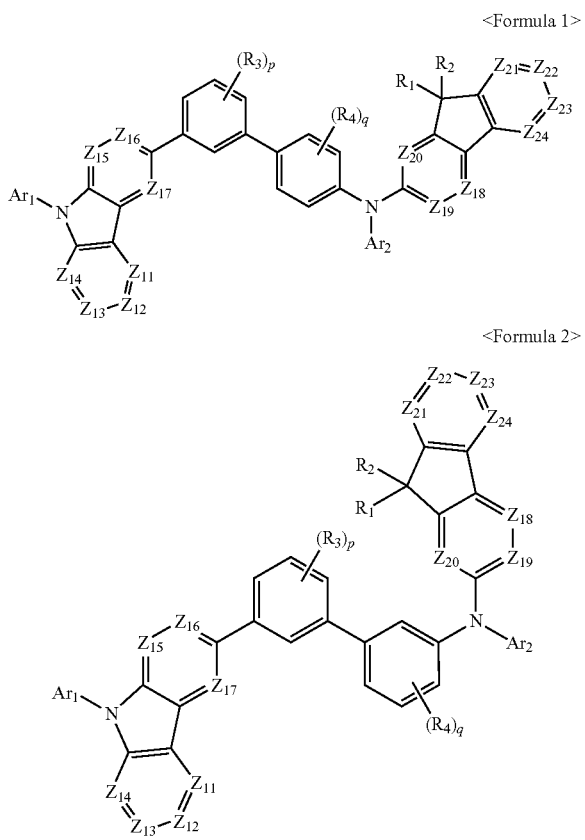

<Formula 1>

<Formula 2> wherein, in Formulae 1 and 2,
$Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ and $Ar_2$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_1$ and $R_2$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_3$, $R_4$, and $R_{11}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic heterocondensed polycyclic group, —N($Q_1$)($Q_1$), —Si($Q_3$)($Q_4$)($Q_5$), and —B($Q_6$)($Q_7$);

p and q are each independently an integer of 1 to 4;

at least one substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and substituted monovalent non-aromatic heterocondensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

$Q_1$ to $Q_7$, $Q_{11}$ to $Q_{17}$, $Q_{21}$ to $Q_{27}$, and $Q_{31}$ to $Q_7$ are each independently selected from, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group.

2. The OLED as claimed in claim 1, wherein $Z_{11}$ is C($R_{11}$), $Z_{12}$ is C($R_{12}$), $Z_{13}$ is C($R_{13}$), $Z_{14}$ is C($R_{14}$), $Z_{15}$ is C($R_{15}$), $Z_{16}$ is C($R_{16}$), $Z_{17}$ is C($R_{17}$), $Z_{18}$ is C($R_{18}$), $Z_{19}$ is C($R_{19}$), $Z_{20}$ is C($R_{20}$), $Z_{21}$ is C($R_{21}$), $Z_{22}$ is C($R_{22}$), $Z_{23}$ is C($R_{23}$), and $Z_{24}$ is C($R_{24}$).

3. The OLED as claimed in claim 1, wherein $Ar_1$ and $Ar_2$ are each independently selected from, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, a dibenzothiophenyl group, and a benzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, a $C_2$-$C_{20}$ heteroaryl group, a monovalent non-aromatic condensed polycyclic group, and a monovalent non-aromatic heterocondensed polycyclic group.

4. The OLED as claimed in claim 1, wherein $Ar_1$ and $Ar_2$ are each independently selected from, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a Spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

5. The OLED as claimed in claim 1, wherein $Ar_1$ and $Ar_2$ are each independently a group represented by one of Formulae 3-1 to 3-20:

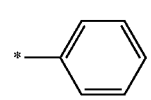

Formula 3-1

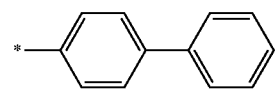

Formula 3-2

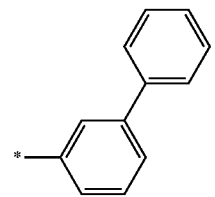

Formula 3-3

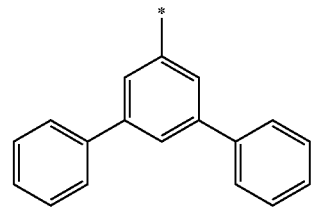

Formula 3-4

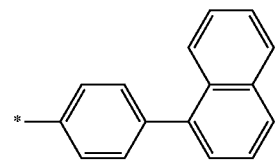

Formula 3-5

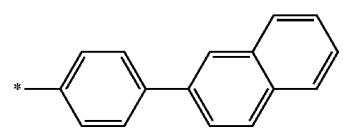

Formula 3-6

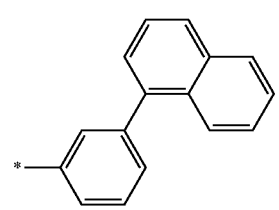

Formula 3-7

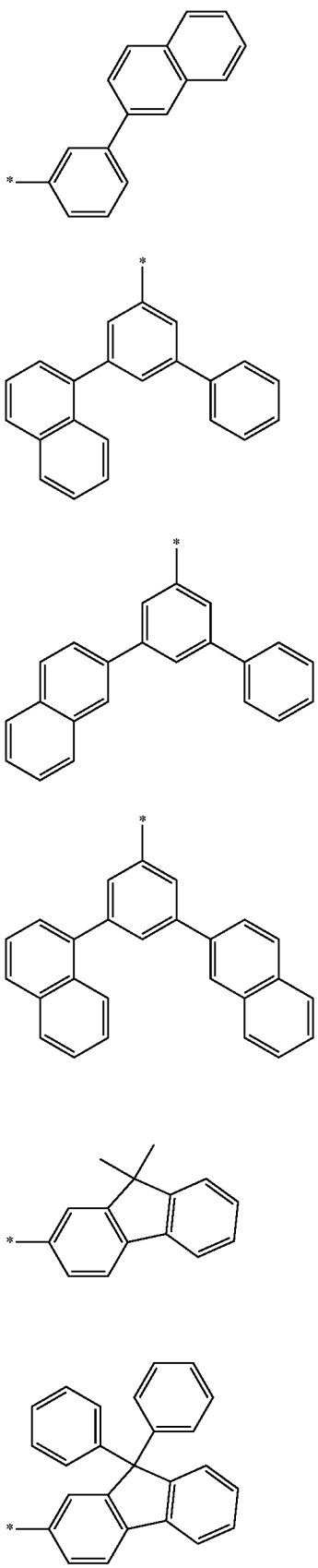
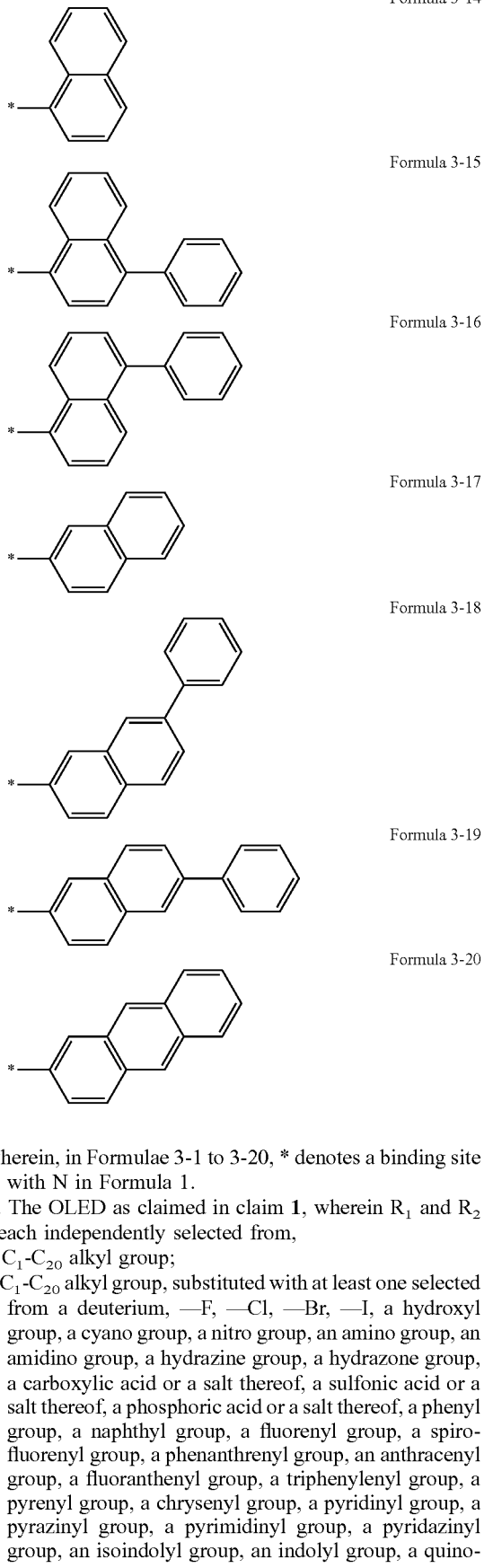

wherein, in Formulae 3-1 to 3-20, * denotes a binding site with N in Formula 1.

6. The OLED as claimed in claim 1, wherein $R_1$ and $R_2$ are each independently selected from, a $C_1$-$C_{20}$ alkyl group;

a $C_1$-$C_{20}$ alkyl group, substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

7. The OLED as claimed in claim 1, wherein $R_1$ and $R_2$ are each independently selected from a methyl group, an ethyl group, a propyl group, a butyl group, a pentyl group, a hexyl group, a heptyl group, and one of the groups represented by Formula 3-1 to 3-20:

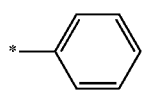

Formula 3-1

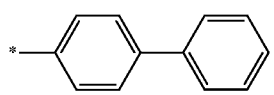

Formula 3-2

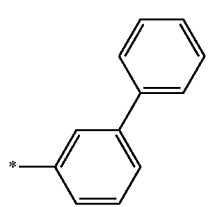

Formula 3-3

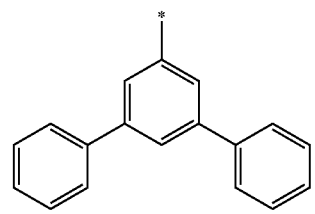

Formula 3-4

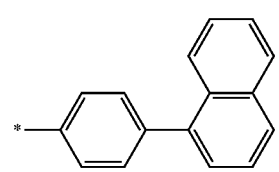

Formula 3-5

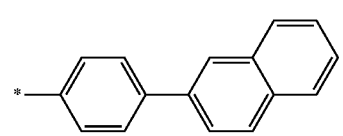

Formula 3-6

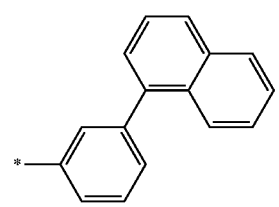

Formula 3-7

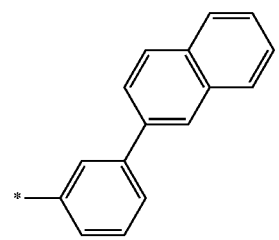

Formula 3-8

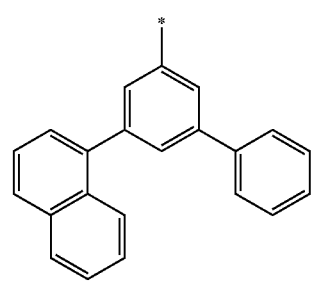

Formula 3-9

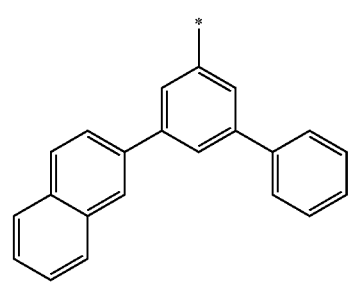

Formula 3-10

-continued

Formula 3-11

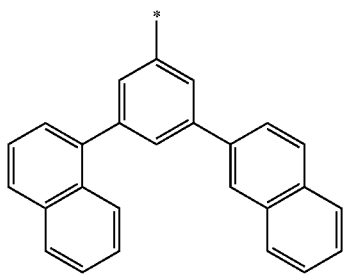

Formula 3-12

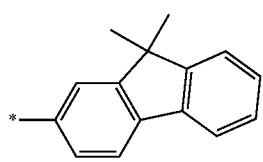

Formula 3-13

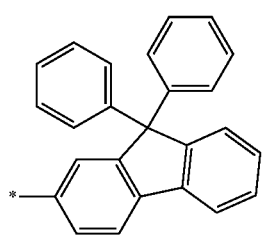

Formula 3-14

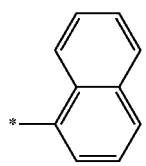

Formula 3-15

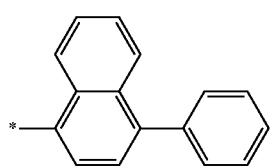

Formula 3-16

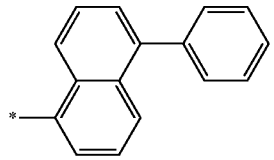

Formula 3-17

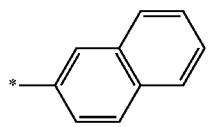

Formula 3-18

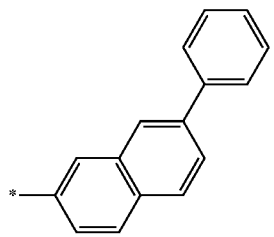

Formula 3-19

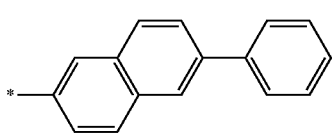

Formula 3-20

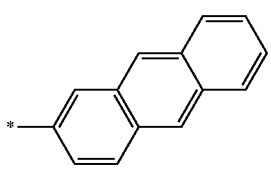

wherein, in Formulae 3-1 to 3-20, * denotes a carbon atom of a fluorene group in Formula 1.

8. The OLED as claimed in claim 1, wherein $R_3$, $R_4$, and $R_{11}$ to $R_{24}$ are each independently selected from, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, and a $C_1$-$C_{20}$ alkyl group;

a $C_1$-$C_{20}$ alkyl group, substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

9. The OLED as claimed in claim 1, wherein $R_3$, $R_4$, and $R_{11}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, and a $C_1$-$C_{20}$ alkyl group.

10. The OLED as claimed in claim 1, wherein $R_3$, $R_4$, and $R_{11}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, and one the groups represented by Formulae 3-1 to 3-20:

Formula 3-1
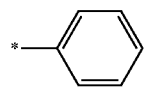

Formula 3-2
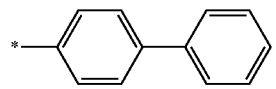

Formula 3-3
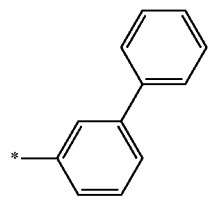

Formula 3-4
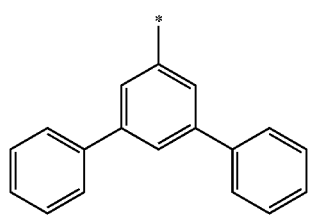

Formula 3-5
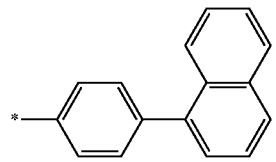

Formula 3-6
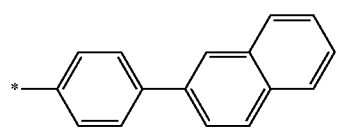

Formula 3-7
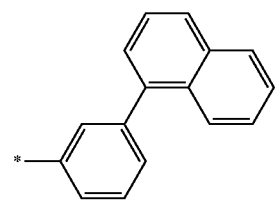

Formula 3-8
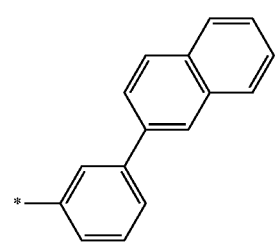

Formula 3-9
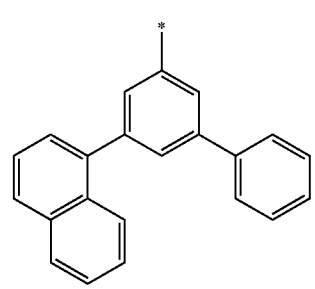

Formula 3-10
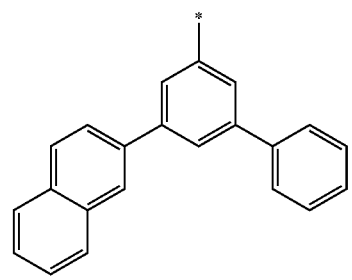

Formula 3-11
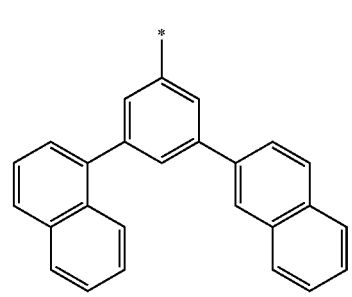

Formula 3-12
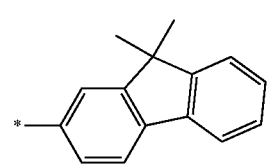

-continued

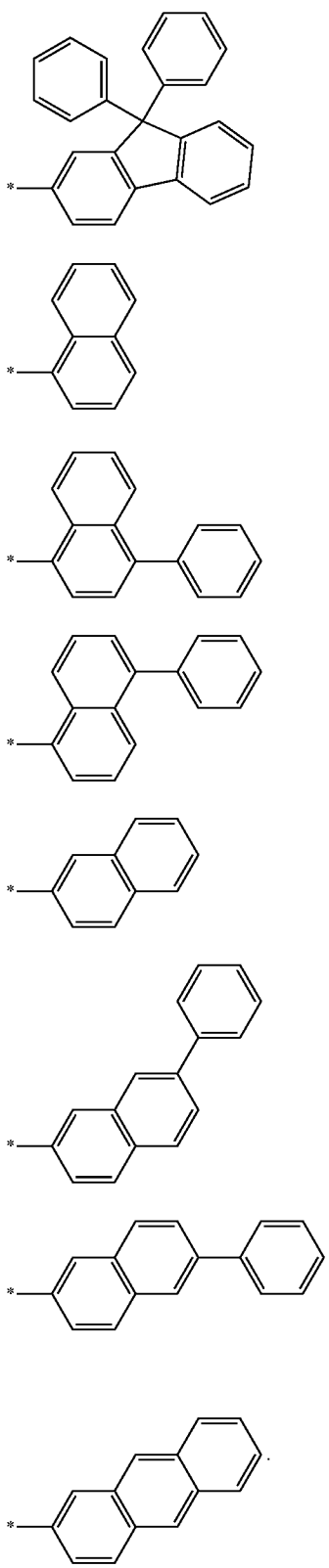

Formula 3-13
Formula 3-14
Formula 3-15
Formula 3-16
Formula 3-17
Formula 3-18
Formula 3-19
Formula 3-20

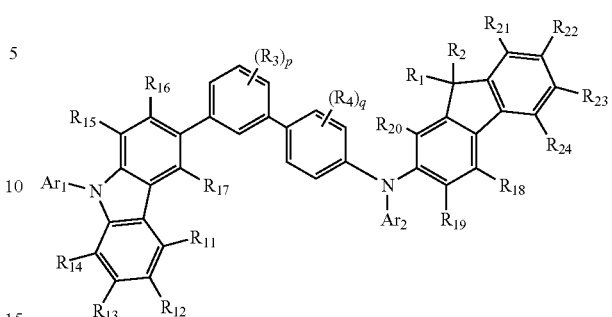

<Formula 1A>

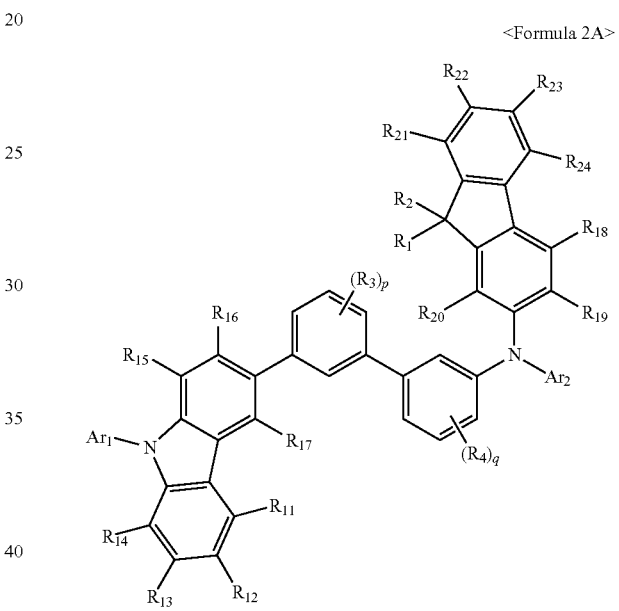

<Formula 2A> wherein, in Formulae 1A and 2A, descriptions of the substituents are as defined in claim 1.

12. The OLED as claimed in claim 1, wherein the amine-based compound represented by Formula 1 or 2 is one of Compounds 1 to 96:

1

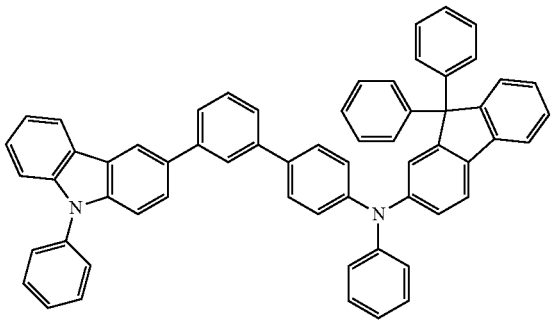

11. The OLED as claimed in claim 1, wherein the amine-based compound represented by Formula 1 or 2 is represented by Formula 1A or 2A:

2
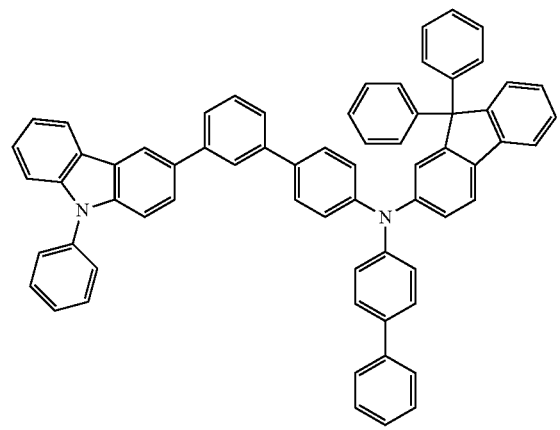
3
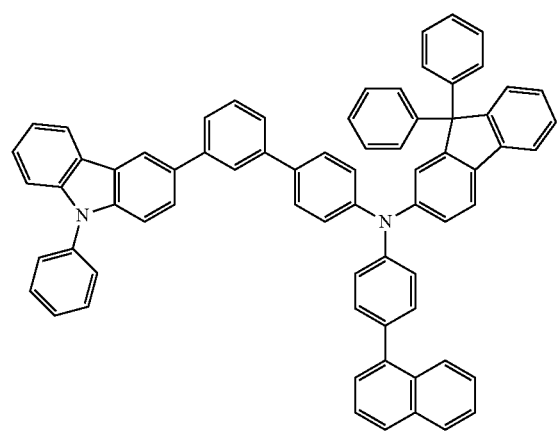
4
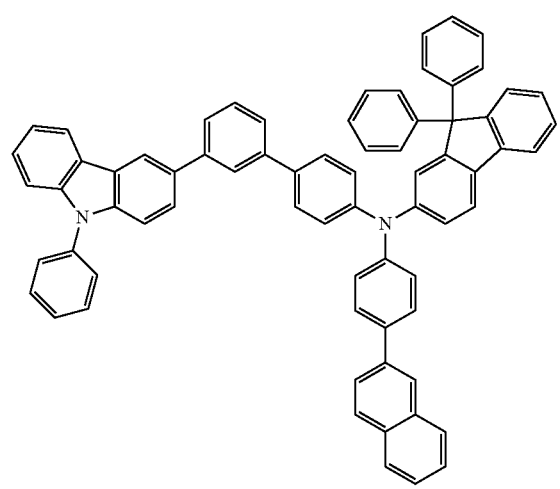
5
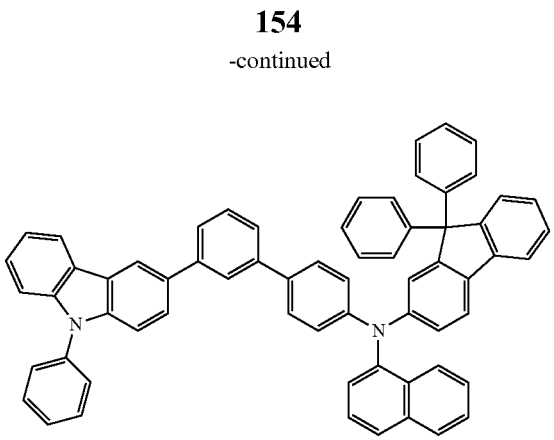
6
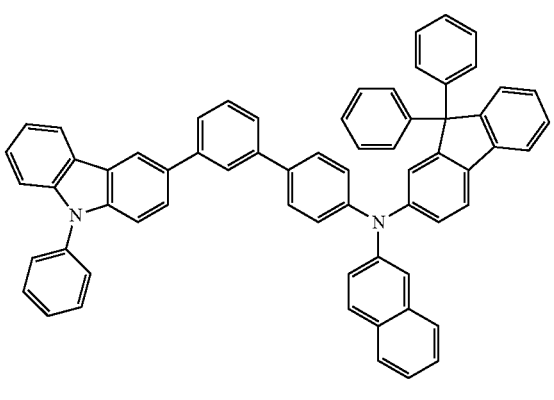
7
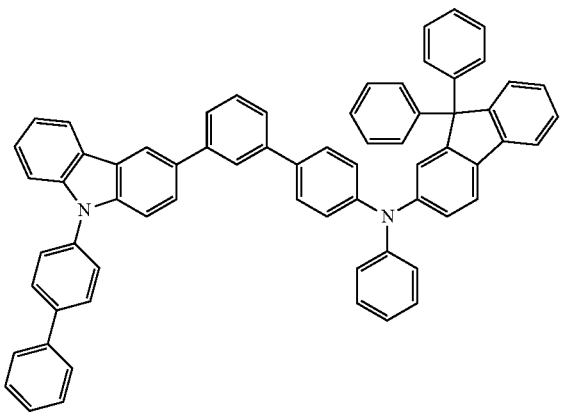
8
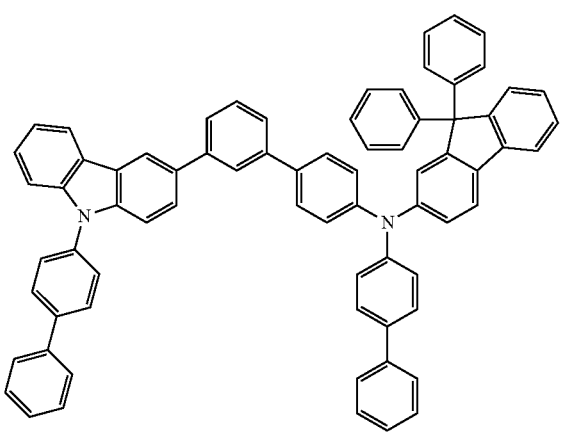

9
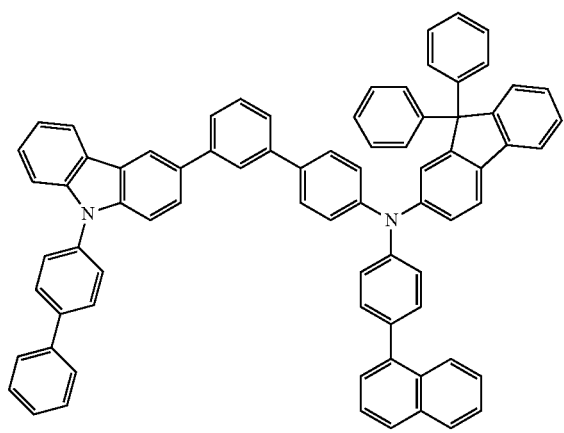
10
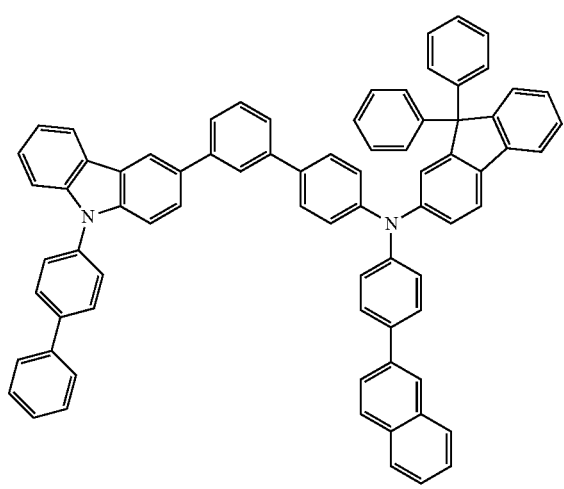
11
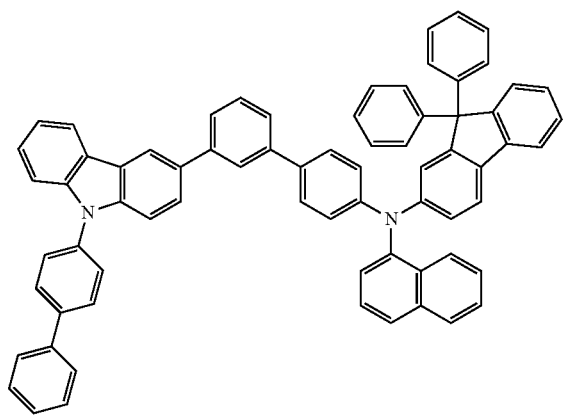
12
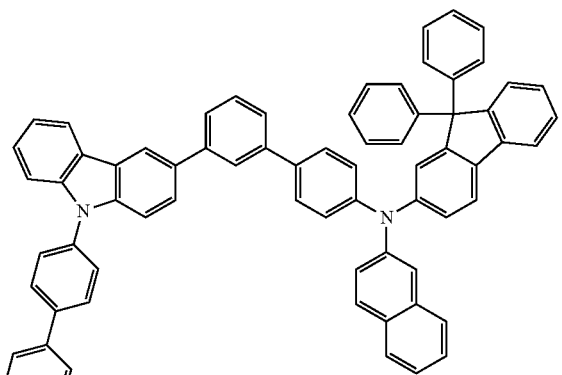
13
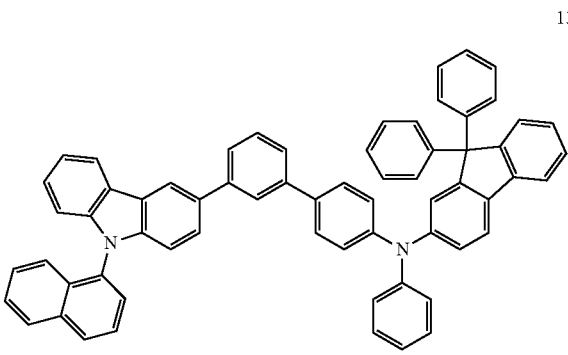
14
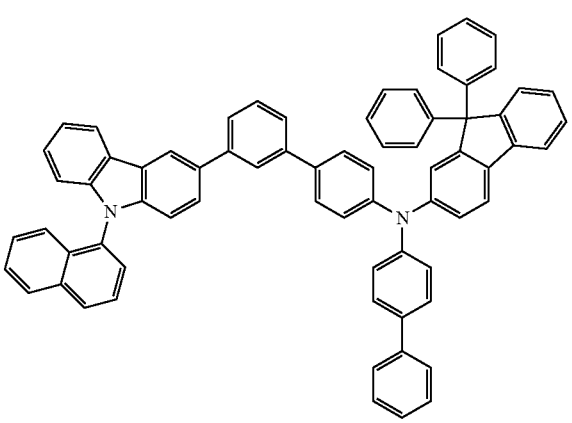
15
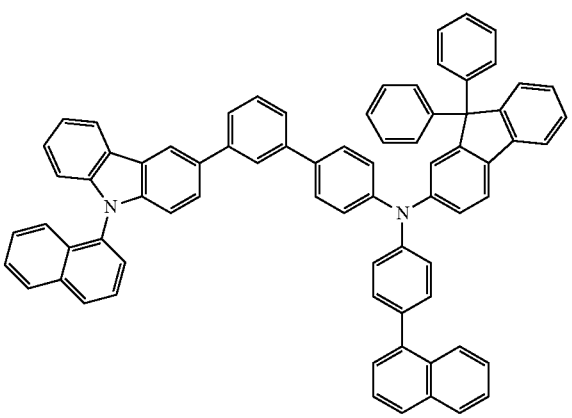

-continued

16

17

18

19

-continued

20

21

22

23
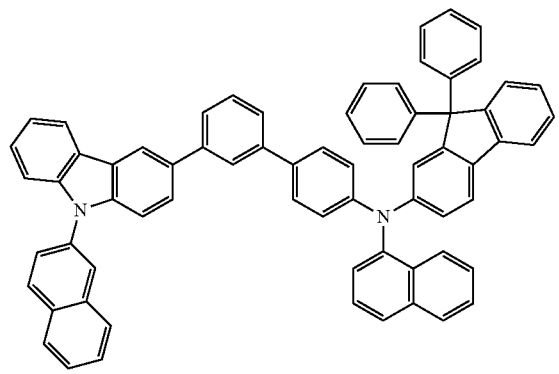
24
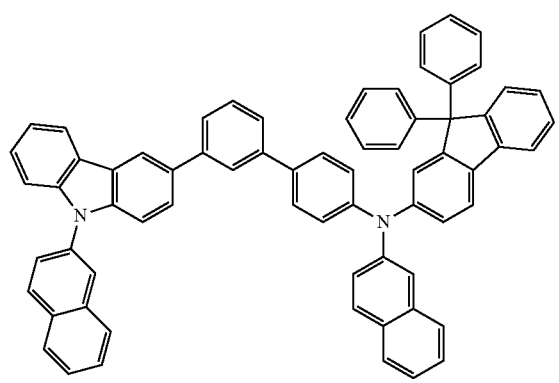
25
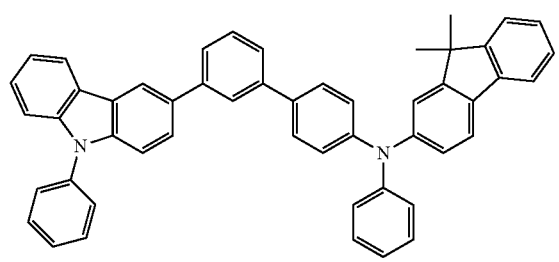
26
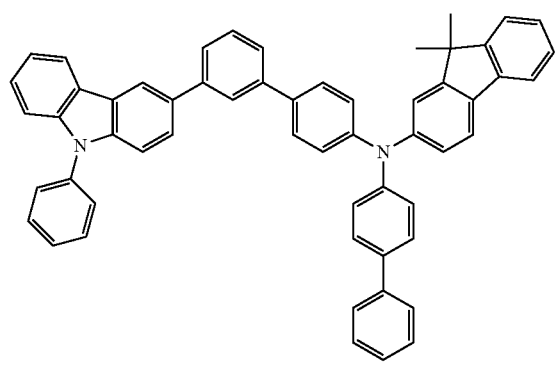
27
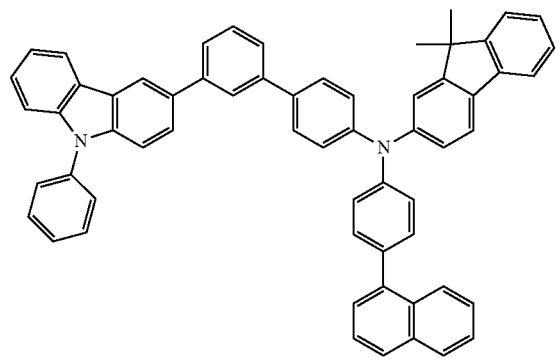
28
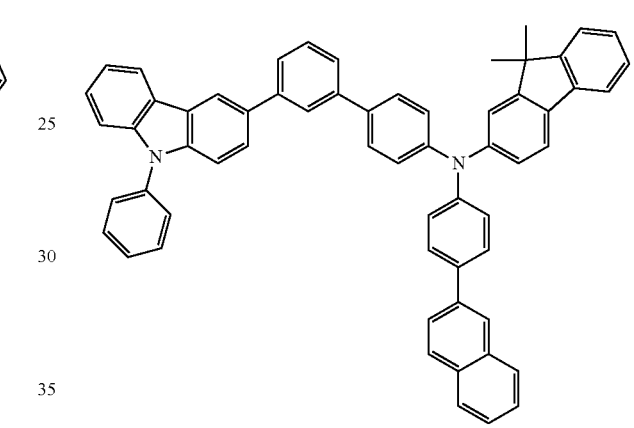
29
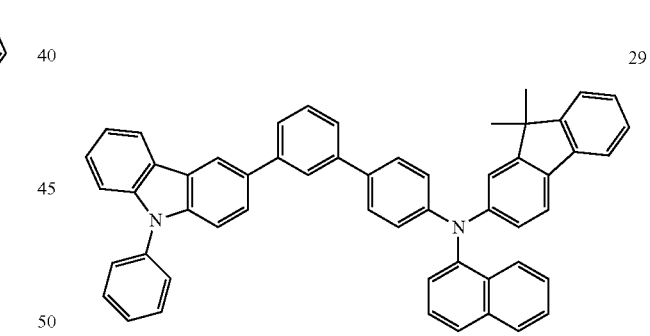
30
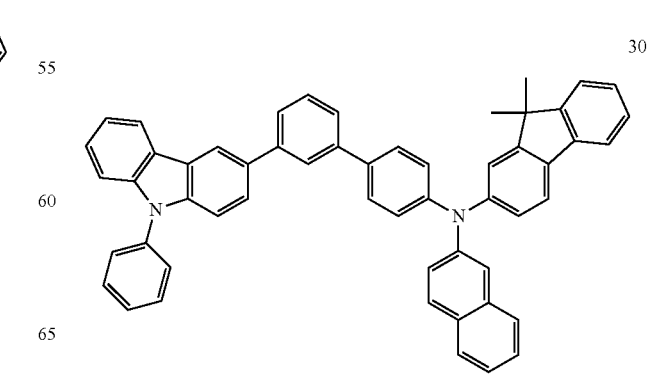

31
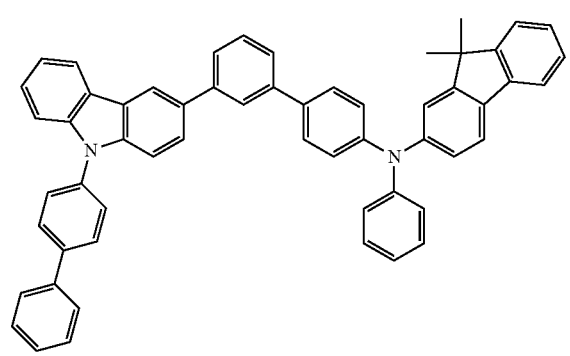
35
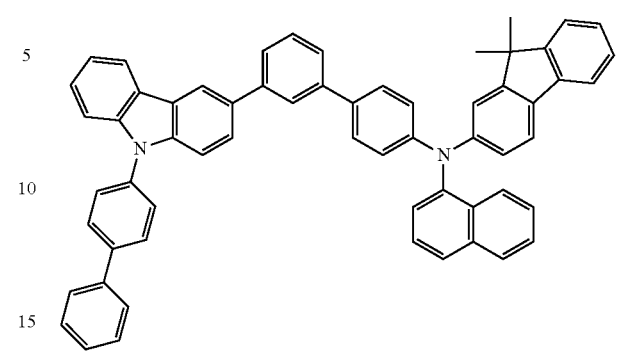
32
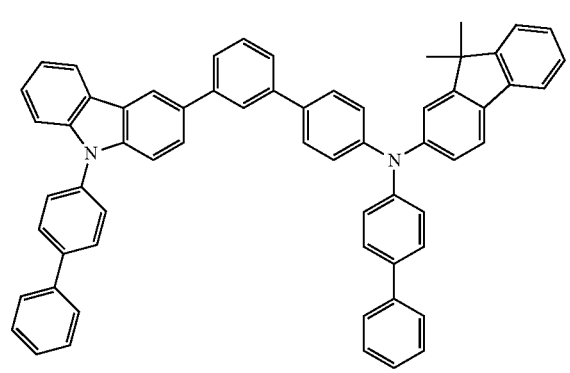
36
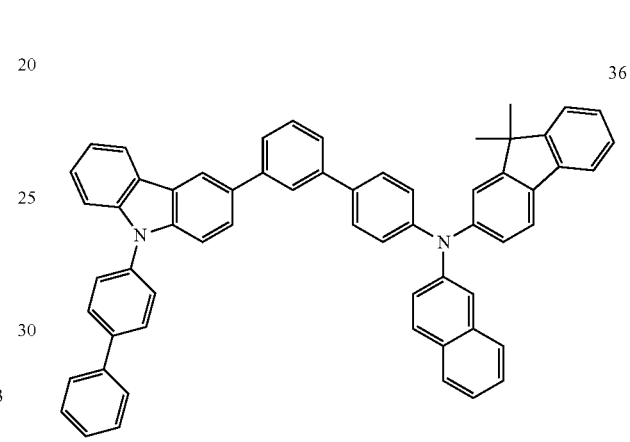
33
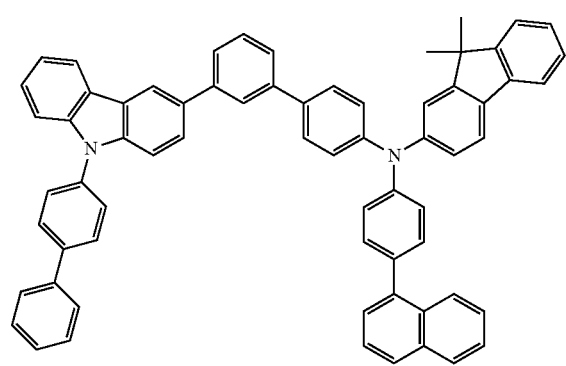
37
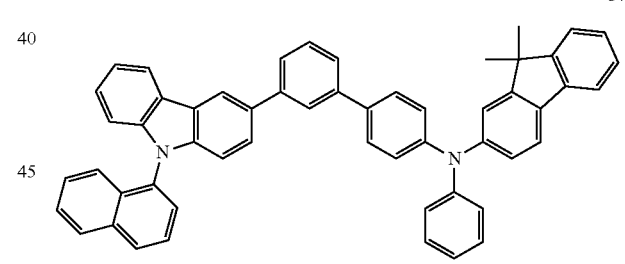
34
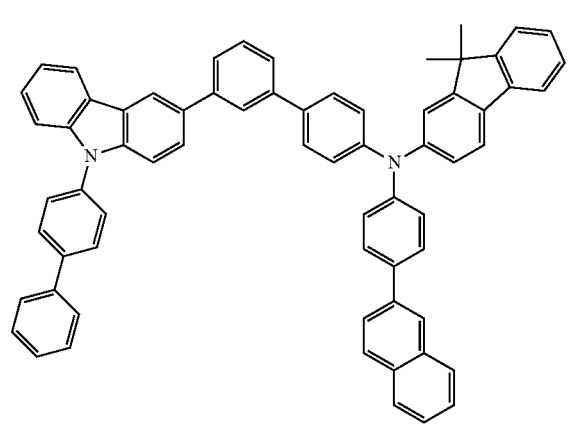
38
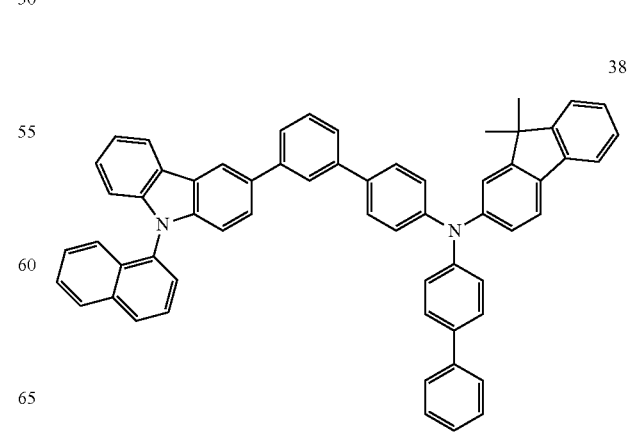

-continued
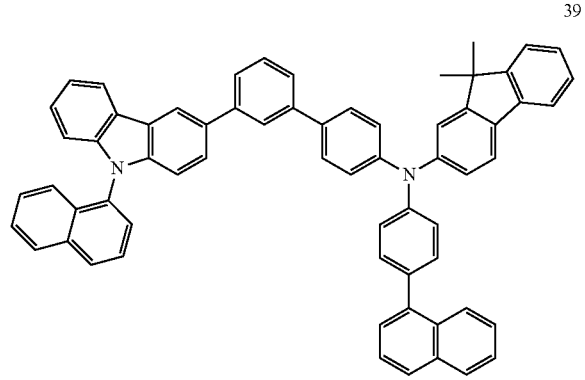
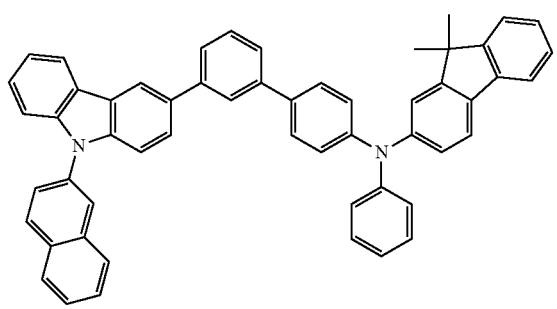

47
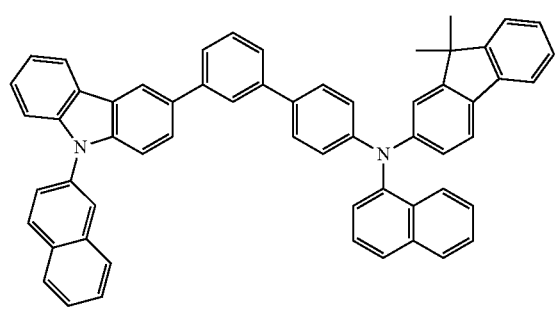
48
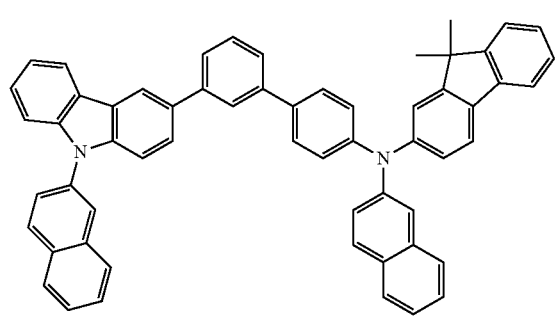
49
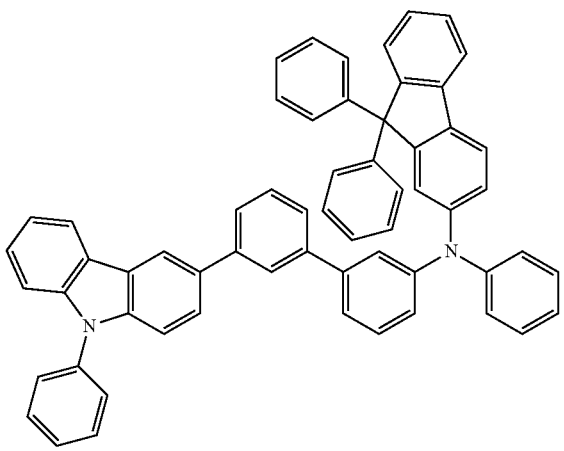
50
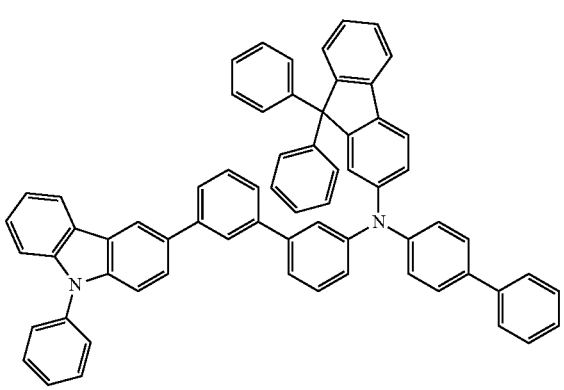
51
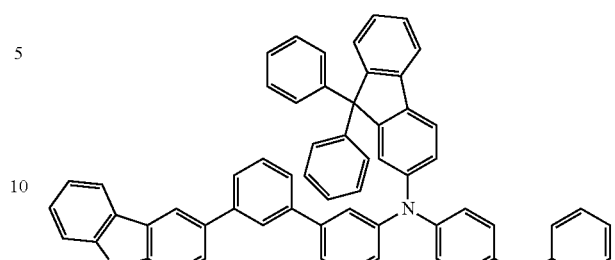
52
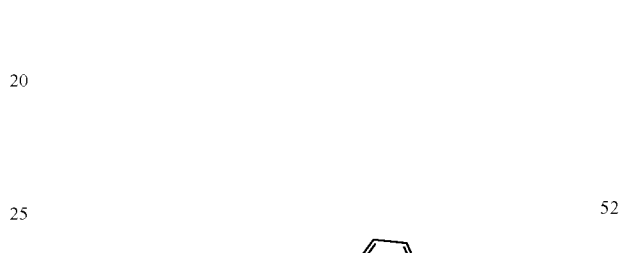
53
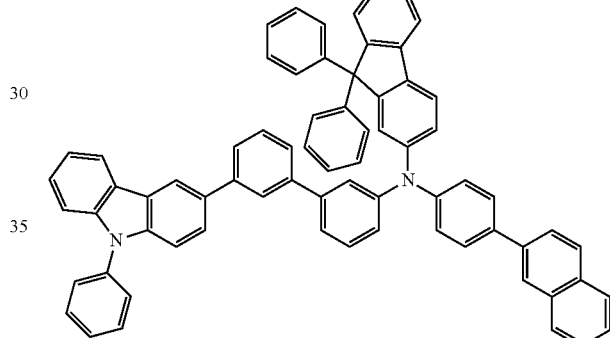

167
-continued
54
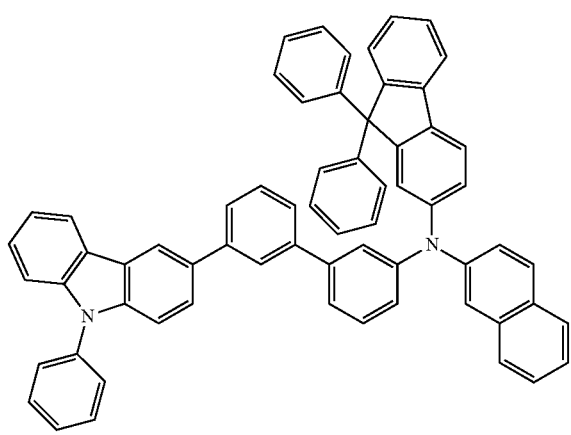
55
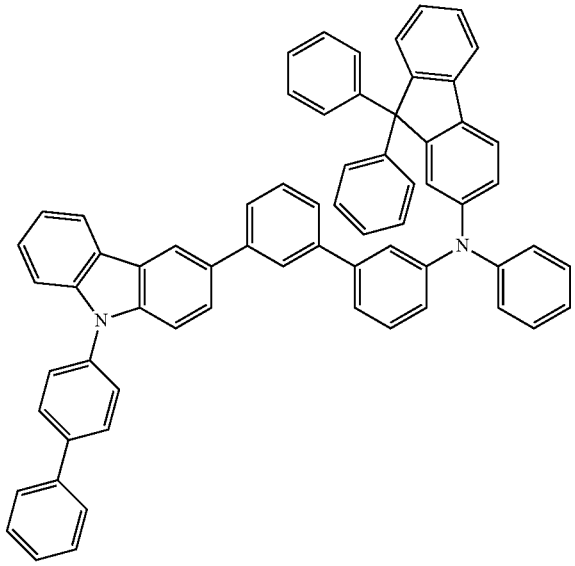
56
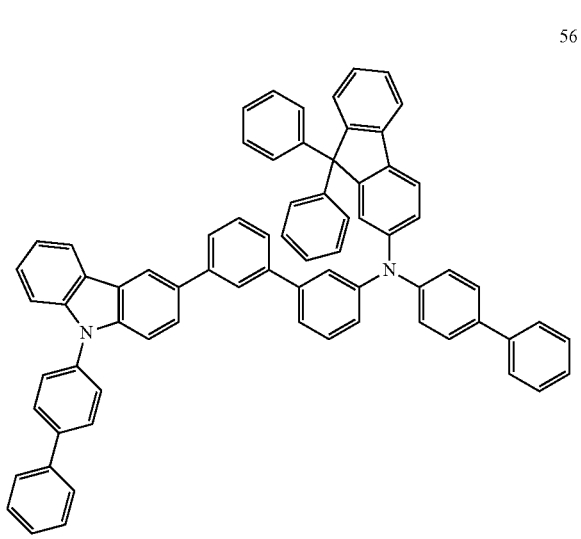
168
-continued
57
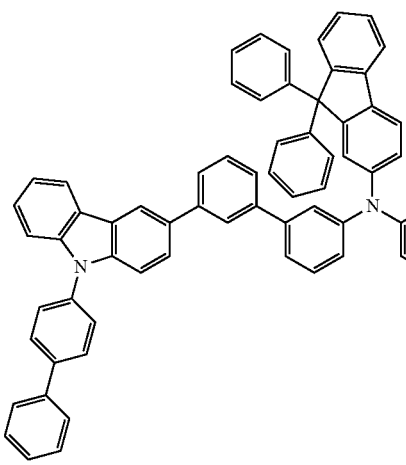
58
59
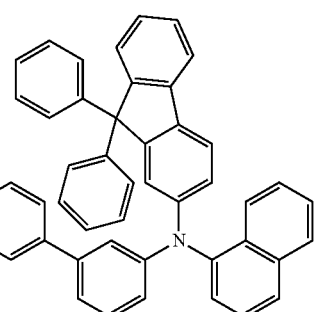

60
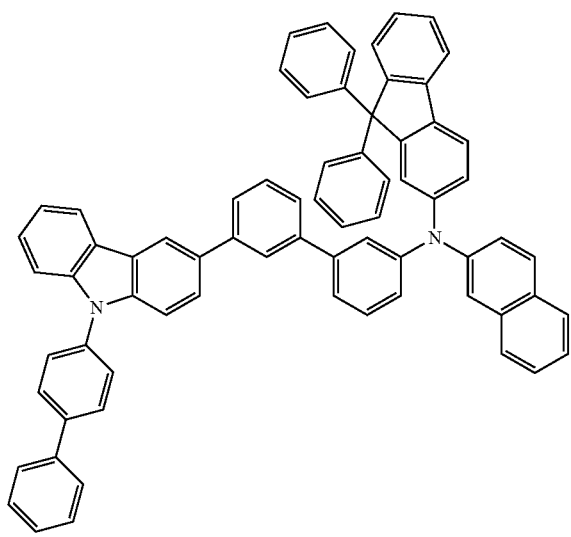
61
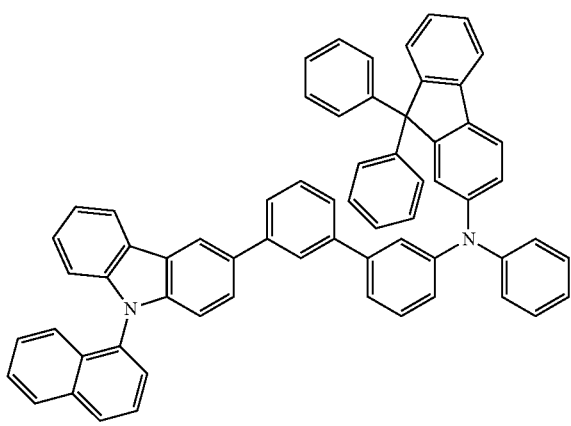
62
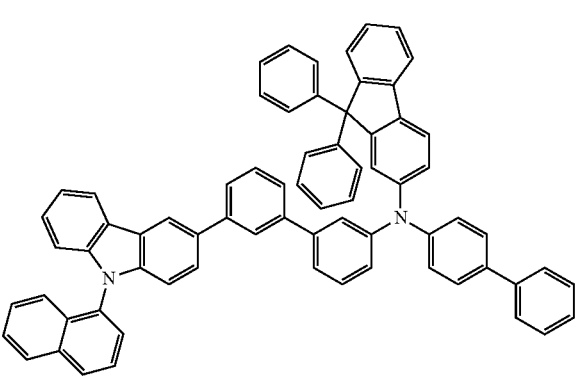
63
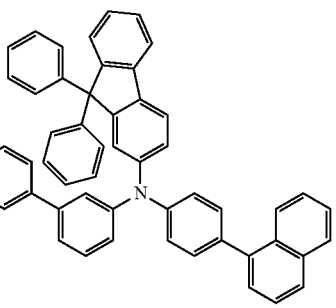
64
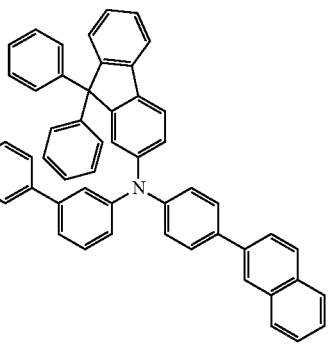
65
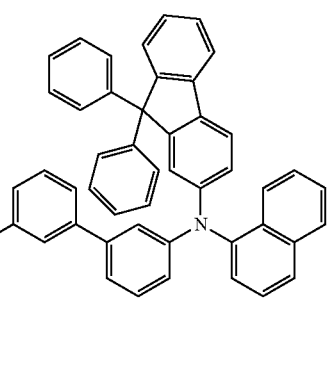
66
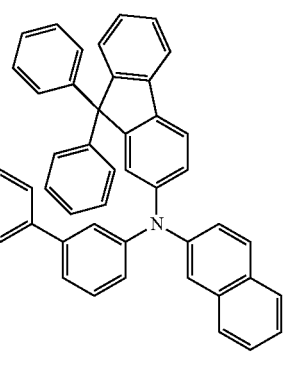

67
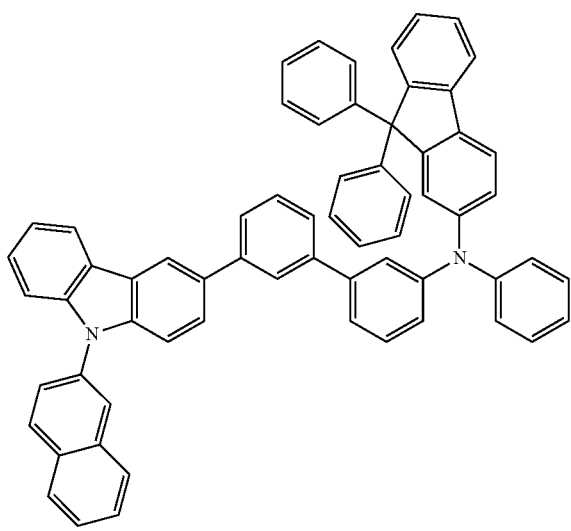
68
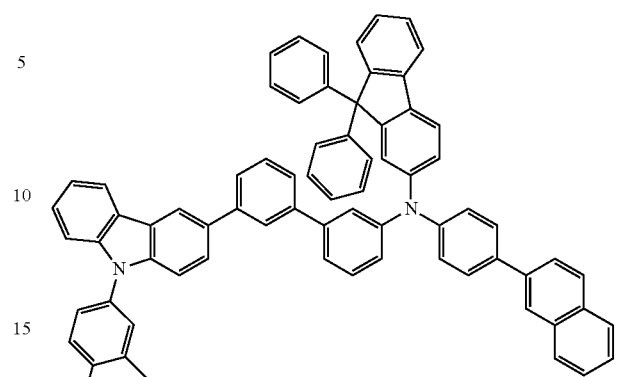
70
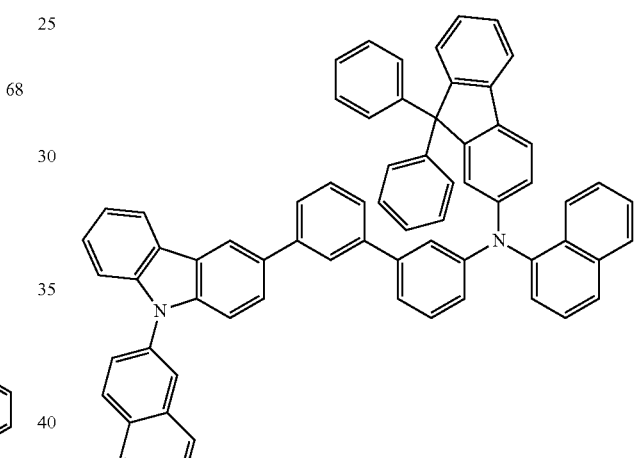
71
72
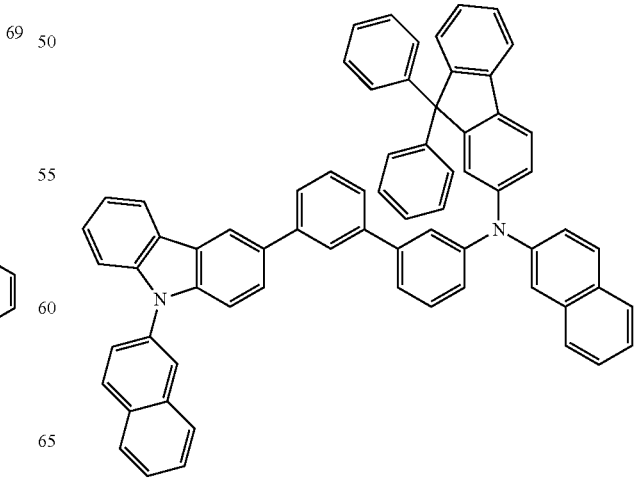

73
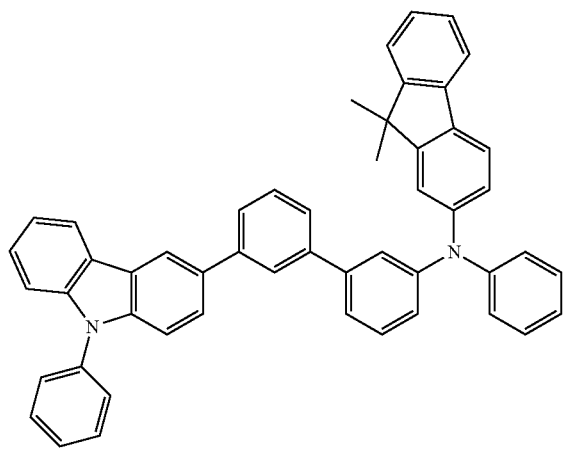
74
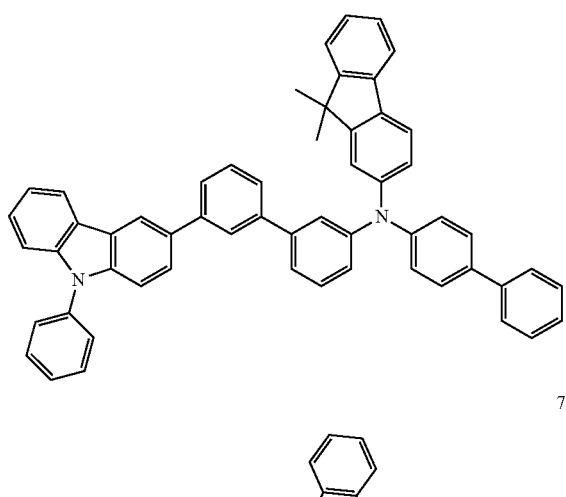
75
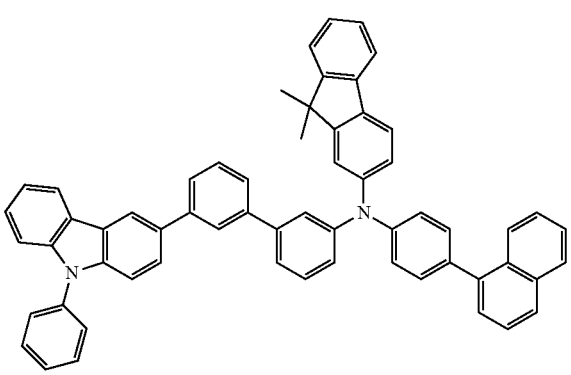
76
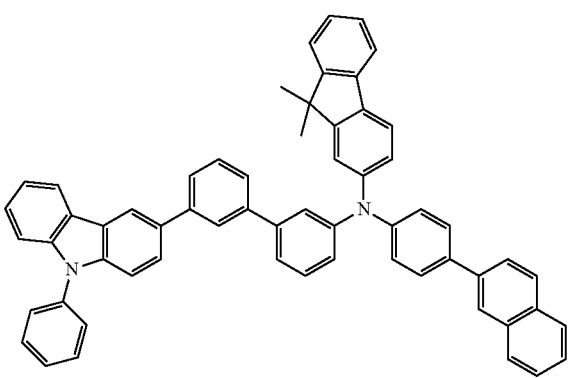
77
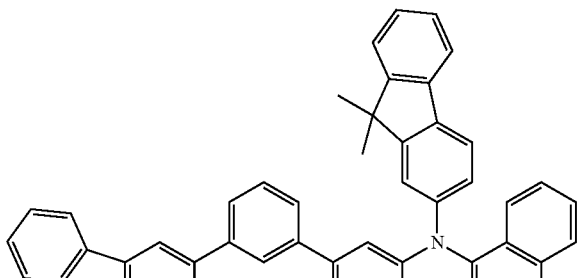
78
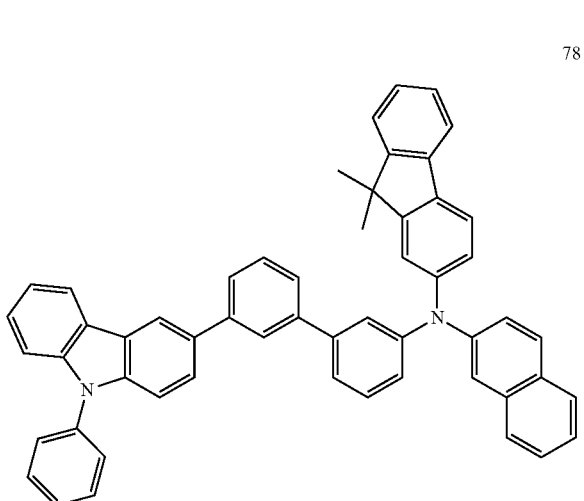
79
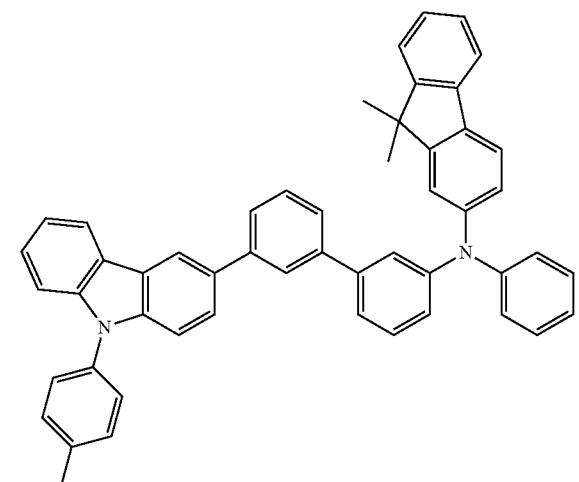

80
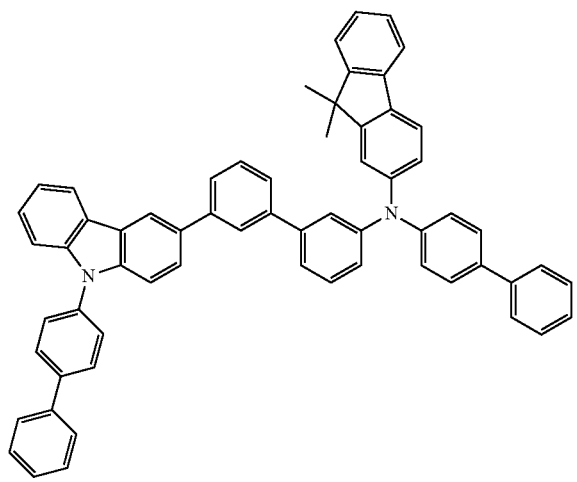
81
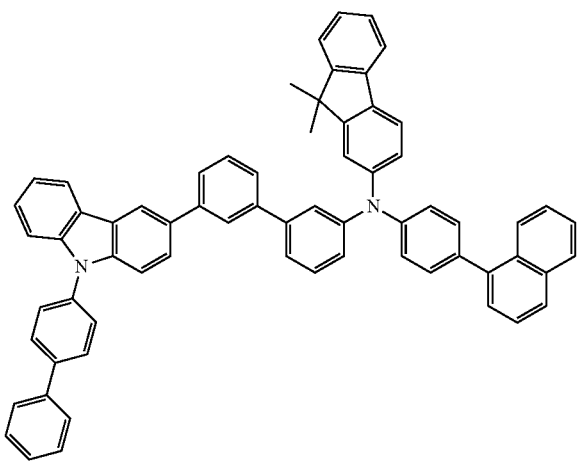
82
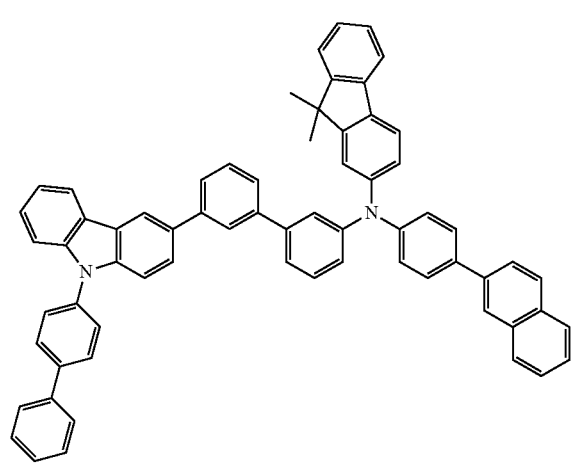
83
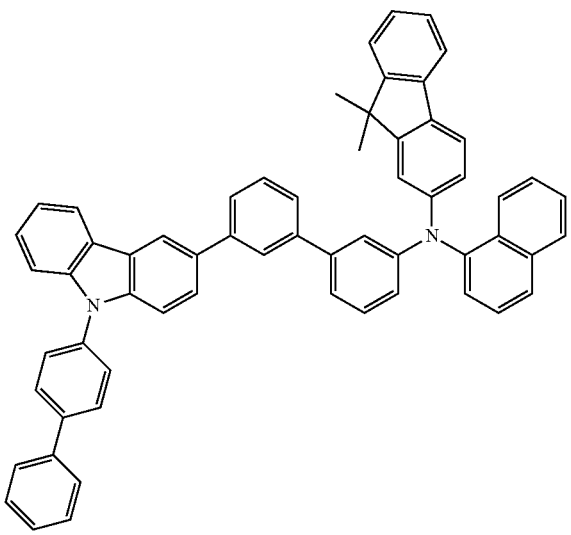
84
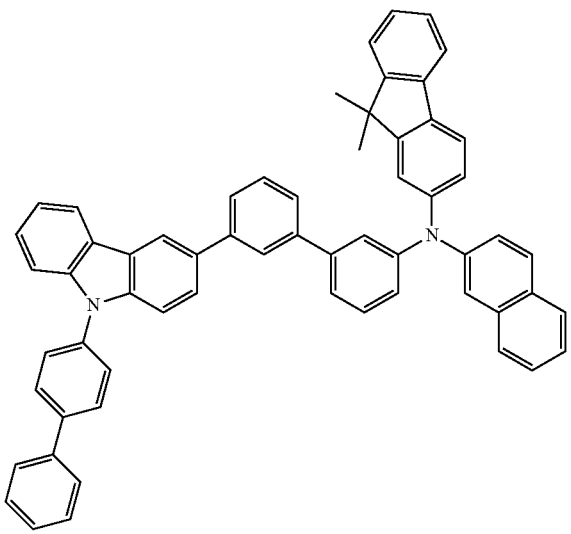
85
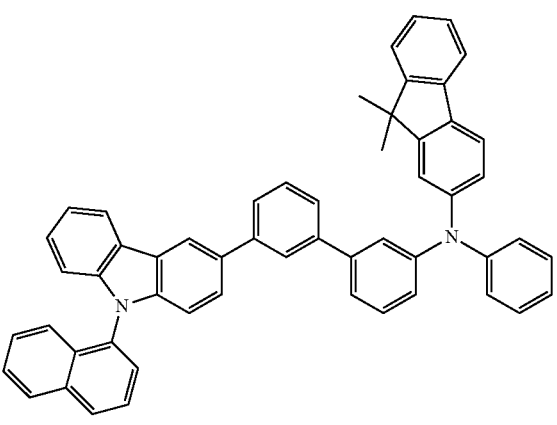

-continued
86
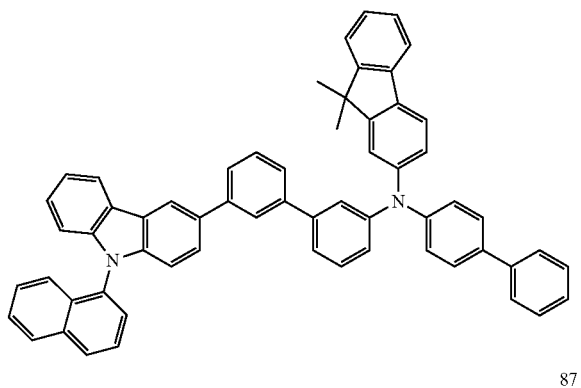
87
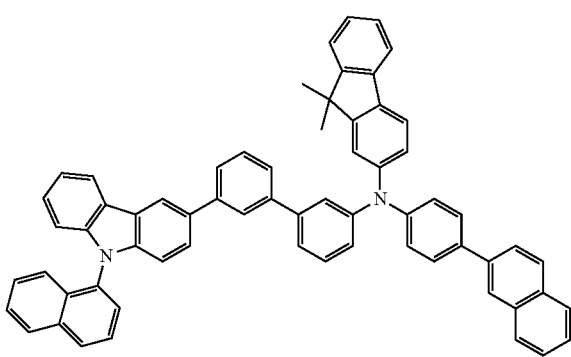
88
89
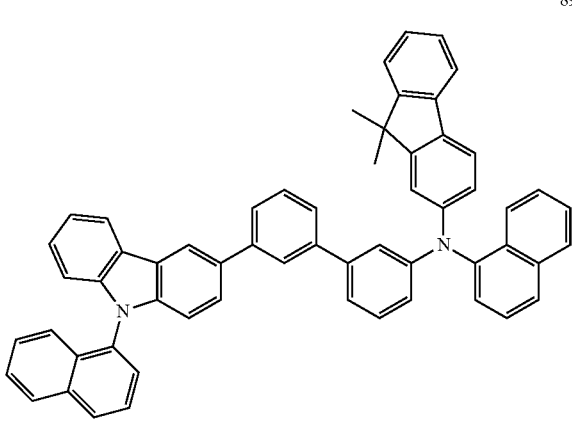
-continued
90
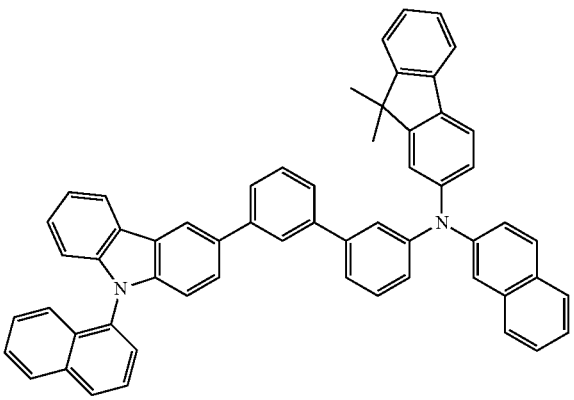
91
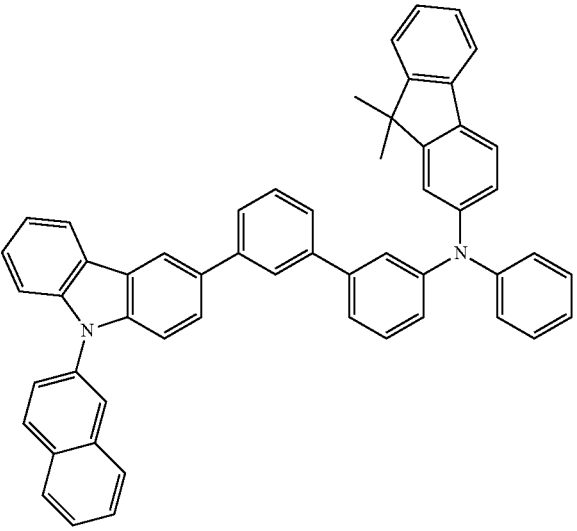
92
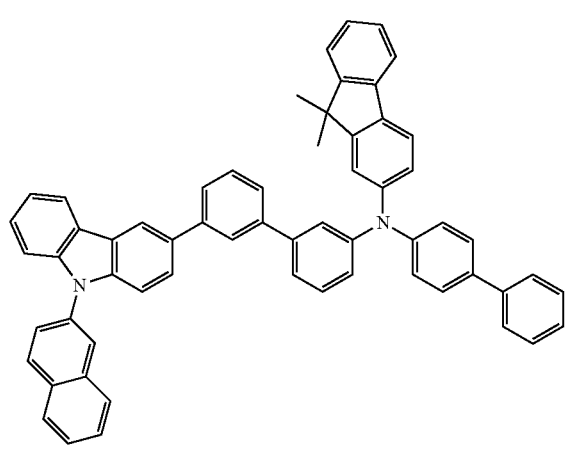

-continued

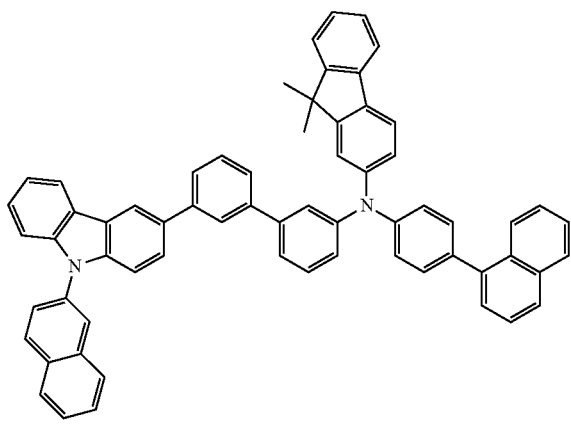
93

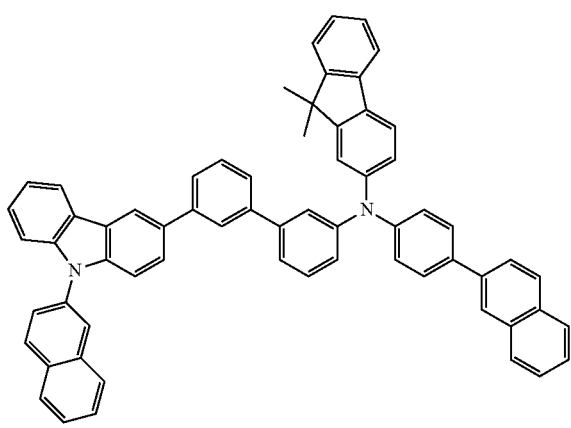
94

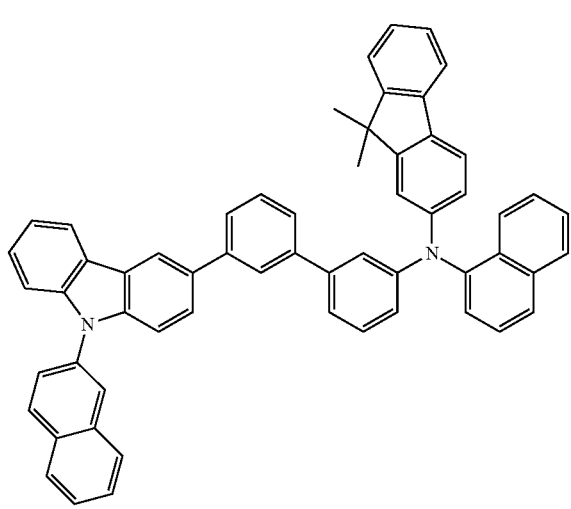
95

-continued

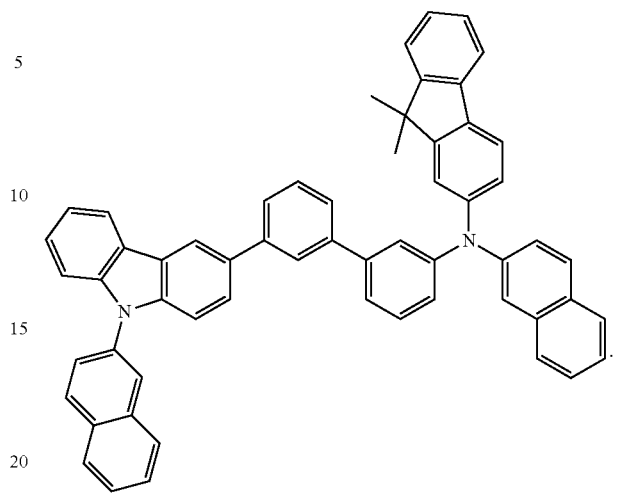
96

13. The OLED as claimed in claim 1, wherein the hole transport region includes at least one of a compound represented by Formula 201A and a compound represented by Formula 202A:

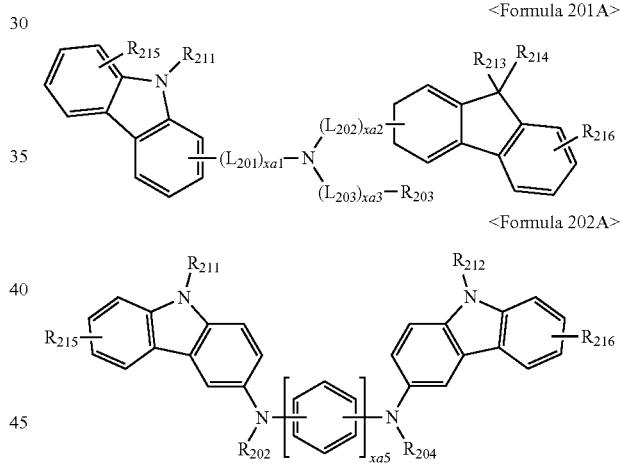

$L_{201}$ to $L_{203}$ are each independently selected from,
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently 0 or 1;

$R_{203}$, $R_{204}$, $R_{205}$, $R_{211}$, and $R_{212}$ are each independently selected from, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ are each independently selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa5 is 1 or 2.

14. The OLED as claimed in claim 13, wherein one of the compound represented by Formula 201A and the compound represented by Formula 202A comprises one of Compounds HT1 to HT21:

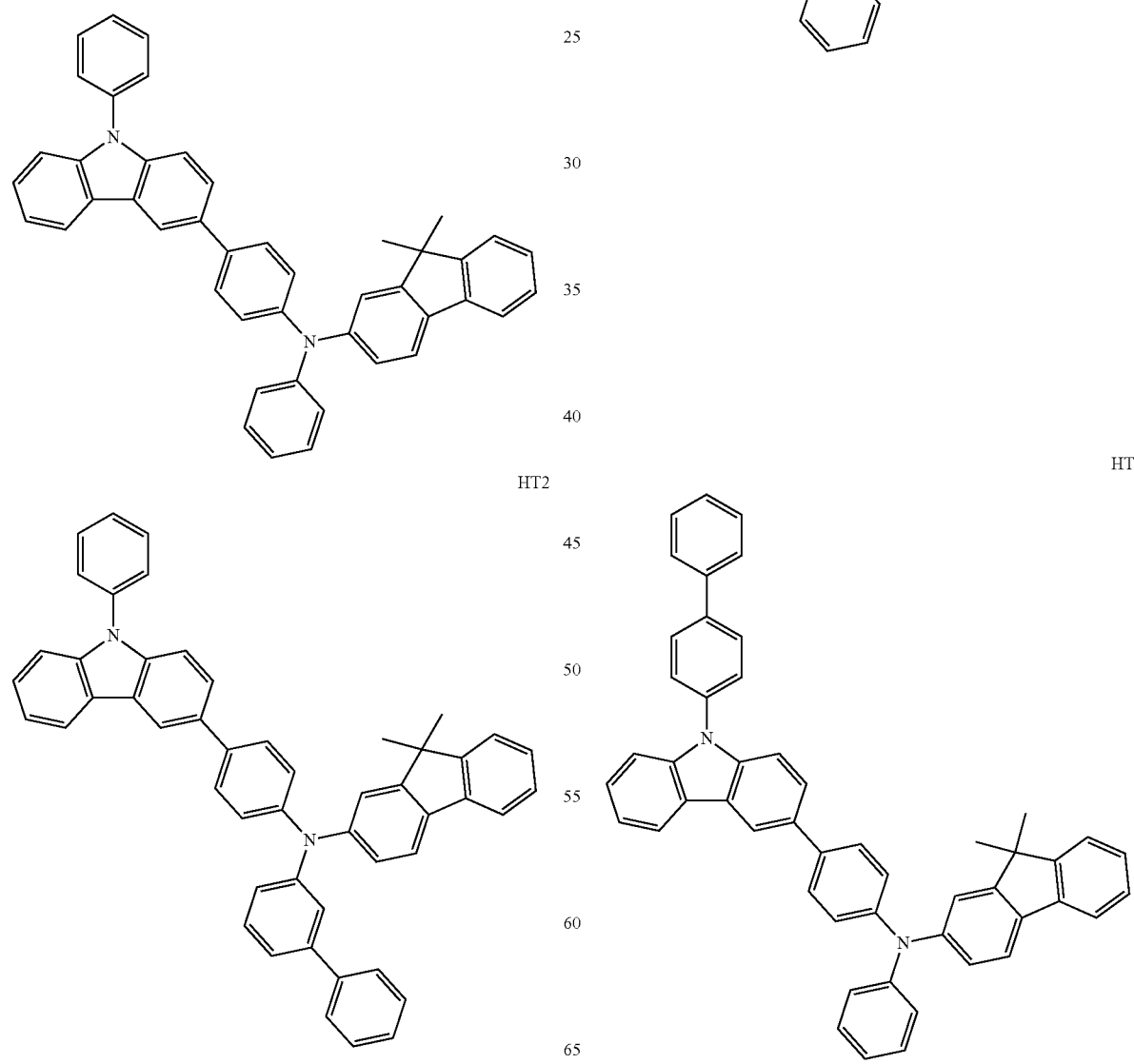

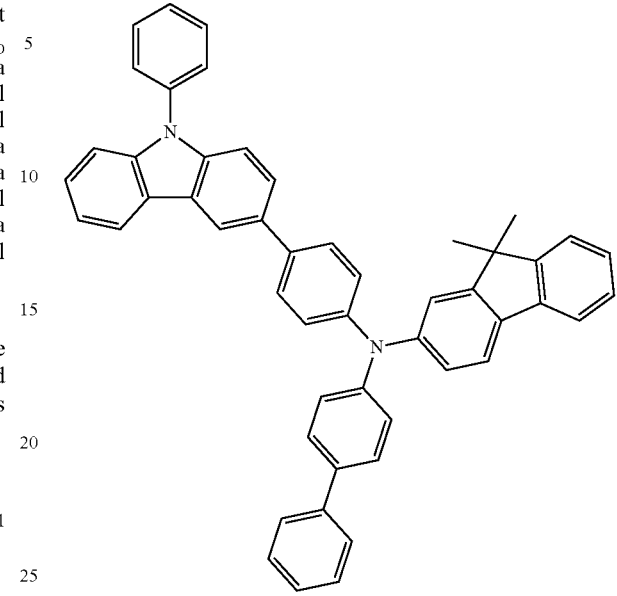

HT5
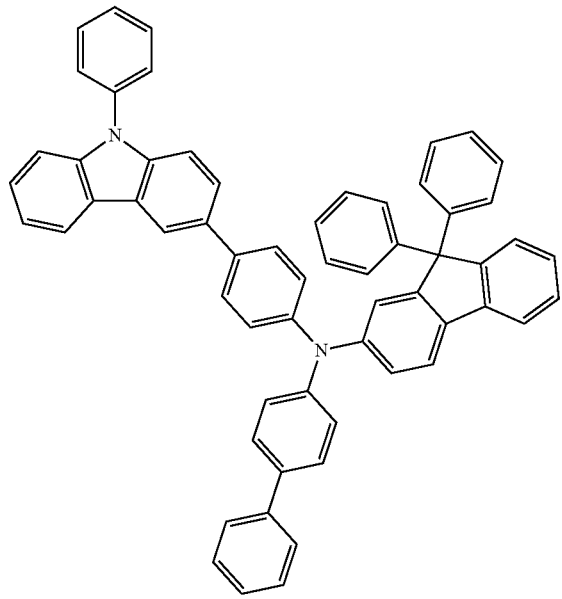
HT6
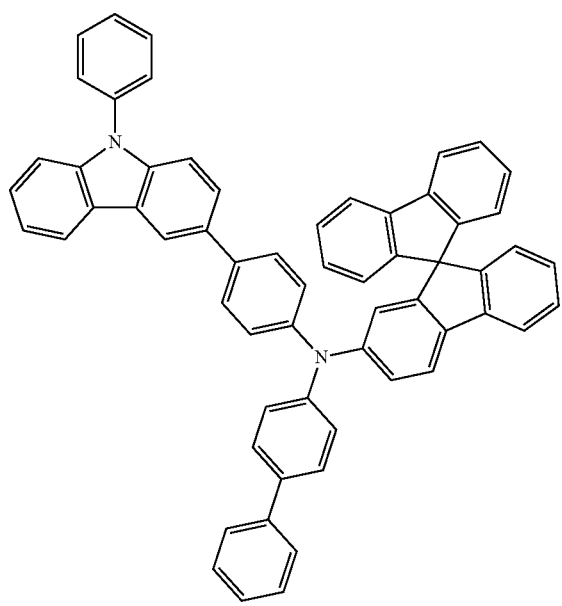
HT7
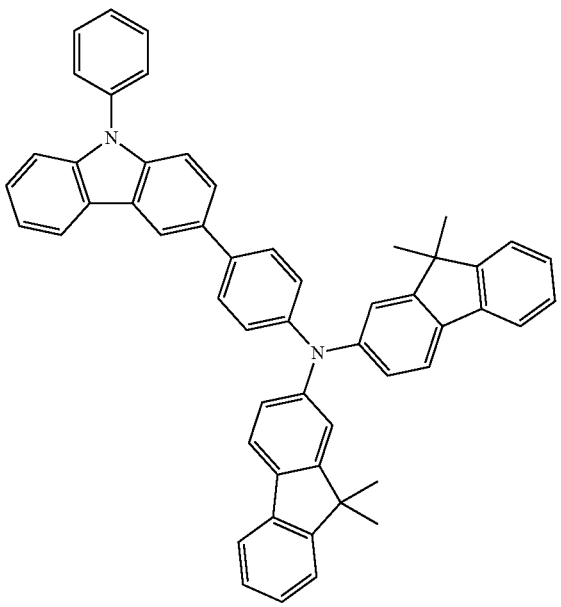
HT8
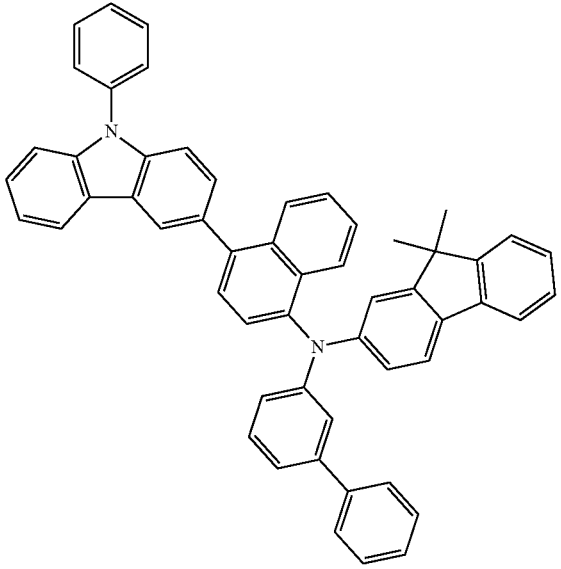

HT9
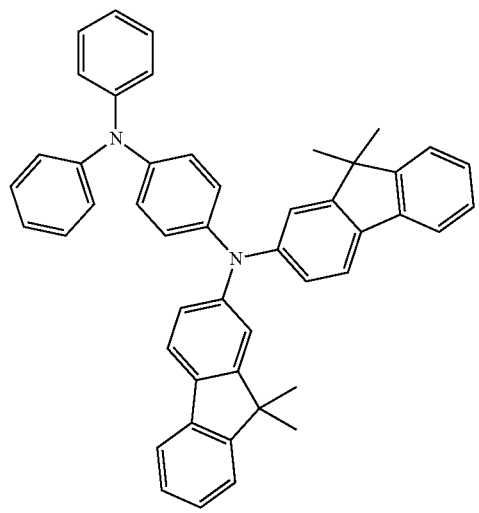
HT10
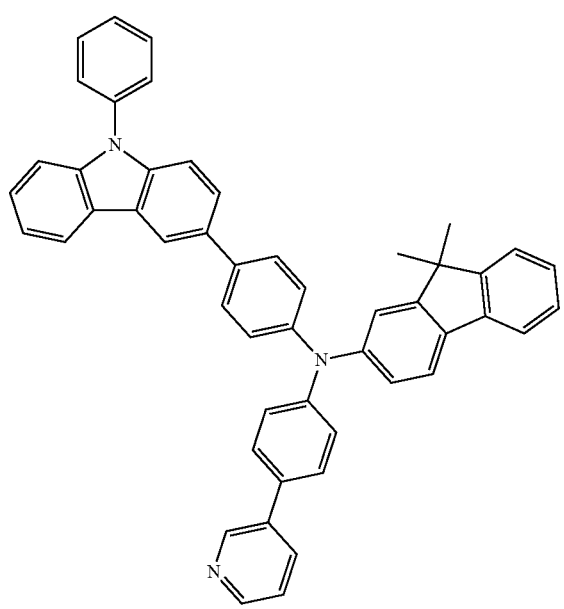
HT11
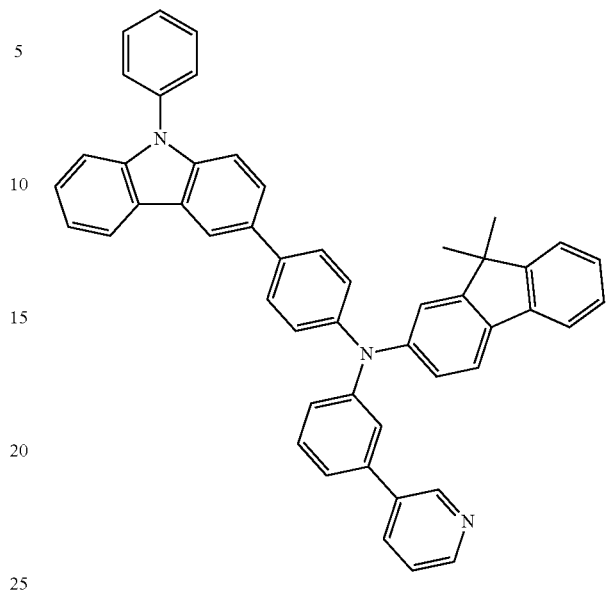
HT12
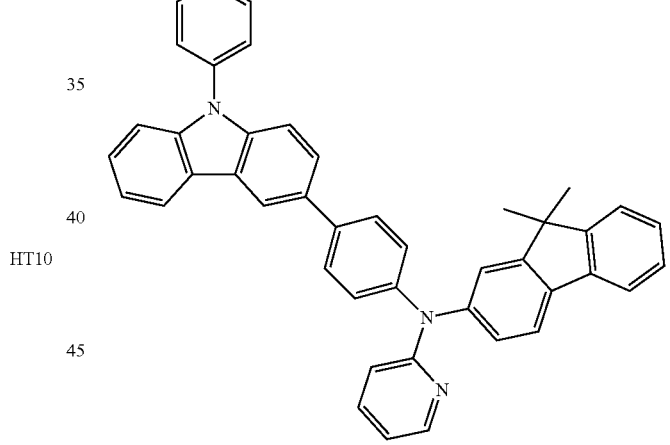
HT13
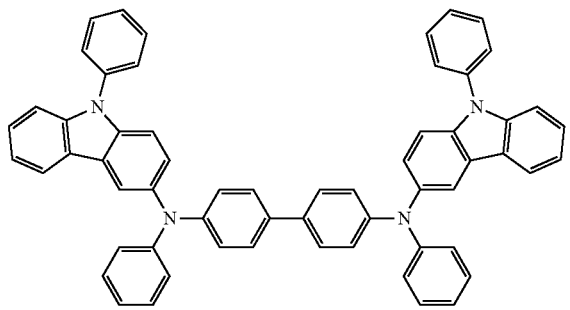

-continued

HT14
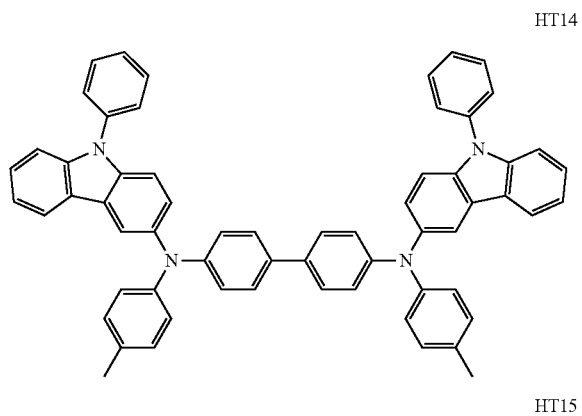

HT15
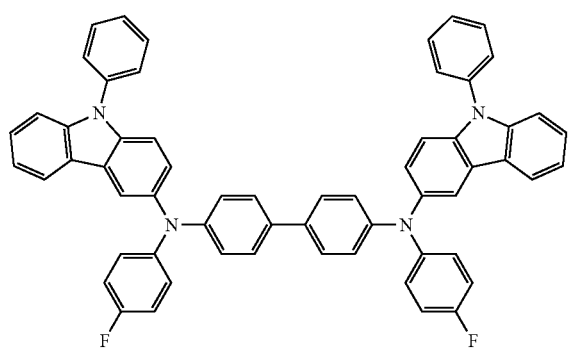

HT16
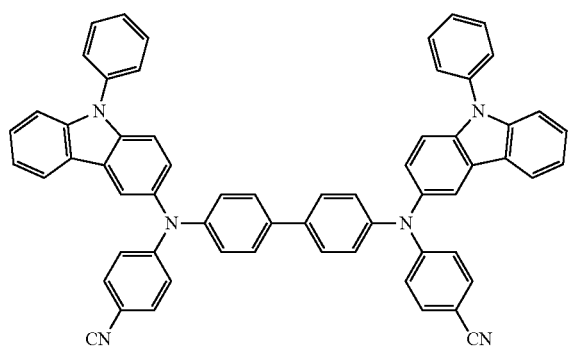

HT17
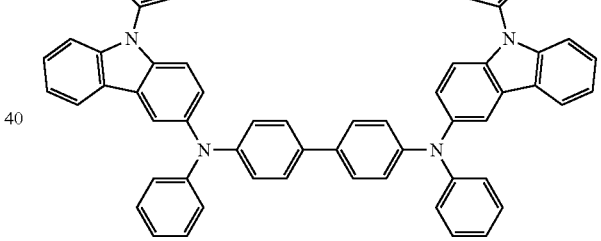

-continued

HT18
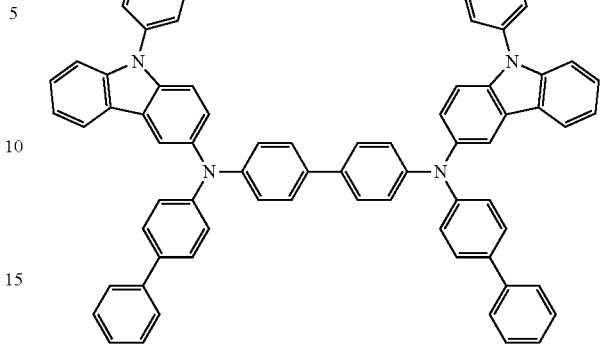

HT19
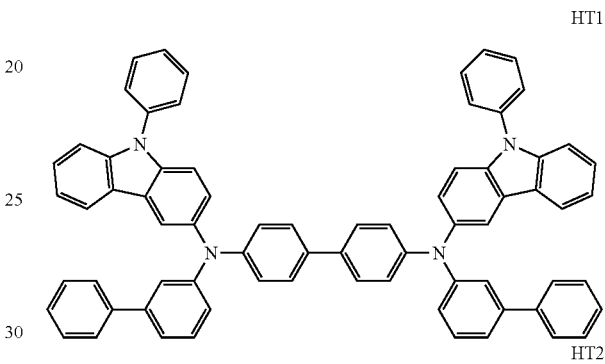

HT20

15. The OLED as claimed in claim 1, wherein the hole transport region further comprises a p-dopant.

16. An OLED comprising
a substrate comprising a first sub-pixel, a second sub-pixel, and a third sub-pixel;
a plurality of first electrodes arranged according to the first sub-pixel, the second sub-pixel, and the third sub-pixel of the substrate;
a second electrode facing the first electrodes;
an EML comprising a first EML that is disposed between the first electrode of the first sub-pixel and the second electrode and emits blue light, a second EML that is disposed between the first electrode of the second sub-pixel and the second electrode and emits green light, and a third EML that is disposed between the first electrode of the third sub-pixel and the second electrode and emits red light;
a hole transport region disposed between the first electrode and the EML; and
an electron transport region disposed between the EML and the second electrode, wherein the OLED comprises at least one of i) a first interlayer that is disposed on the first sub-pixel between the first EML and the hole transport region and comprises an amine-based compound represented by Formula 1 or 2 and ii) a third interlayer that is disposed on the third sub-pixel between the third EML and the hole transport region and comprises an amine-based compound represented by Formula 1 or 2:

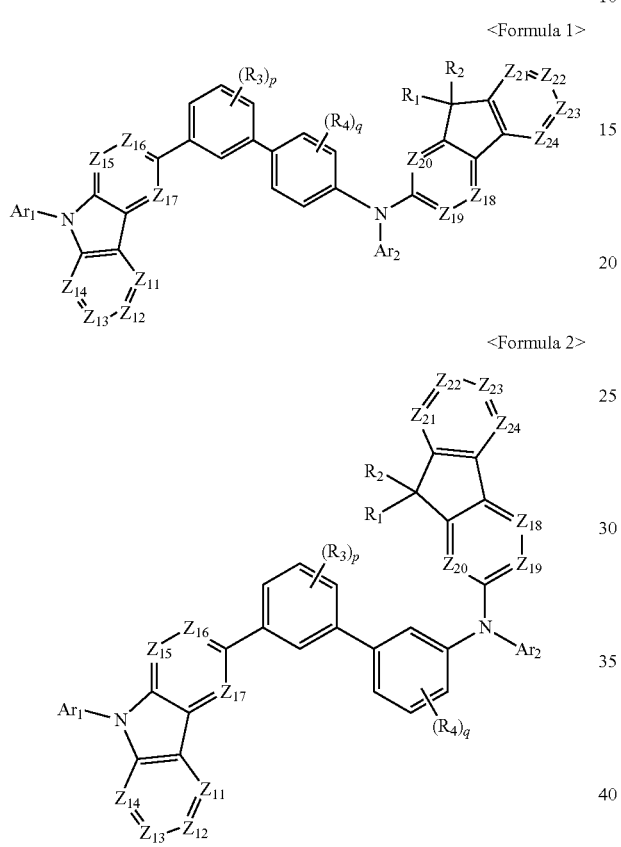

<Formula 1>

<Formula 2> wherein, in Formulae 1 and 2, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ and $Ar_2$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_1$ and $R_2$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and a substituted or unsubstituted monovalent non-aromatic heterocondensed polycyclic group;

$R_3$, $R_4$, and $R_{11}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{20}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic heterocondensed polycyclic group, —$N(Q_1)(Q_1)$, —$Si(Q_3)(Q_4)(Q_5)$, and —$B(Q_6)(Q_7)$;

p and q are each independently an integer of 1 to 4;

at least one substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and substituted monovalent non-aromatic heterocondensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group, each substituted with at least on of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

$Q_1$ to $Q_7$, $Q_{11}$ to $Q_{17}$, $Q_{21}$ to $Q_{27}$, and $Q_{31}$ to $Q_{37}$ are each independently selected from a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic heterocondensed polycyclic group.

17. The OLED as claimed in claim 16 further comprises a second interlayer that is disposed on the second sub-pixel and between the second EML and the hole transport region, wherein the second interlayer does not comprise the amine-based compound represented by Formula 1 or 2.

18. The OLED as claimed in claim 16, wherein the hole transport region further comprises a p-dopant.

* * * * *